US012787258B2

(12) United States Patent
Kim et al.

(10) Patent No.: US 12,787,258 B2
(45) Date of Patent: Nov. 3, 2026

(54) SEMICONDUCTOR DEVICE INCLUDING A CONDUCTIVE FILLING PATTERN SELF-ALIGNED TO ADJACENT GATE STRUCTURES

(71) Applicant: Samsung Electronics Co., Ltd., Suwon-si (KR)

(72) Inventors: Jongmin Kim, Suwon-si (KR); Taejin Park, Suwon-si (KR); Chansic Yoon, Suwon-si (KR); Kiseok Lee, Suwon-si (KR); Hongjun Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 334 days.

(21) Appl. No.: 18/541,625

(22) Filed: Dec. 15, 2023

(65) Prior Publication Data

US 2024/0224507 A1 Jul. 4, 2024

(30) Foreign Application Priority Data

Dec. 29, 2022 (KR) ........................ 10-2022-0189168

(51) Int. Cl.
*H10B 12/00* (2023.01)
*H10D 64/27* (2025.01)

(52) U.S. Cl.
CPC ........... *H10B 12/34* (2023.02); *H10B 12/315* (2023.02); *H10D 64/513* (2025.01)

(58) Field of Classification Search
CPC ... H10D 64/513; H10B 12/482; H10B 12/315
See application file for complete search history.

(56) References Cited

U.S. PATENT DOCUMENTS

| | | | | |
|---|---|---|---|---|
| 7,638,391 | B2 | 12/2009 | Cheng et al. | |
| 10,128,250 | B2 | 11/2018 | Ikebuchi | |
| 10,332,572 | B2 | 6/2019 | Chang et al. | |
| 12,022,645 | B2 | 6/2024 | Jang et al. | |
| 2015/0340453 | A1* | 11/2015 | Cho .................... | H10B 12/482 257/330 |
| 2018/0308850 | A1 | 10/2018 | Kang et al. | |
| 2021/0035984 | A1 | 2/2021 | Ji et al. | |

(Continued)

FOREIGN PATENT DOCUMENTS

| | | | |
|---|---|---|---|
| CN | 110890365 | A | 3/2020 |
| CN | 110957320 | A | 4/2020 |

(Continued)

OTHER PUBLICATIONS

Office Action dated Sep. 4, 2024 from the Taiwan Patent Office for Taiwan Patent Application No. 112149573.

*Primary Examiner* — Changhyun Yi
(74) *Attorney, Agent, or Firm* — Muir Patent Law, PLLC

(57) ABSTRACT

A semiconductor device includes an active pattern on a substrate, a gate structure, a conductive filling pattern and a bit line structure on the conductive filling pattern. The gate structure extends through an upper portion of the active pattern, and has an upper surface higher than an upper surface of the active pattern. The conductive filling pattern includes a lower portion on the active pattern and an upper portion thereon. The lower portion contacts an upper sidewall of the gate structure, and the upper portion has a width greater than a width of the lower portion.

20 Claims, 56 Drawing Sheets

(56) References Cited

U.S. PATENT DOCUMENTS

| | | | |
|---|---|---|---|
| 2021/0335792 | A1 | 10/2021 | Su |
| 2021/0350834 | A1 | 11/2021 | Ke et al. |
| 2022/0165736 | A1 | 5/2022 | Ryu et al. |
| 2022/0238526 | A1 | 7/2022 | Wang et al. |
| 2022/0336465 | A1 | 10/2022 | Kim et al. |
| 2023/0320076 | A1 | 10/2023 | Kim et al. |

FOREIGN PATENT DOCUMENTS

| | | | |
|---|---|---|---|
| CN | 111128895 | A | 5/2020 |
| CN | 112736080 | A | 4/2021 |
| KR | 1020110001568 | A | 1/2011 |
| KR | 1020180076424 | A | 7/2018 |
| KR | 10-2023-0140269 | A | 10/2023 |
| TW | 200905804 | A | 2/2009 |
| TW | 202230739 | A | 8/2022 |
| TW | 202243113 | A | 11/2022 |

* cited by examiner

SEMICONDUCTOR DEVICE INCLUDING A CONDUCTIVE FILLING PATTERN SELF-ALIGNED TO ADJACENT GATE STRUCTURES

CROSS-REFERENCE TO RELATED APPLICATION

This application claims priority under 35 U.S.C. § 119 to Korean Patent Application No. 10-2022-0189168 filed on Dec. 29, 2022 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a DRAM device.

DISCUSSION OF RELATED ART

A DRAM device includes gate structures which extend through upper portions of active patterns, respectively, in a first direction, bit line structures on central portions, respectively, of the active patterns, each of which extends in a second direction, contact plug structures on opposite end portions of corresponding ones, respectively, of the active patterns, and capacitors on corresponding ones, respectively, of the contact plug structures.

Each of the structures in the DRAM device is formed by a photo process in which an etching mask is formed through an exposure process and a development process, and an etching process in which layers on a substrate are patterned using the etching mask. Due to misalignment which may occur during the photo process and/or the etching process, relative positions between the structures may be different from those originally designed.

SUMMARY

Example embodiments provide a semiconductor device having improved electrical characteristics.

According to example embodiments, there is provided a semiconductor device. The semiconductor device may include an active pattern, a gate structure, a conductive filling pattern and a bit line structure. The active pattern may be disposed on a substrate. The gate structure may extend through an upper portion of the active pattern, and have an upper surface higher than an upper surface of the active pattern. The conductive filling pattern may include a lower portion, which may be disposed on the active pattern and contact an upper sidewall of the gate structure, and an upper portion, which may be disposed on the lower portion and have a width greater than a width of the lower portion. The bit line structure may be disposed on the conductive filling pattern.

According to example embodiments, there is provided a semiconductor device. The semiconductor device may include an active pattern, first and second pads, a gate structure, a conductive filling pattern and a bit line structure. The active pattern may be disposed on a substrate. The first and second pads may be stacked on the active pattern in a vertical direction substantially perpendicular to an upper surface of the substrate. The gate structure may extend through an upper portion of the active pattern and the first and second pads, and include a gate electrode, a capping pattern and a gate insulation pattern. The gate electrode and the capping pattern may be stacked in the vertical direction, and the gate insulation pattern may be disposed on sidewalls of the gate electrode and the capping pattern. A top surface of the gate insulation pattern may be substantially coplanar with an upper surface of the conductive filling pattern.

According to example embodiments, there is provided a semiconductor device. The semiconductor device may include active patterns, an isolation structure, first and second pads, gate structures, conductive filling patterns, bit line structures and capacitors. The active patterns may be disposed on a substrate. The isolation structure may be disposed on the substrate, and may cover sidewalls of the active patterns. The first and second pads may be stacked on the active patterns and the isolation structure in a vertical direction substantially perpendicular to an upper surface of the substrate. Each of the gate structures may extend through upper portions of the active patterns and the isolation structure, and the first and second pads in a first direction substantially parallel to the upper surface of the substrate. Each of the conductive filling patterns may be disposed on a central portion of a corresponding one of the active patterns and the isolation structure, and extend through the first and second pads. The bit line structures may be disposed on the conductive filling patterns and the second pad, and each of the bit line structures may extend in a second direction substantially parallel to the upper surface of the substrate and substantially perpendicular to the first direction. The contact plug structures may be disposed on opposite end portions, respectively, of the active patterns. The capacitors may be disposed on the contact plug structures, respectively. Each of the conductive filling patterns may include a lower portion, which may extend through the first pad having a first width in the second direction and contact upper sidewalls of the gate structures, and an upper portion, which may be disposed on the lower portion and have a second width in the second direction greater than the first width in the second direction.

In the semiconductor device in accordance with example embodiments, the conductive filling pattern, which may be formed between the bit line structure and the active pattern and electrically connect the bit line structure and the active pattern to each other, may be formed between the gate structures extending through upper portions, respectively, of the active pattern to be self-aligned to the gate structures. Accordingly, the conductive filling pattern may not be formed at an undesirable relative position with respect to the gate structures due to misalignment, and the conductive filling pattern may be formed at the originally designed position. Thus, an electrical connection between the bit line structure and the active pattern may be good, and an electrical short between the conductive filling pattern and the gate structure may be prevented.

DETAILED DESCRIPTION

The above and other aspects and features of the capacitor structures and the methods of manufacturing the same, the semiconductor devices including the capacitor structures and the methods of manufacturing the same in accordance with example embodiments will become readily understood from detail descriptions that follow, with reference to the accompanying drawings. It will be understood that, although the terms "first," "second," and/or "third" may be used herein to describe various materials, layers, regions, pads, electrodes, patterns, structure and/or processes, these various materials, layers, regions, pads, electrodes, patterns, structure and/or processes should not be limited by these terms. These terms are only used to distinguish one material, layer, region, pad, electrode, pattern, structure or process from another material, layer, region, pad, electrode, pattern, structure or process. Thus, "first", "second" and/or "third" may be used selectively or interchangeably for each material, layer, region, electrode, pad, pattern, structure or process respectively.

Hereinafter, two directions among horizontal directions that are substantially parallel to an upper surface of a substrate 100, which may be substantially orthogonal to each other, may be referred as first and second directions D1 and D2, respectively, and a direction among the horizontal directions, which may have an acute angle with respect to each of the first and second directions D1 and D2, may be referred to as third and fourth directions D3 and D4, respectively.

Figure 1:
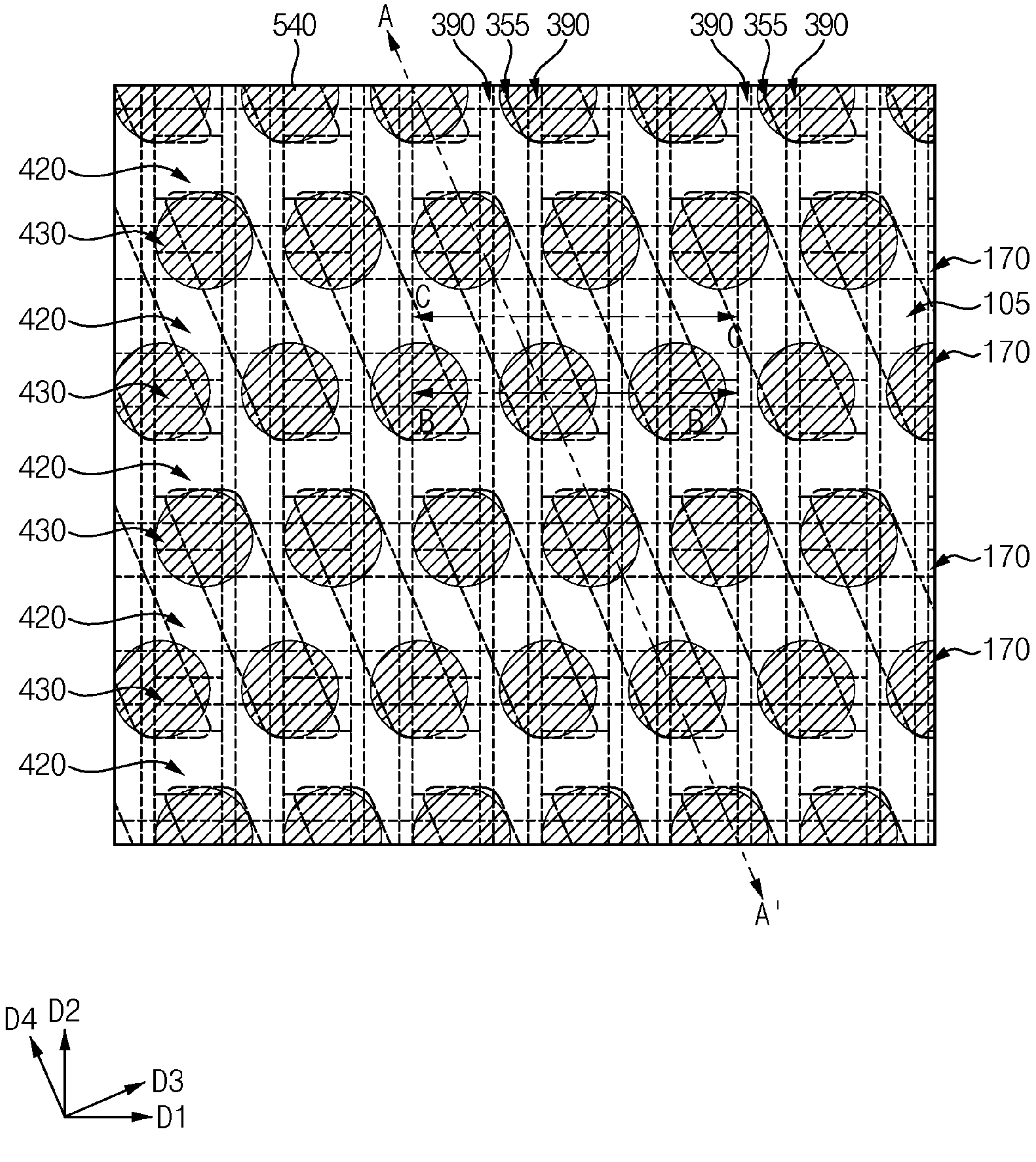
FIGS. 1 to 4 are plan views and cross sectional views illustrating a semiconductor device in accordance with example embodiments.
Figure 2:
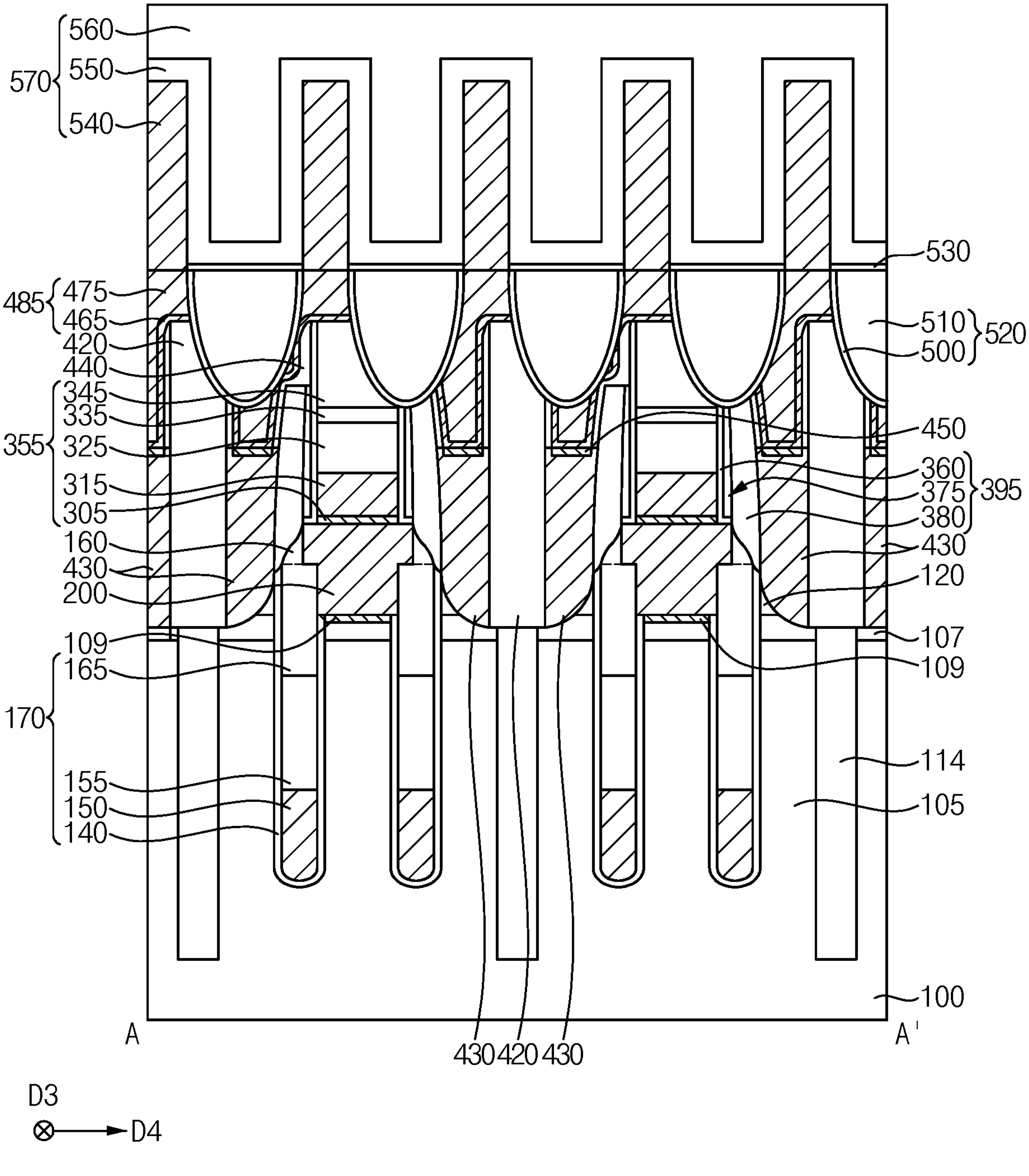
Figure 3:
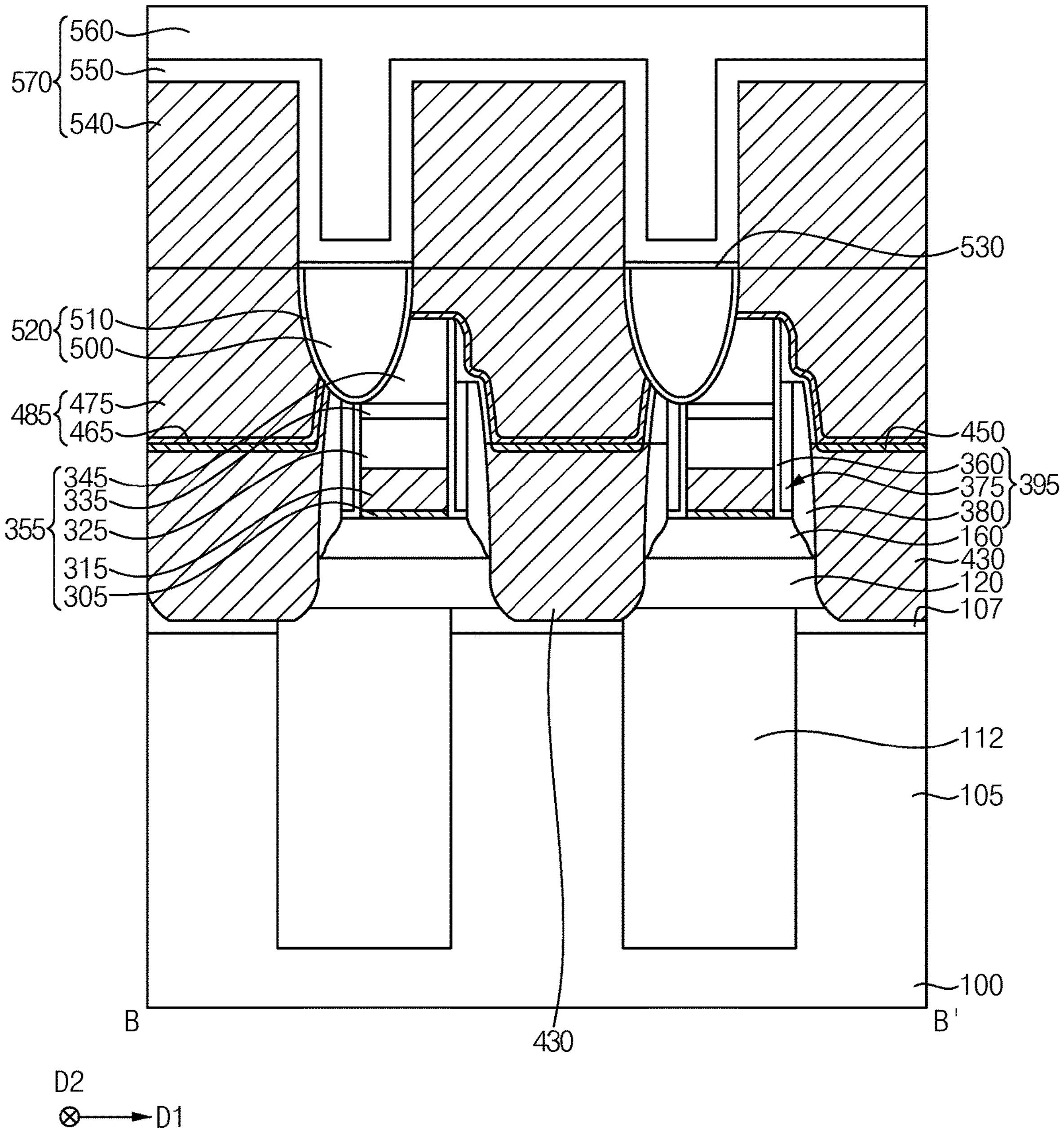
Figure 4:
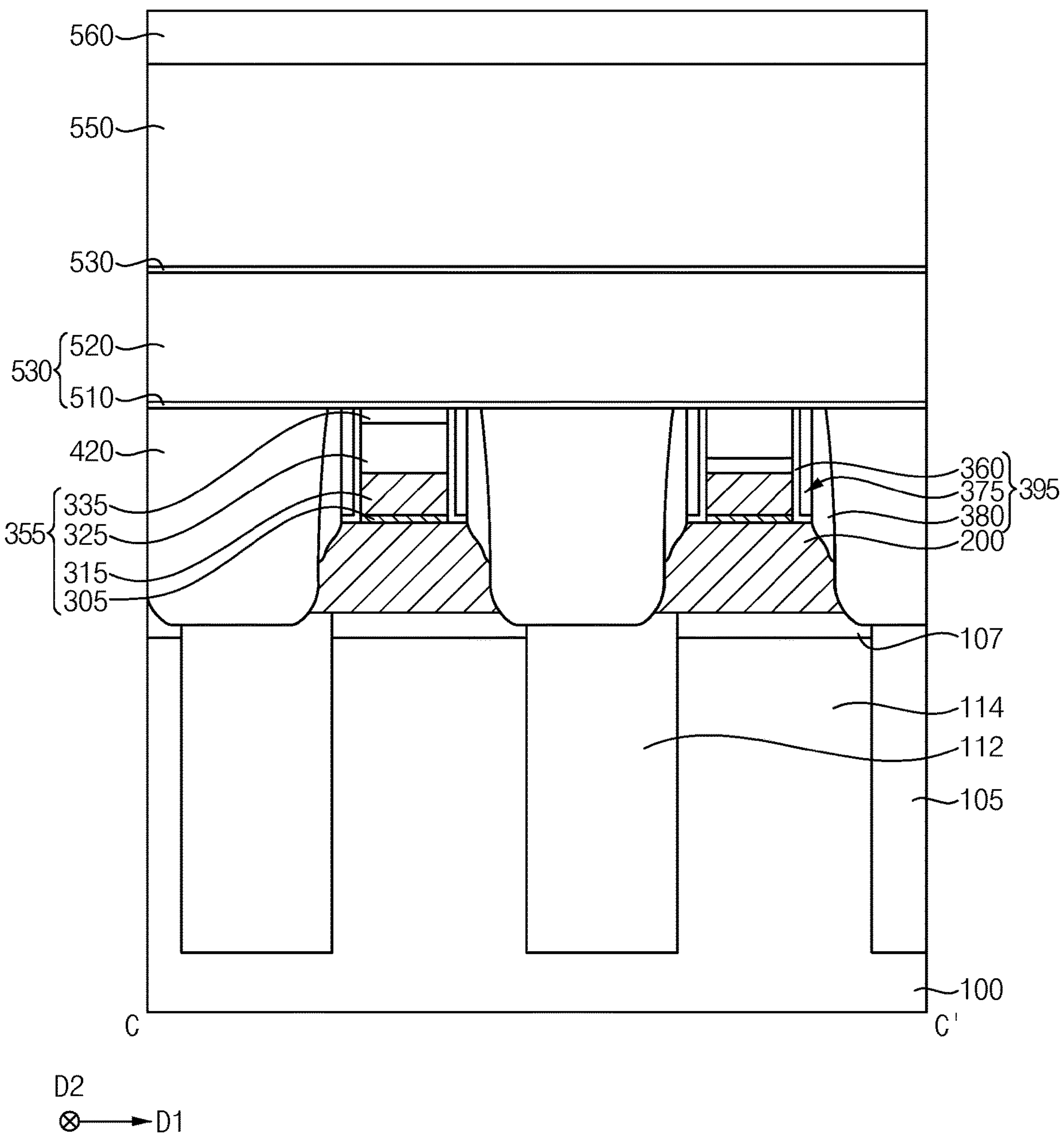

FIGS. 1 to 4 are plan views and cross-sectional views illustrating a semiconductor device in accordance with example embodiments. Specifically, FIG. 1 is the plan view, FIG. 2 is a cross-sectional view taken along line A-A' of FIG. 1, FIG. 3 is a cross-sectional view taken along line B-B' of FIG. 1, and FIG. 4 a is cross-sectional view taken along line C-C' of FIG. 1.

The semiconductor device may include an active pattern 105, a gate structure 170, a first conductive filling pattern 200, a bit line structure 355, a contact plug structure and a capacitor 570 on the substrate 100.

The semiconductor device may further include an isolation structure 110, a spacer structure 395, a fourth spacer 440, a first ohmic contact pattern 109, a fence pattern 420, first and second pads 120 and 160, a second insulation pattern structure 520 and a second etch stop layer 530.

The substrate 100 may include silicon, germanium, silicon-germanium, or a III-V group compound semiconductor, e.g., GaP, GaAs, GaSb, etc. In example embodiments, the substrate 100 may be a silicon-on-insulator (SOI) substrate or a germanium-on-insulator (GOI) substrate.

A sidewall of the active pattern 105 may be covered by an isolation structure 110 on the substrate 100, and the active pattern 105 may be defined on the substrate 100.

The isolation structure 110 may include first and second isolation patterns 112 and 114. In example embodiments, the first isolation pattern 112 may extend in the fourth direction D4, and a plurality of the first isolation patterns 112 may be spaced apart from each other in the first direction D1. Additionally, the second isolation pattern 114 may extend in the first direction D1, and be connected to the first isolation patterns 112 disposed in the first direction D1. In example embodiments, a plurality of second isolation patterns 112 may be spaced apart from each other in the second direction D2.

In example embodiments, the active pattern 105 may extend in the fourth direction D4 to a certain length, and a plurality of active patterns 105 may be spaced apart from each other in the fourth direction D4 by the second isolation pattern 114. Additionally, a plurality of active patterns 105 may be spaced apart from each other in the first direction D1 by the first isolation pattern 112. Thus, end portions of ones of the active patterns 105 disposed in the first direction D1, which may correspond to each other in the first direction D1, may be aligned with each other along the first direction D1.

The active pattern 105 may include a material substantially the same as a material of the substrate 100, and each of the first and second isolation patterns 112 and 114 may include, for example, an oxide such as silicon oxide. An impurity region 107 including, for example, n-type impurities or p-type impurities may be formed at an upper portion of the active pattern 105.

The first pad 120 may be formed on the active pattern 105 and the isolation structure 110, and a plurality of first pads 120 may be spaced apart from each other in the first and second directions D1 and D2. The first pad 120 may include an oxide, e.g., silicon oxide.

The gate structure 170 may extend in the first direction D1 through upper portions of the active pattern 105 and the isolation structure 110 and through the first pad 120. The gate structure 170 may include a first conductive pattern 150, a second conductive pattern 155 and a first capping pattern 165 sequentially stacked in a vertical direction substantially perpendicular to the upper surface of the substrate 100. The gate structure 170 may further include a gate insulation pattern 140. Sidewalls of the first conductive pattern 150, the second conductive pattern 155 and the first capping pattern 165 and a lower surface of the first conductive pattern 150 may be covered by the gate insulation pattern 140. However, a portion of an upper sidewall of the first capping pattern 165 may not be covered by the gate insulation pattern 140. The first and second conductive patterns 150 and 155 may collectively form a gate electrode.

The gate insulation pattern 140 may include, for example, an oxide such as silicon oxide, the first conductive pattern 150 may include, for example, a metal, a metal nitride, or a metal silicide, the second conductive pattern 155 may include, for example, polysilicon doped with n-type impurities or p-type impurities, and the first capping pattern 165 may include an insulating nitride such as silicon nitride.

In example embodiments, the gate structure 170 may extend in the first direction D1, and a plurality of gate structures 170 may be spaced apart from each other in the second direction D2. Two gate structures 170 spaced apart from each other in the second direction D2 may extend through an upper portion of one active pattern 105. The active pattern 105 extending in the fourth direction D4 may include a central portion between the two gate structures 170 adjacent to each other in the second direction D2, and end portions each of which may be disposed between a corresponding one of the two gate structures 170 and the second isolation pattern 114.

In example embodiments, a lower surface of the gate structure 170 may be higher than a lower surface of the isolation structure 110.

The second pad 160 may be disposed on the first pad 120 and the gate structure 170, and a plurality of second pads 160 may be spaced apart from each other in the first and second directions D1 and D2. The second pad 160 may include, for example, an insulating nitride such as silicon nitride.

The first conductive filling pattern 200 may be disposed on the active pattern 105 and the isolation structure 110, and extend through the first and second pads 120 and 160. The first conductive filling pattern 200 may be disposed on the central portion of the active pattern 105.

The first ohmic contact pattern 109 may be disposed between the impurity region 107 at the upper portion of the active pattern 105 and the first conductive filling pattern 200. The first ohmic contact pattern 109 may include, for example, a metal silicide such as titanium silicide, cobalt silicide, nickel silicide, etc.

A plurality of first conductive filling patterns 200 may be spaced apart from each other along the first and second directions D1 and D2. In example embodiments, the first conductive filling pattern 200 may include a lower portion and an upper portion stacked in the vertical direction, the lower portion may extend through the first pad 120, and the upper portion may extend through the second pad 160. In example embodiments, the lower portion of the first conductive filling pattern 200 in the second direction D2 or fourth direction D4 may have a width smaller than a width of the upper portion of the first conductive filling pattern 200 in the second direction D2 or fourth direction D4.

In example embodiments, the lower portion of the first conductive filling pattern 200 may contact sidewalls of two gate structures 170 extending through the upper portion of the active pattern 105 and that face each other in the second direction D2, specifically, sidewalls of the first capping patterns 165 that face each other in the second direction D2. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting," "in contact with," or "contact" another element, there are no intervening elements present at the point of contact.

The first conductive filling pattern 200 may include, for example, a metal, a metal nitride, etc.

The bit line structure 355 may include an adhesive pattern 305, a fourth conductive pattern 315, and a second mask 325, a first etch stop pattern 335 and a second capping pattern 345 sequentially stacked on the first conductive filling pattern 200 and the second pad 160 in the vertical direction. The second mask 325, the first etch stop pattern 335 and the second capping pattern 345 may collectively form a first insulation pattern structure.

The adhesive pattern 305 may include, for example, a metal nitride such as titanium nitride or a metal silicon nitride such as titanium silicon nitride, the fourth conductive pattern 315 may include, for example, a metal such as tungsten, and each of the second mask 325, the first etch stop pattern 335 and the second capping pattern 345 may include, for example, an insulating nitride such as silicon nitride. In some embodiments, the second mask 325, the first etch stop pattern 335 and the second capping pattern 345 may include substantially the same material to be merged with each other, and accordingly, the first insulation pattern structure may have a single layer structure.

In example embodiments, the bit line structure 355 may extend in the second direction D2 on the substrate 100, and a plurality of bit line structures 355 may be spaced apart from each other in the first direction D1. Each of the bit line structures 355 may contact an upper surface of the first conductive filling pattern 200.

The spacer structure 395 may include a first spacer 360, an air spacer 375 and a third spacer 380 sequentially stacked in the first direction D1 on each of opposite sidewalls of the bit line structure 355 in the first direction D1.

The first spacer 360 may cover each of opposite sidewalls of the bit line structure 355 in the first direction D1 and an upper surface of the second pad 160, and accordingly, a cross section in the first direction D1 of the first spacer 360 may have an "L" shape. The air spacer 375 may be disposed on an outer wall of the first spacer 360. The third spacer 380 may be disposed on an outer wall of the air spacer 375 and a sidewall of the second pad 160. In example embodiments, top surfaces of the air spacer 375 and the third spacer 380 may be lower than a top surface of the first spacer 360.

Each of the first and third spacers 360 and 380 may include, for example, an insulating nitride such as silicon nitride, and the air spacer 375 may include air.

However, instead of the air spacer 375 containing air, the spacer structure 395 may include a second spacer 370 (refer to FIG. 20) containing an oxide such as silicon oxide.

The fourth spacer 440 may cover an upper outer wall of the first spacer 360, a top end of the air spacer 375, and an upper surface and an upper outer sidewall of the third spacer 380. The fourth spacer 440 may include, for example, an insulating nitride such as silicon nitride.

The contact plug structure may include a lower contact plug 430, a second ohmic contact pattern 450 and an upper contact plug 485 sequentially stacked on the active pattern 105 and the isolation structure 110 in the vertical direction.

The lower contact plug 430 may be disposed between the spacer structures 395 on respective opposite sidewalls of ones of the bit line structures 355 neighboring in the first direction D1, and a plurality of the lower contact plugs 430 may be spaced apart from each other in the second direction D2. Each of the lower contact plugs 430 may be disposed on a corresponding one of the opposite end portions of the active pattern 105, and may contact the impurity region 107 disposed on the active pattern 105. The lower contact plug 430 may include, for example, polysilicon doped with n-type impurities or p-type impurities.

The fence pattern 420 may be disposed between ones of the lower contact plugs 430 neighboring in the second direction D2, and may separate the ones of the lower contact plugs 430 from each other. Accordingly, the fence pattern 420 may be disposed between the spacer structures 395 on respective opposite sidewalls of ones of the bit line structures 355 adjacent to each other in the first direction D1, and a plurality of fence patterns 420 may be spaced apart from each other in the second direction D2. The fence pattern 420 may include, for example, an insulating nitride such as silicon nitride.

The second ohmic contact pattern 450 may be disposed on the lower contact plug 430, and may include, for example, a metal silicide such as titanium silicide, cobalt silicide, nickel silicide, etc.

The upper contact plug 485 may include a third metal pattern 475 and a barrier pattern 465 covering a lower surface thereof. The upper contact plug 485 may be disposed on the second ohmic contact pattern 450, the bit line structure 355 and the fence pattern 420. In example embodiments, the upper contact plug 485 may have a shape such as a circle, an ellipse, a polygon, and a polygon with rounded corners, and may be arranged, for example, in a honeycomb pattern in the first and second directions D1 and D2 in a plan view.

Figure 26:
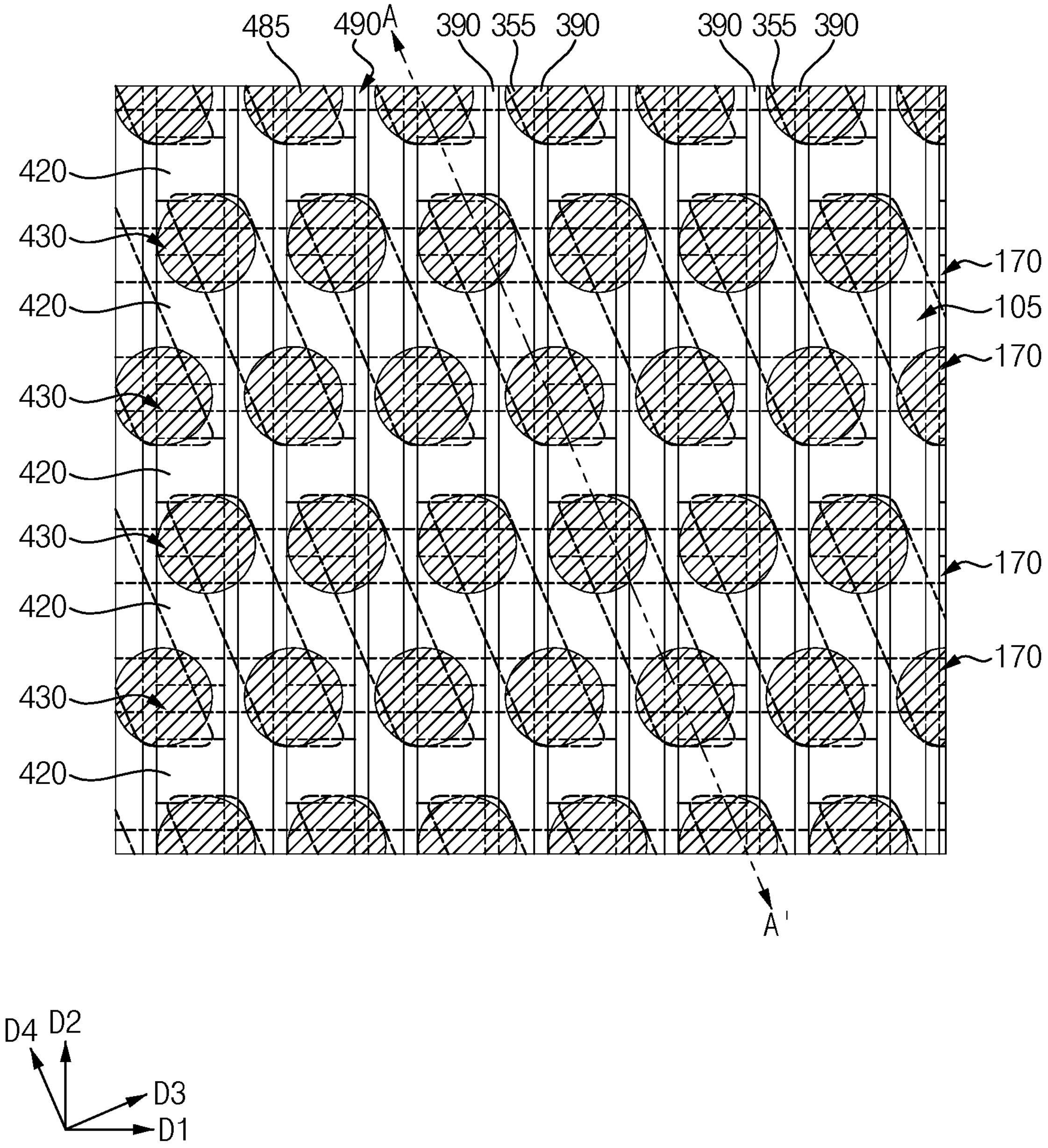
Figure 27:
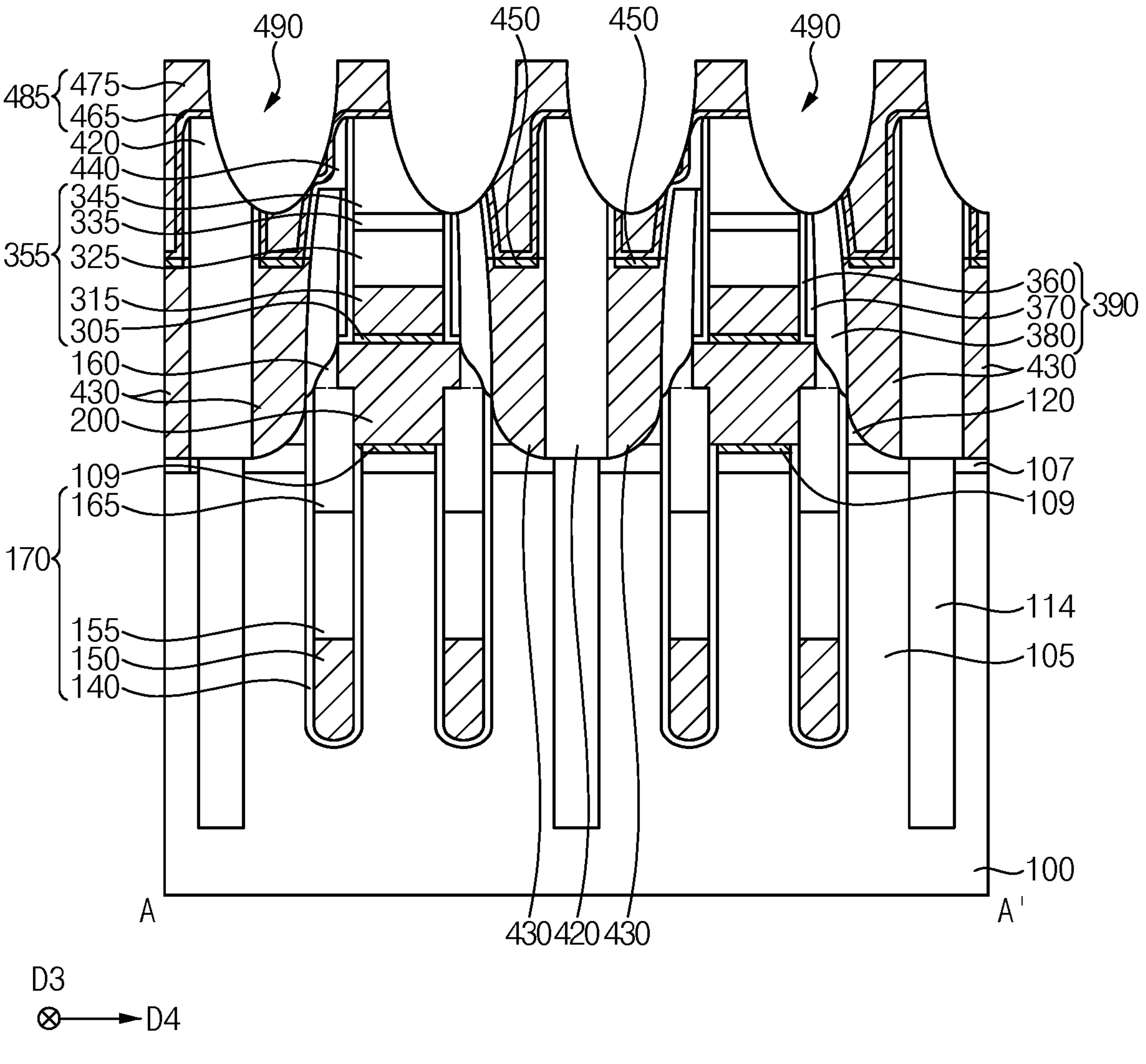

Referring to FIGS. 1 to 4 together with FIGS. 26 and 27, the second insulation pattern structure 520 may include a first insulation pattern 500 on an inner wall of a sixth opening 490, which may extend through the upper contact plug 485 and portions of the first insulation pattern structure included in the bit line structure 355, the spacer structure 395 and the fourth spacer 440 and surround the upper contact plug 485 in a plan view, and a second insulation pattern 510, which may be disposed on the first insulation pattern 500 and fill a remaining portion of the sixth opening 490. An upper end of the air spacer 375 may be closed by the first insulation pattern 500.

The first and second insulation patterns 500 and 510 may include, for example, an insulating nitride such as silicon nitride.

The second etch stop layer 530 may be disposed on the second insulation pattern structure 520 and the upper contact plug 485. The second etch stop layer 530 may include, for example, an insulating nitride such as silicon boronitride, silicon nitride, etc.

The capacitor 570 may include a lower electrode 540, a dielectric layer 550 and an upper electrode 560 sequentially stacked. The lower electrode 540 may extend through the second etch stop layer 530, and may contact an upper surface of the upper contact plug 485.

Each of the lower electrode 540 and the upper electrode 560 may include, for example, a metal, a metal nitride, a metal silicide, etc., and the dielectric layer 550 may include, for example, a metal oxide.

In the semiconductor device, the first conductive filling pattern 200, which may be disposed between and electrically connect the bit line structure 355 and the active pattern 105, as is described below, may be disposed between the gate structures 170 extending through the upper portion of the active pattern 105 to be self-aligned to the gate structures. Accordingly, the first conductive filling pattern 200 may not be formed at an undesirable position with respect to the gate structures 170 due to misalignment. Accordingly, an electrical connection between the bit line structure 355 and the active pattern 105 may be good, and an electrical short between the first conductive filling pattern 200 and the gate structure 170 may be prevented.

FIGS. 5 to 28 are plan views and cross-sectional views illustrating a method of manufacturing a semiconductor device in accordance with example embodiments.

Specifically, FIGS. 5, 7, 9, 12, 15, 18, 22 and 26 are the plan views, and FIGS. 6, 8, 10, 11, 13, 14, 16, 17, 19-21, 23-25, 27 and 28 are cross-sectional views taken along lines A-A' of corresponding plan views, respectively.

Figure 5:
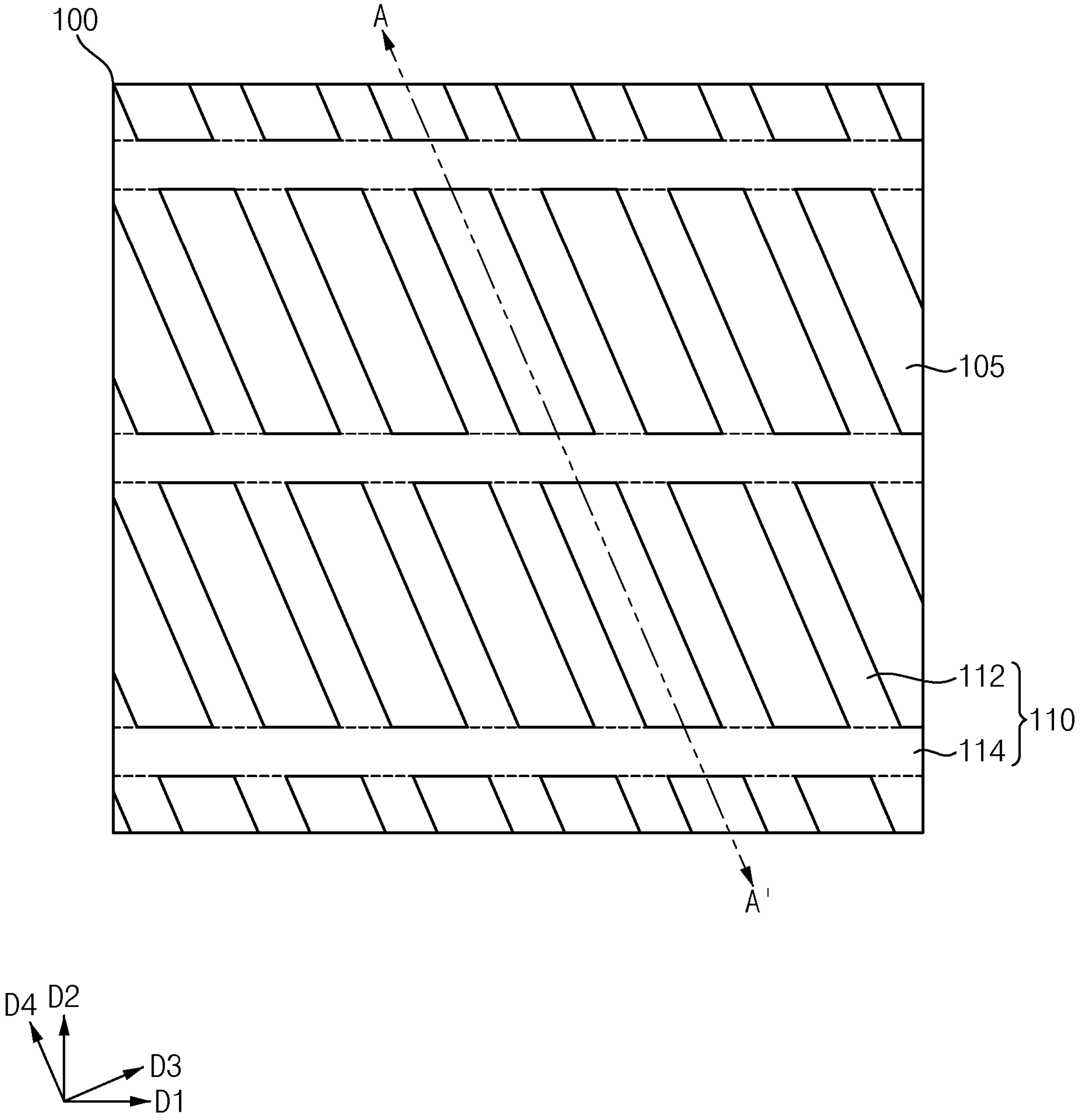
FIGS. 5 to 28 are plan views and cross-sectional views illustrating a method of manufacturing a semiconductor device in accordance with example embodiments.
Figure 6:
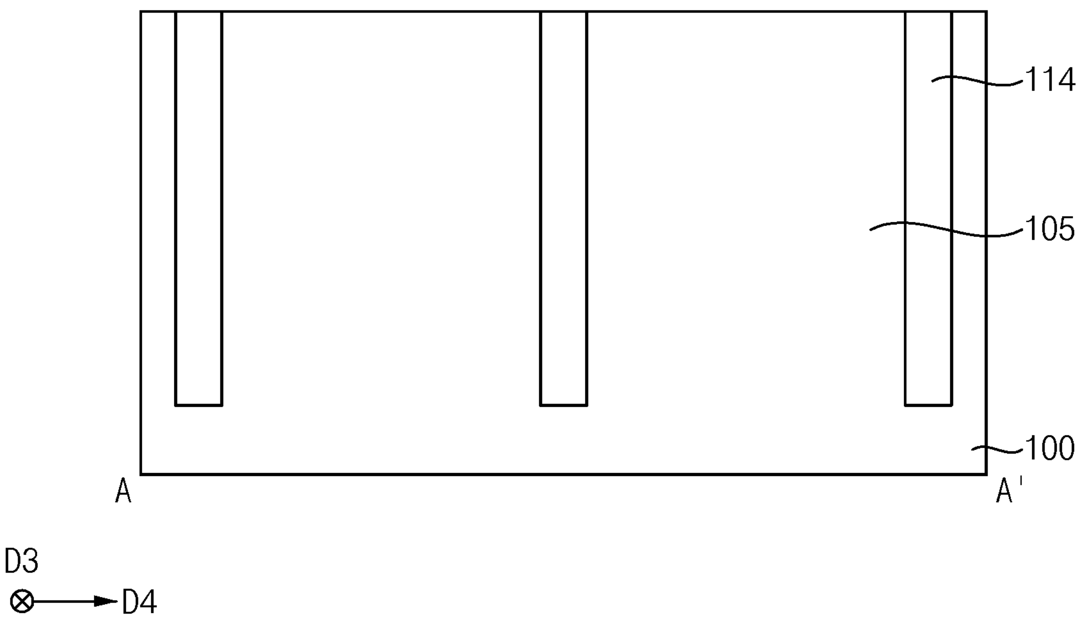

Referring to FIGS. 5 and 6, upper portions of a substrate 100 may be removed to form first and second recesses, respectively, and an isolation structure 110 may be formed to fill the first and second recesses.

As the isolation structure 110 is formed on the substrate 100, an active pattern 105 whose sidewall is covered by the isolation structure 110 may be defined on the substrate 100.

In example embodiments, the first recess may extend in the fourth direction D4, and a plurality of first recesses may be spaced apart from each other in the first direction D1. In addition, the second recess may extend in the first direction D1 to be connected to ones of the first recesses disposed in the first direction D1, and a plurality of second recesses may be spaced apart from each other in the second direction D2. The isolation structure 110 may include first and second isolation patterns 112 and 114 in the first and second recesses, respectively, which may be connected to each other.

In example embodiments, the active pattern 105 may extend by a certain length in the fourth direction D4, and a plurality of active patterns 105 may be spaced apart from each other in the fourth direction D4 by the second isolation pattern 114. In addition, the plurality of active patterns 105 may be spaced apart from each other in the first direction D1 by the first isolation pattern 112.

Figure 7:
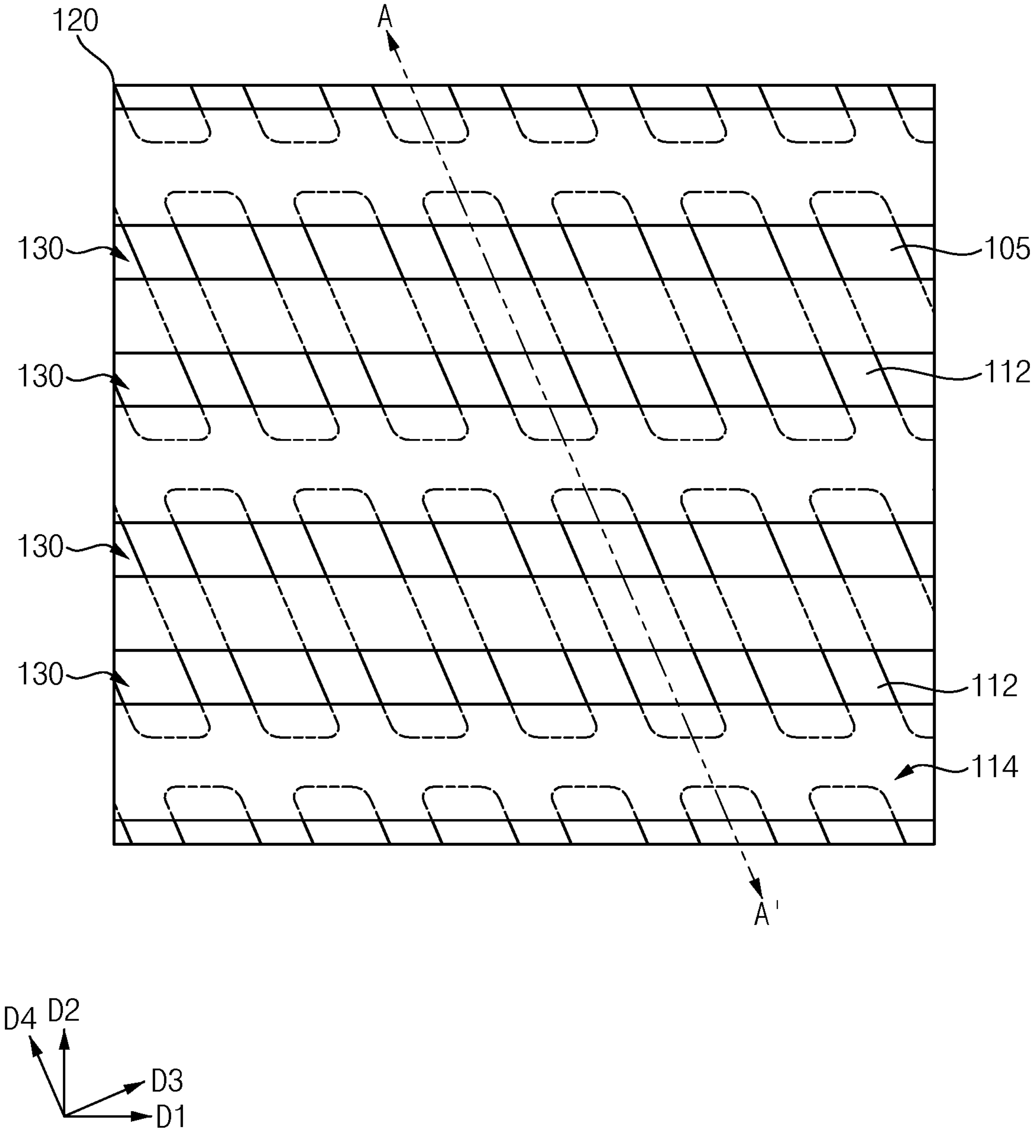
Figure 8:
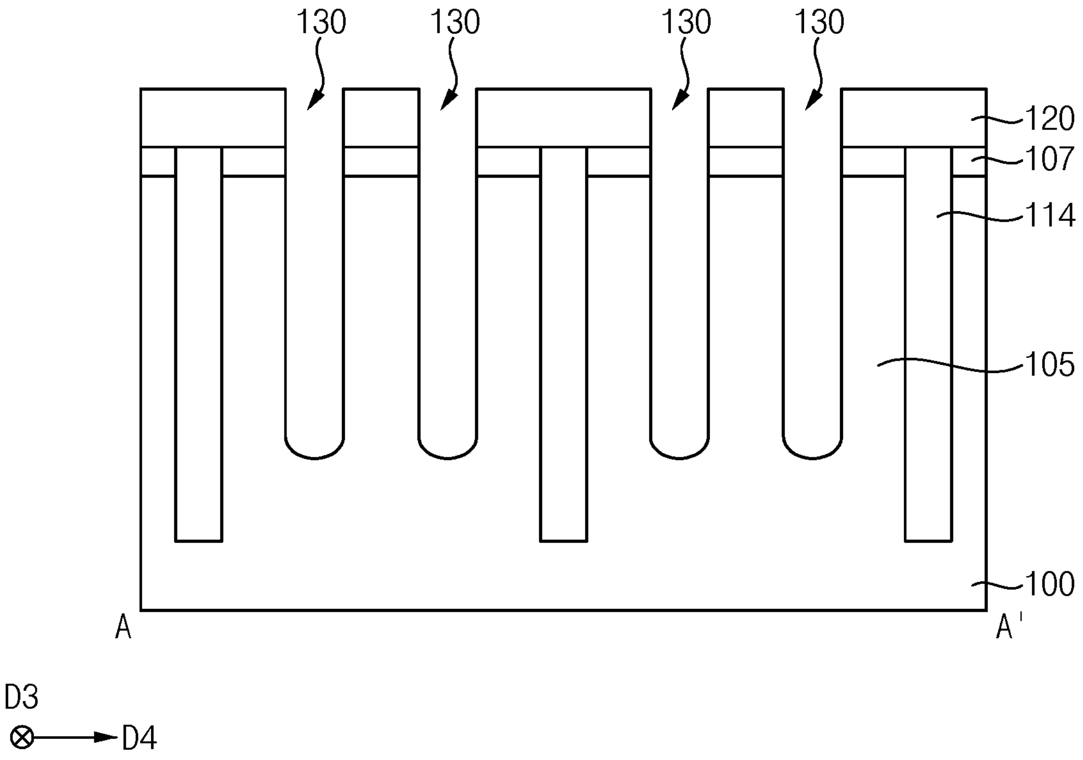

Referring to FIGS. 7 and 8, an impurity region 107 may be formed at an upper portion of the active pattern 105 by doping, for example, n-type impurities or p-type impurities into the upper portion of the active pattern 105.

In example embodiments, the impurity region 107 may be formed by a gas phase doping (GPD) process.

A first pad layer may be formed on the active pattern 105 having the impurity region 107 and the isolation structure 110, the first pad layer may be patterned to form a first pad 120, and the active pattern 105 may be partially etched using the first pad 120 as an etching mask to form a third recess 130.

The first pad 120 may include, for example, an oxide such as silicon oxide.

In example embodiments, the third recess 130 may extend in the first direction D1, and a plurality of third recesses may be spaced apart from each other in the second direction D2. A bottom of each of the third recesses 130 may be higher than a bottom surface of the isolation structure 110.

In example embodiments, two third recesses 130 spaced apart from each other in the second direction D2 may be formed in each of the active patterns 105. Hereinafter, a portion of the active pattern 105 extending in the fourth direction D4, which may be disposed between the third recesses 130, may be referred to as a central portion of the active pattern 105, and a portion of the active pattern 105, which may be disposed between each of the third recesses 130 and the second isolation pattern 114 may be referred to as an end portion of the active pattern 105.

Figure 9:
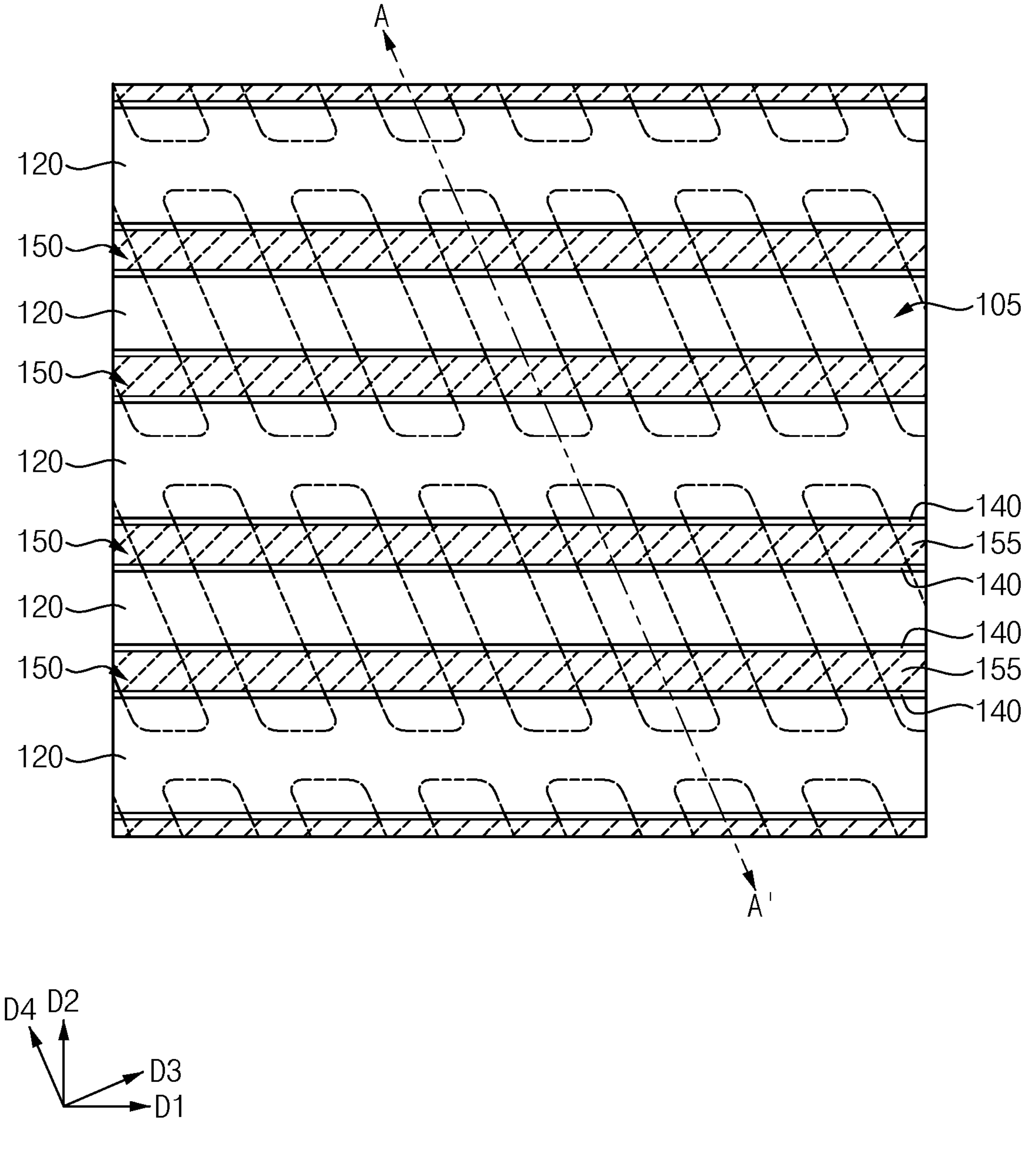
Figure 10:
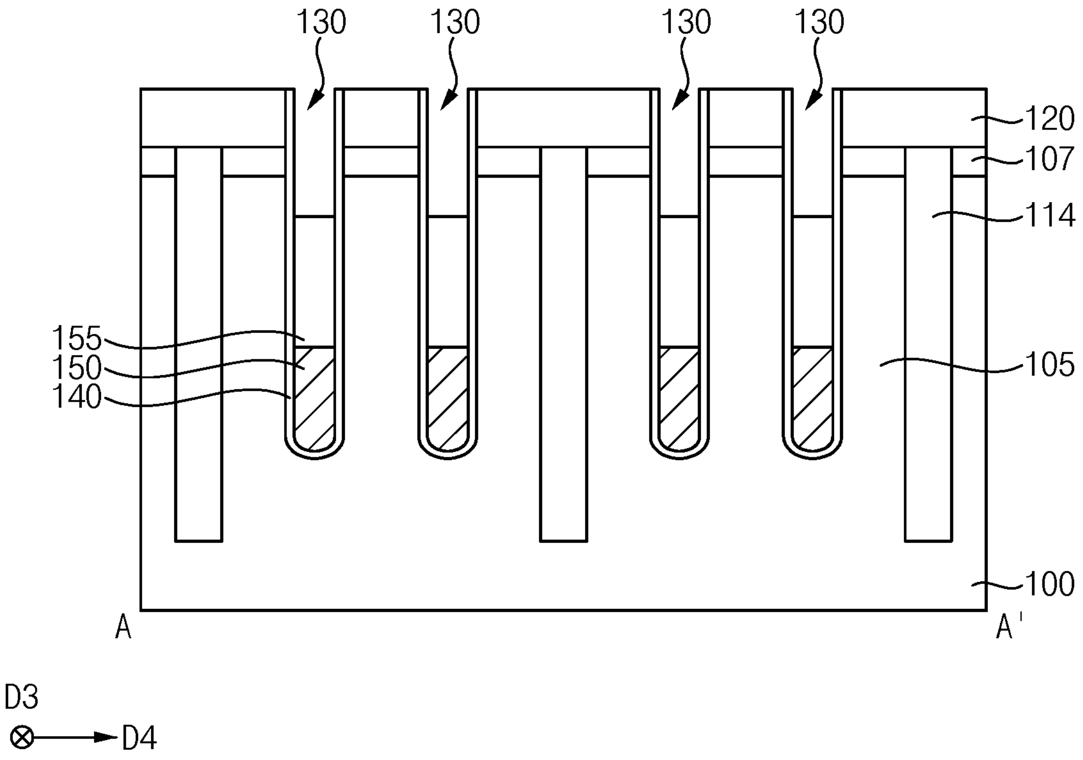

Referring to FIGS. 9 and 10, a gate insulation layer may be formed on an inner wall of the third recess 130 and an upper surface of the first pad 120, and a portion of the gate insulation layer on the upper surface of the first pad 120 may be removed to form a gate insulation pattern 140 on the inner wall of the third recess 130.

The gate insulation pattern 140 may be formed of, or may include, for example, an oxide such as silicon oxide.

A first conductive layer may be formed on the gate insulation pattern 140 and the first pad 120, and an upper portion of the first conductive layer may be removed by, for example, an etch back process, to form a first conductive pattern in a lower portion of the third recess 130.

A second conductive layer may be formed on the first conductive pattern 150, the gate insulation pattern 140 and the first pad 120, and an upper portion of the second conductive layer may be removed by, for example, an etch back process to form a second conductive pattern 155 in a central portion of the third recess 130.

Figure 11:
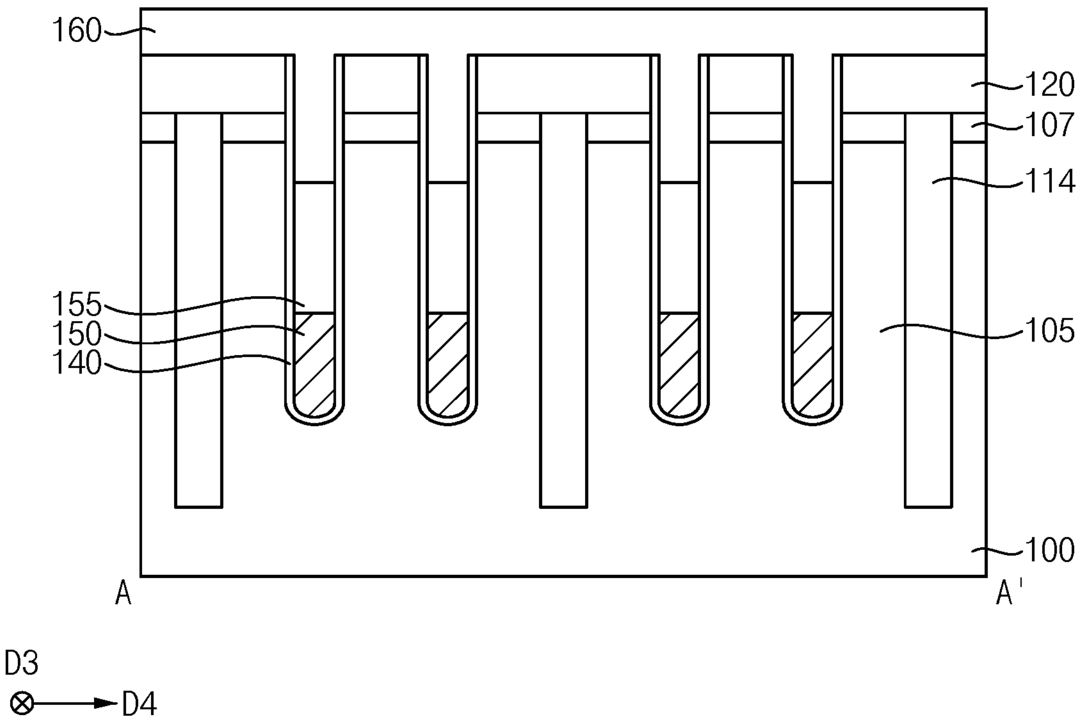

Referring to FIG. 11, a first capping layer 160 may be formed on the second conductive pattern 155, the gate insulation pattern 140 and the first pad 120 to fill an upper portion of the third recess 130.

The first capping layer 160 may include, for example, an insulating nitride such as silicon nitride.

Figure 12:
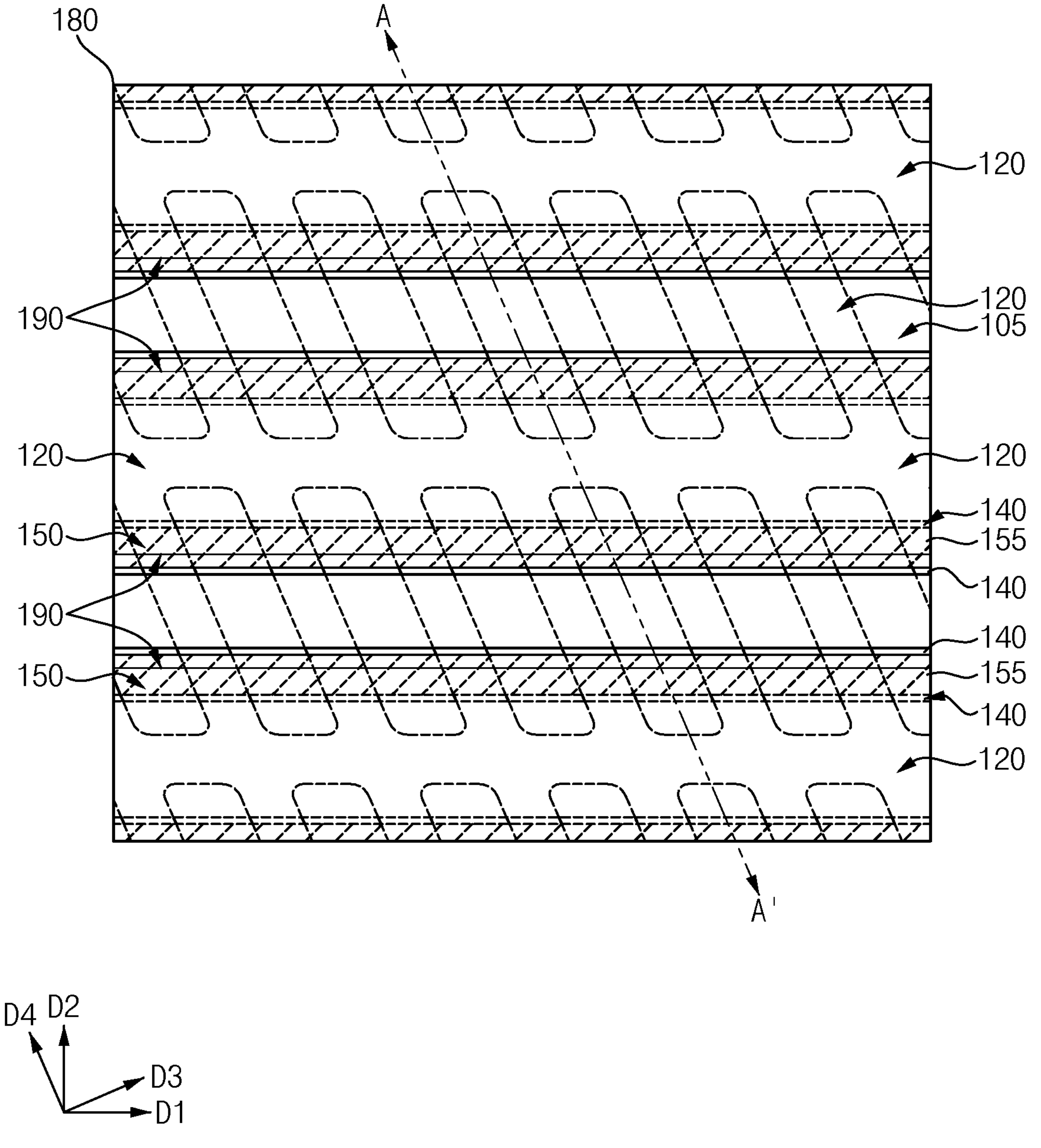
Figure 13:
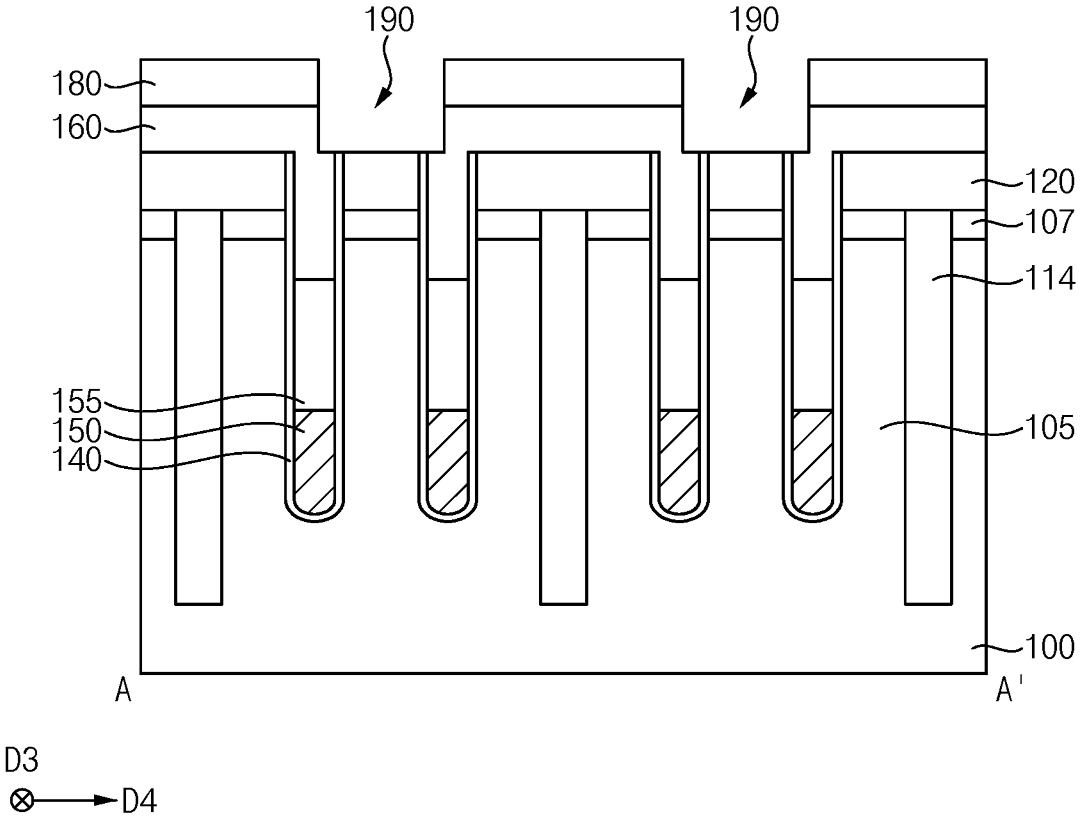

Referring to FIGS. 12 and 13, a first mask 180 may be formed on the first capping layer 160, and the first capping layer 160 may be etched using the first mask 180 as an etching mask to form a first opening 190 exposing an upper surface of the first pad 120. The first mask 180 may include, for example, an amorphous carbon layer (ACL).

In example embodiments, the first opening 190 may extend in the first direction D1, and a plurality of first openings may be spaced apart from each other in the second direction D2. Each of the first openings 190 may overlap the central portions of corresponding ones of the active patterns 105 disposed in the first direction D1 in a vertical direction substantially perpendicular to the upper surface of the substrate 100, and may have a width in the second direction D2 greater than a width in the second direction D2 of the central portion of each of the corresponding ones of the active pattern 105.

Accordingly, each of the first openings 190 may expose an upper surface of a portion of the first pad 120 on the central portion of each of the corresponding ones of the active patterns 105 and an upper surface of a portion of the gate insulation pattern 140 adjacent thereto in a second direction D2, and may partially expose a portion of the first capping layer 160 in the third recess 130.

Figure 14:
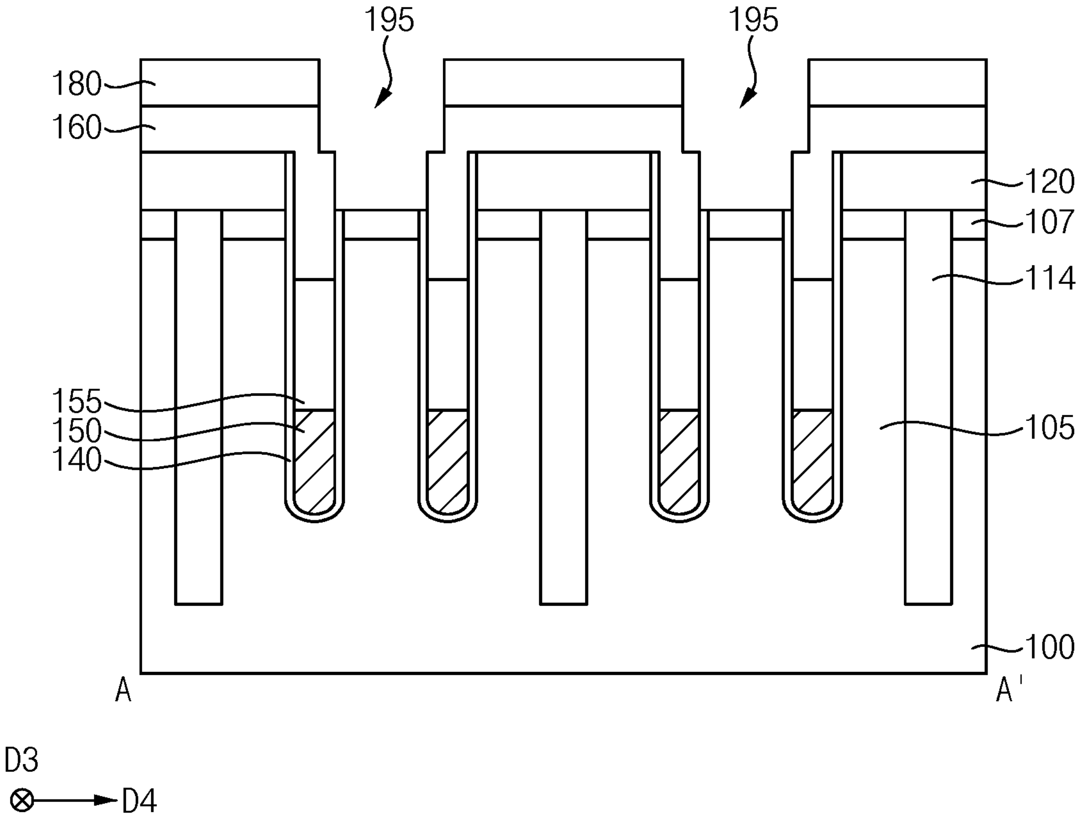

Referring to FIG. 14, the portion of the first pad 120 exposed by the first opening 190 and an upper portion of the portion of the gate insulation pattern 140 adjacent thereto in the second direction D2 may be removed through an etching process.

In example embodiments, the etching process may include a wet etching process, and, the first pad 120 and the gate insulation pattern 140 including, for example, an oxide such as silicon oxide may be partially removed, while the first capping layer 160 including, for example, an insulating nitride such as silicon nitride may not be removed.

As the etching process is performed, the first opening 190 may be enlarged in the vertical direction to form a second opening 195 exposing an upper surface of the impurity region 107 at the upper portion of the active pattern 105 and an upper surface of the gate insulation pattern 140. A lower portion of the second opening 195 may have a width in the second direction D2 or the fourth direction D4 smaller than a width in the second direction D2 or the fourth direction D4 of an upper portion of the second opening 195.

Figure 15:
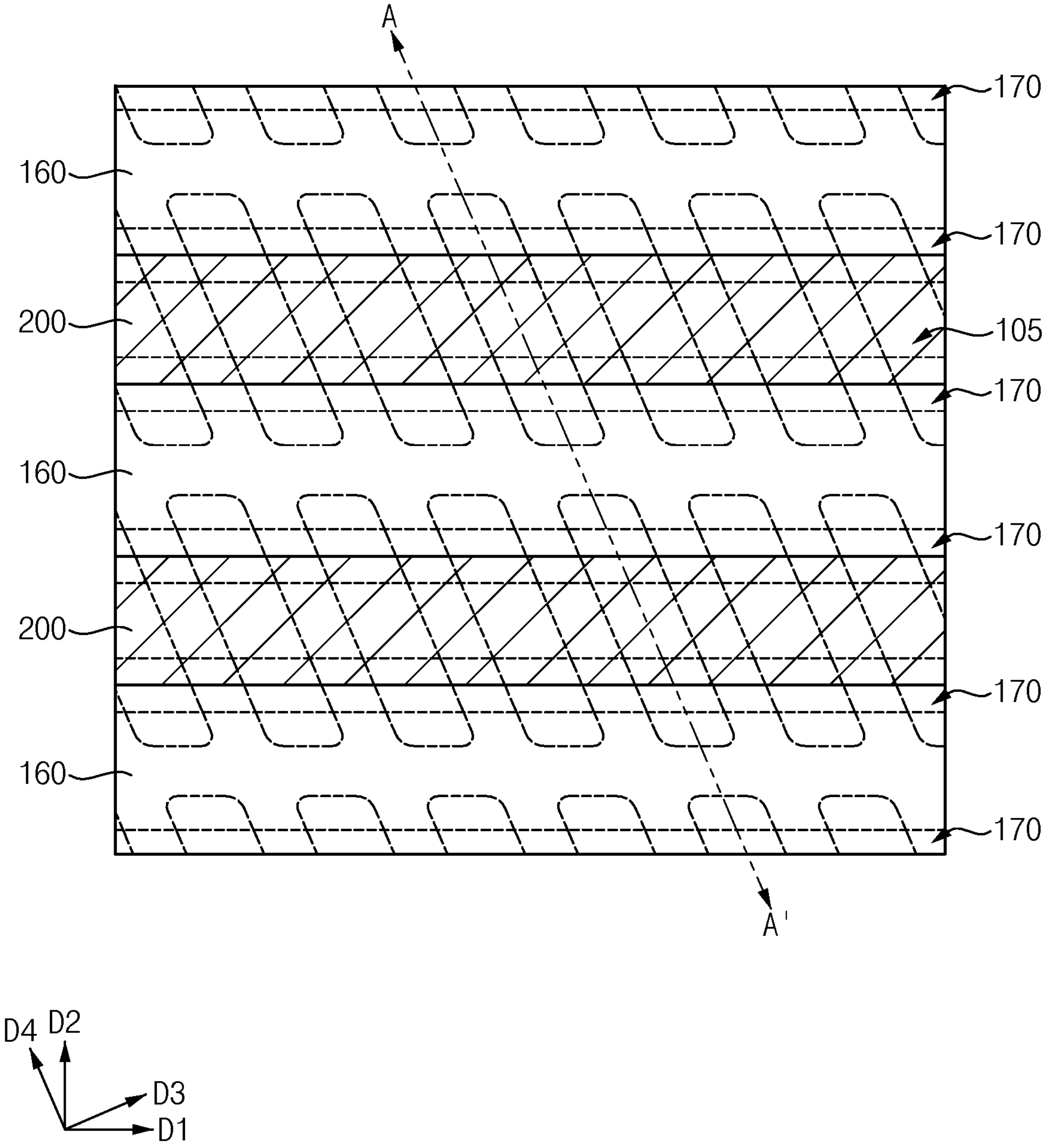
Figure 16:
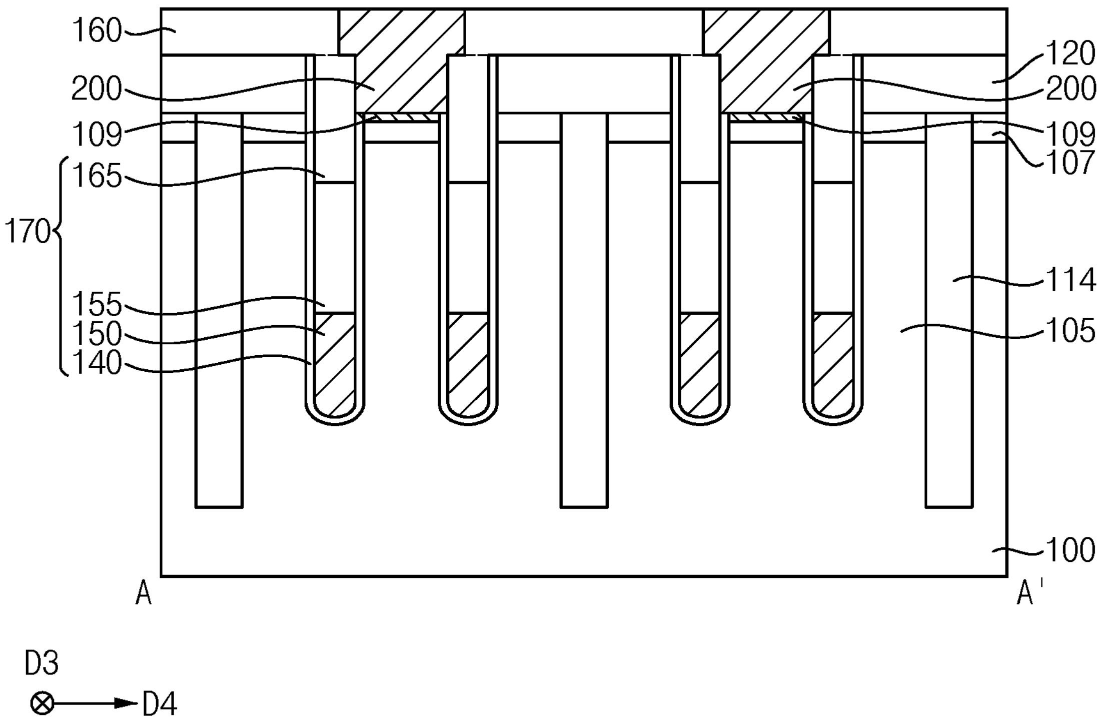

Referring to FIGS. 15 and 16, a first ohmic contact pattern 109 may be formed on the upper surface of the impurity region 107 exposed by the second opening 195, and a first conductive filling pattern 200 may be formed on the first ohmic contact pattern 109 to fill a remaining portion of the second opening 195.

The first ohmic contact pattern 109 may be formed by forming a first metal layer on the upper surfaces of the impurity region 107 and the gate insulation pattern 140 exposed by the second opening 195, a sidewall of the second opening 195 and an upper surface of the first capping layer 160, and performing heat treatment on the first metal layer so that the metal included in the first metal layer and silicon included in the impurity region 107 may be reacted with each other, and a portion of the first metal layer that is not be reacted with silicon may be removed. As a result, the first ohmic contact pattern 109 may be in contact with the upper surface of the impurity region 107 and sidewalls of the gate insulation pattern 140. A top surface of the first ohmic contact pattern 109 may be coplanar with the top surfaces of the gate insulation pattern 140 exposed by the second opening 195.

In example embodiments, the first ohmic contact pattern 109 may be formed on each of the active patterns 105 disposed in the first direction D1, and a plurality of first ohmic contact patterns 109 may be spaced apart from each other in the first direction D1. In addition, a plurality of first ohmic contact patterns 109 may be spaced apart from each other in the second direction D2.

The conductive filling pattern 200 may be formed by forming a third conductive layer on the first ohmic contact pattern 109 and the first mask 180 to fill the second opening 195, and performing a planarization process on the third conductive layer until the upper surface of the first capping layer 160 is exposed. During the planarization process, the first mask 180 may be removed. The planarization process may include, for example, a chemical mechanical polishing (CMP) process and/or an etch back process.

In example embodiments, the first conductive filling pattern 200 may extend in the first direction D1, and a plurality of first conductive filling patterns 200 may be spaced apart from each other in the second direction D2. Each of the first conductive filling patterns 200 may include a lower portion having a relatively small width and an upper portion having a relatively large width in the second direction D2 or the fourth direction D4.

The first capping layer 160 may have a lower portion formed on the second conductive pattern 155. The lower portion of the first capping layer 160 may have a width substantially the same as a width of the second conductive pattern 155 and have a sidewall covered by the gate insulation pattern 140. The lower portion may be referred to as a first capping pattern 165. The first capping pattern 165 may have an upper portion. The upper portion of the first capping pattern 165 may contact a lower sidewall of the first conductive filling pattern 200. In addition, the gate insulation pattern 140, the first conductive pattern 150, the second conductive pattern 155 and the first capping pattern 165 may collectively form a gate structure 170. The first conductive pattern 150, the second conductive pattern 155 and the first capping pattern 165 may be sequentially stacked in the vertical direction on the gate insulation pattern 140 and have sidewalls in contact with an inner wall of the gate insulation pattern 140.

Hereinafter, a remaining portion of the first capping layer 160 that does not form the first capping pattern 165, in other words, a portion of the first capping layer 160 on the first pad 120, the gate insulation pattern 140 and the first capping pattern 165, of which an upper surface is substantially coplanar with an upper surface of the first conductive filling pattern 200, may be referred to as a second pad 160.

Figure 17:
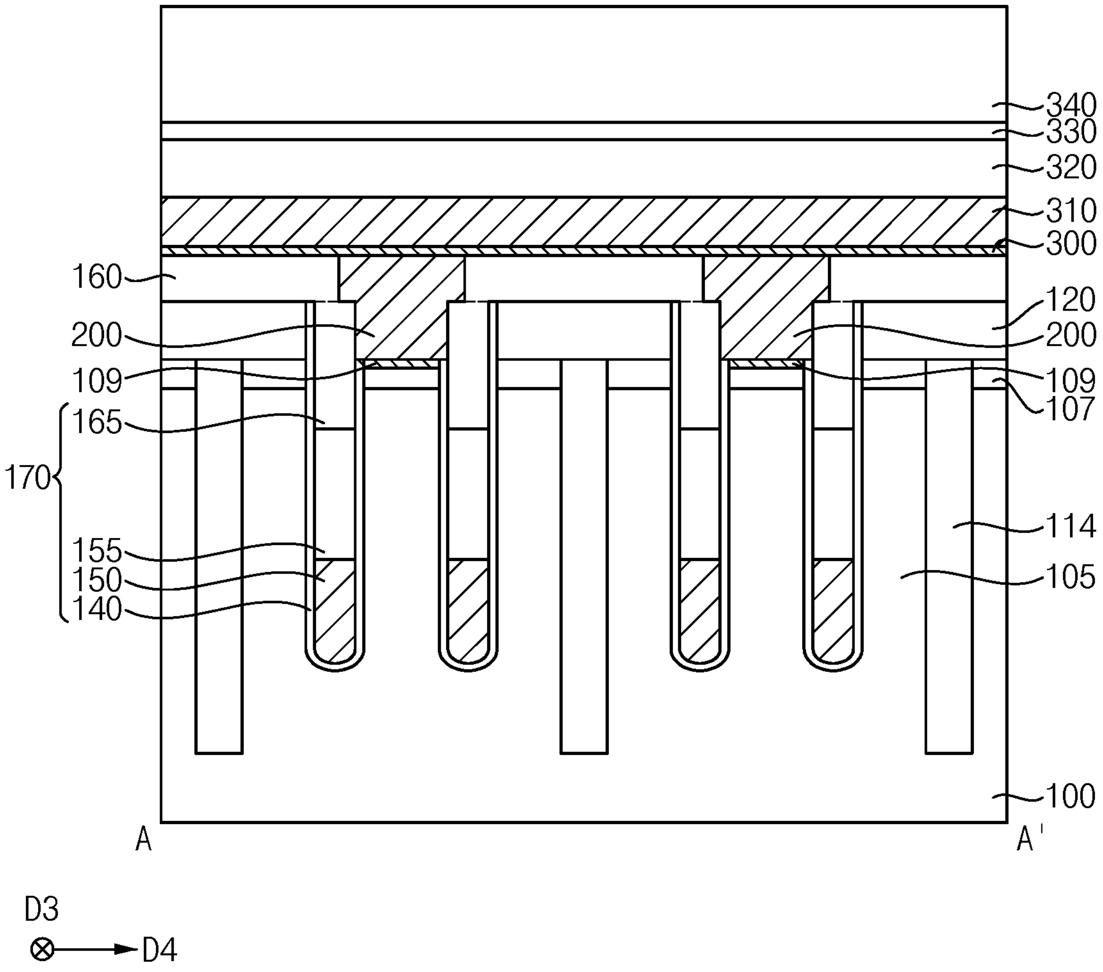

Referring to FIG. 17, an adhesive layer 300, a fourth conductive layer 310, a second mask layer 320, a first etch stop layer 330 and a second capping layer 340 may be sequentially stacked on the second pad 160 and the first conductive filling pattern 200.

Each of the second mask layer 320, the first etch stop layer 330 and the second capping layer 340 may include an insulating material, for example, a nitride such as silicon nitride. The second mask layer 320, the first etch stop layer 330 and the second capping layer 340 may collectively form an insulation layer structure, and in some cases, may be merged with each other to form a single layer.

Figure 18:
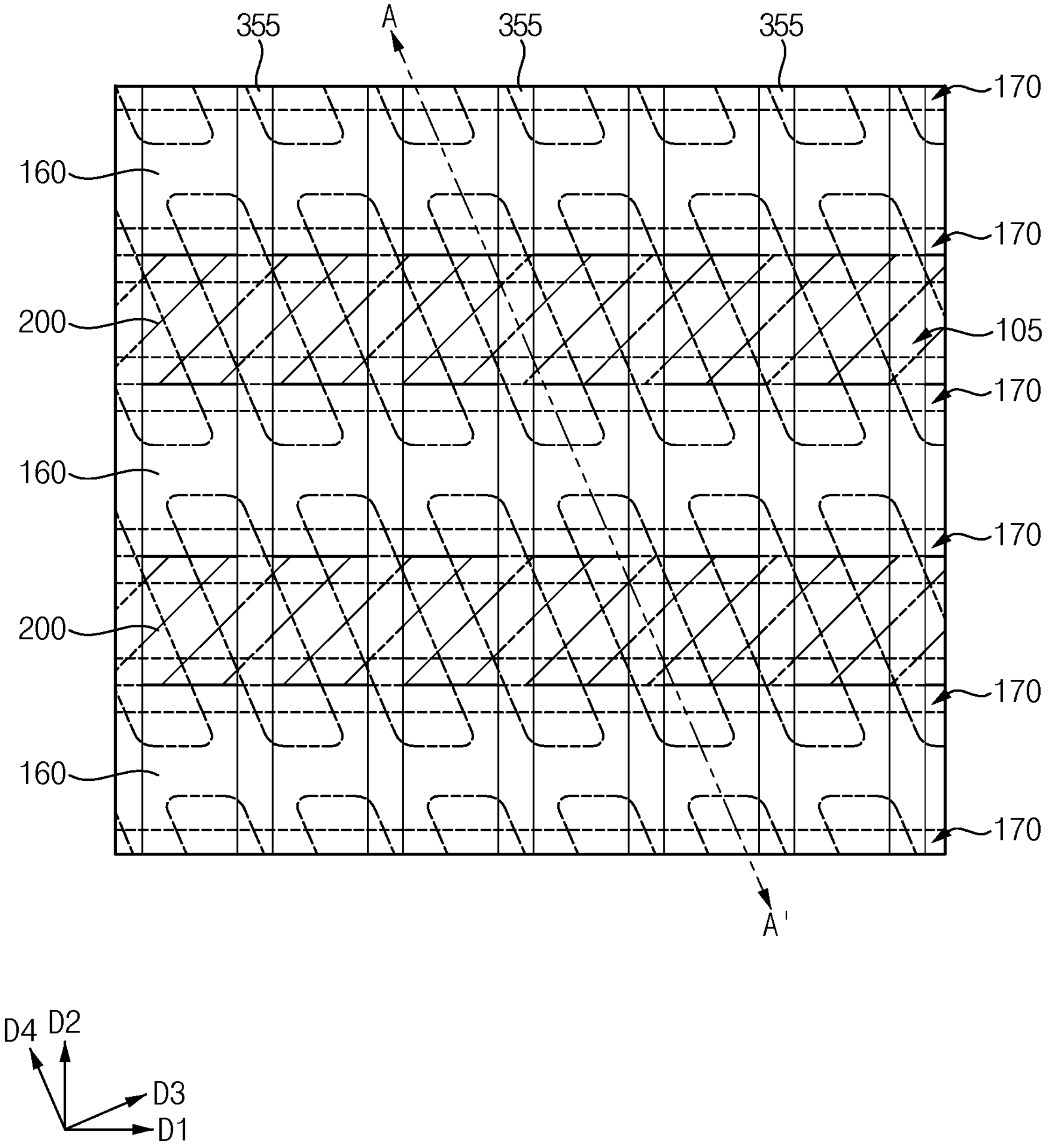
Figure 19:
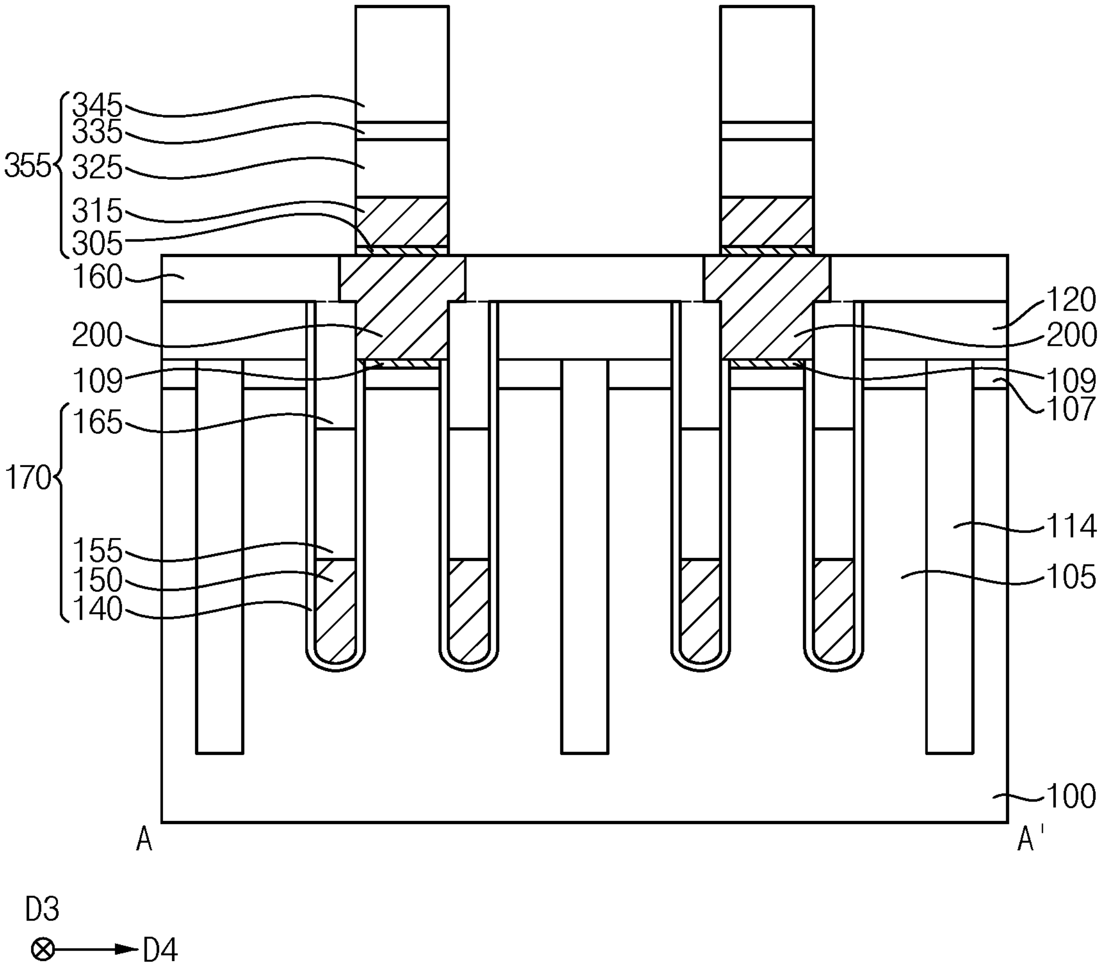

Referring to FIGS. 18 and 19, the second capping layer 340 may be etched to form a second capping pattern 345, and the first etch stop layer 330, the second mask layer 320, the fourth conductive layer 310 and the adhesive layer 300 may be sequentially etched by performing an etching process using the second capping pattern 345 as an etch mask.

Accordingly, a bit line structure 355 extending in the second direction D2 may be formed on the first conductive filling pattern 200, and a plurality of bit line structures 355 may be spaced apart from each other in the first direction D1. Each of the bit line structures 355 may contact an upper surface of the first conductive filling pattern 200 on the central portion of the corresponding ones of the active patterns 105 disposed in the second direction D2.

The bit line structure 355 may include an adhesive pattern 305, a fourth conductive pattern 315, a second mask 325, a first etch stop pattern 335 and the second capping pattern 345 sequentially stacked in the vertical direction. The second mask 325, the first etch stop pattern 335 and the second capping pattern 345 may collectively form a first insulation pattern structure.

Figure 20:
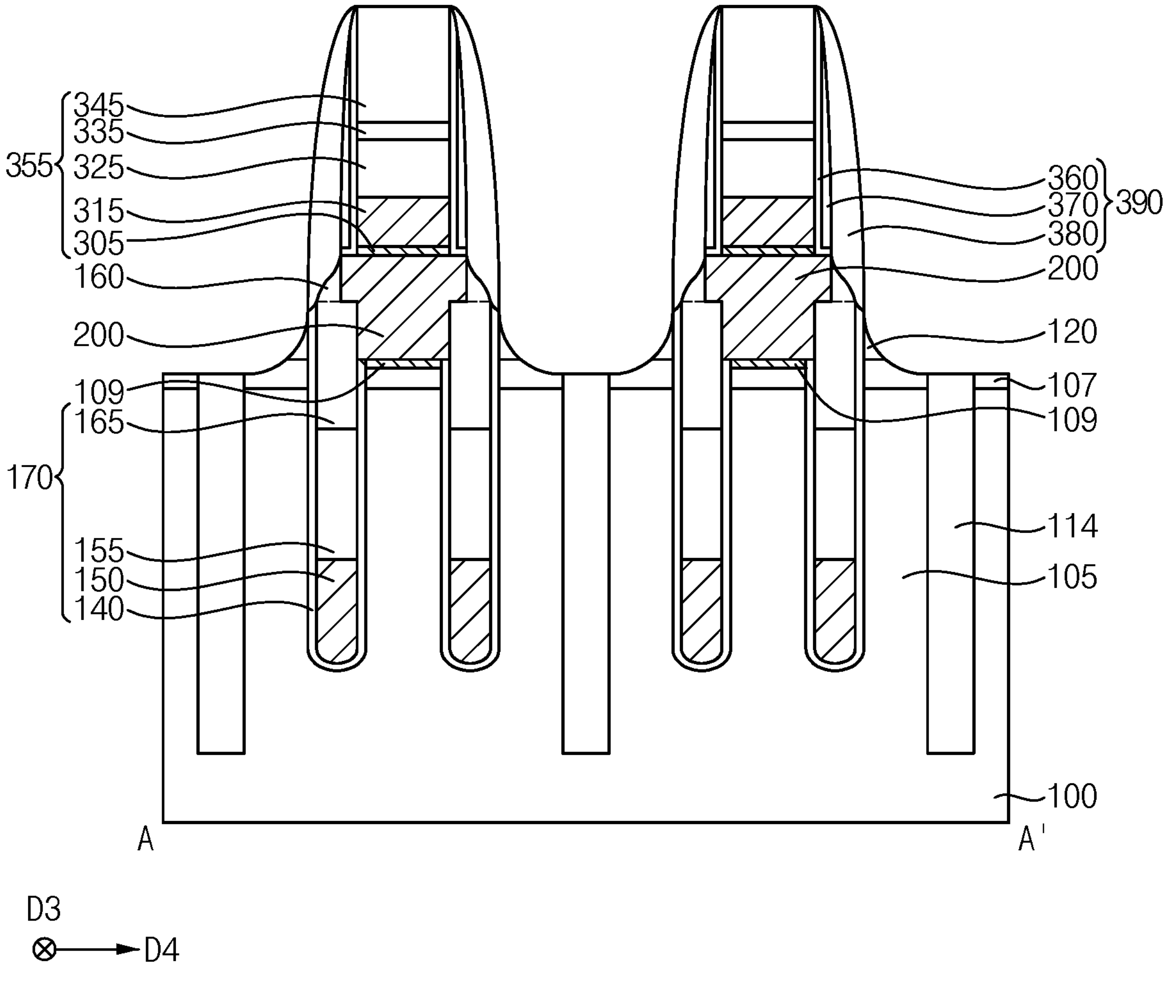

Referring to FIG. 20, a first spacer layer may be formed on the bit line structure 355, the first conductive filling pattern 200 and the second pad 160, and a second spacer layer may be formed on the first spacer layer.

An anisotropic etching process may be performed on the first and second spacer layers to form first and second spacers 360 and 370, respectively, stacked along the first direction D1 on a sidewall of the bit line structure 355 in the first direction D1. A cross-section of the first spacer 360 in the first direction D1 may have an "L" shape. The first spacer 360 may include, for example, a nitride such as silicon nitride, and the second spacer 370 may include, for example, an oxide such as silicon oxide.

When the first and second spacers 360 and 370 are formed, a portion of the second pad 160 that is not covered by the first and second spacers 360 and 370 and an upper portion of the first conductive filling pattern 200 may also be removed, and accordingly, an upper surface of the first pad 120 and an upper surface of a lower portion of the first conductive filling pattern 200 may be exposed.

A third spacer layer may be formed on the bit line structure 355, the first and second spacers 360 and 370, the first conductive filling pattern 200 and the first pad 120, and the anisotropic etching process may be performed thereon to form a third spacer 380. Accordingly, a preliminary spacer structure 390 including first to third spacers 360, 370 and 380 sequentially stacked in the first direction D1 may be formed on the sidewall of the bit line structure 355 in the first direction D1. The third spacer 380 may include, for example, a nitride such as silicon nitride.

When the third spacer 380 is formed, the first pad 120 and the lower portion of the first conductive filling pattern 200 not covered by the preliminary spacer structure 390, and the first ohmic contact pattern 109 under the first conductive filling pattern 200 may also be removed, and the upper surface of the impurity region 107 at the upper portion of the active pattern 105 and an upper surface of the isolation structure 110 (i.e., first and second isolation patterns 112 and 114) adjacent thereto may be exposed.

Figure 21:
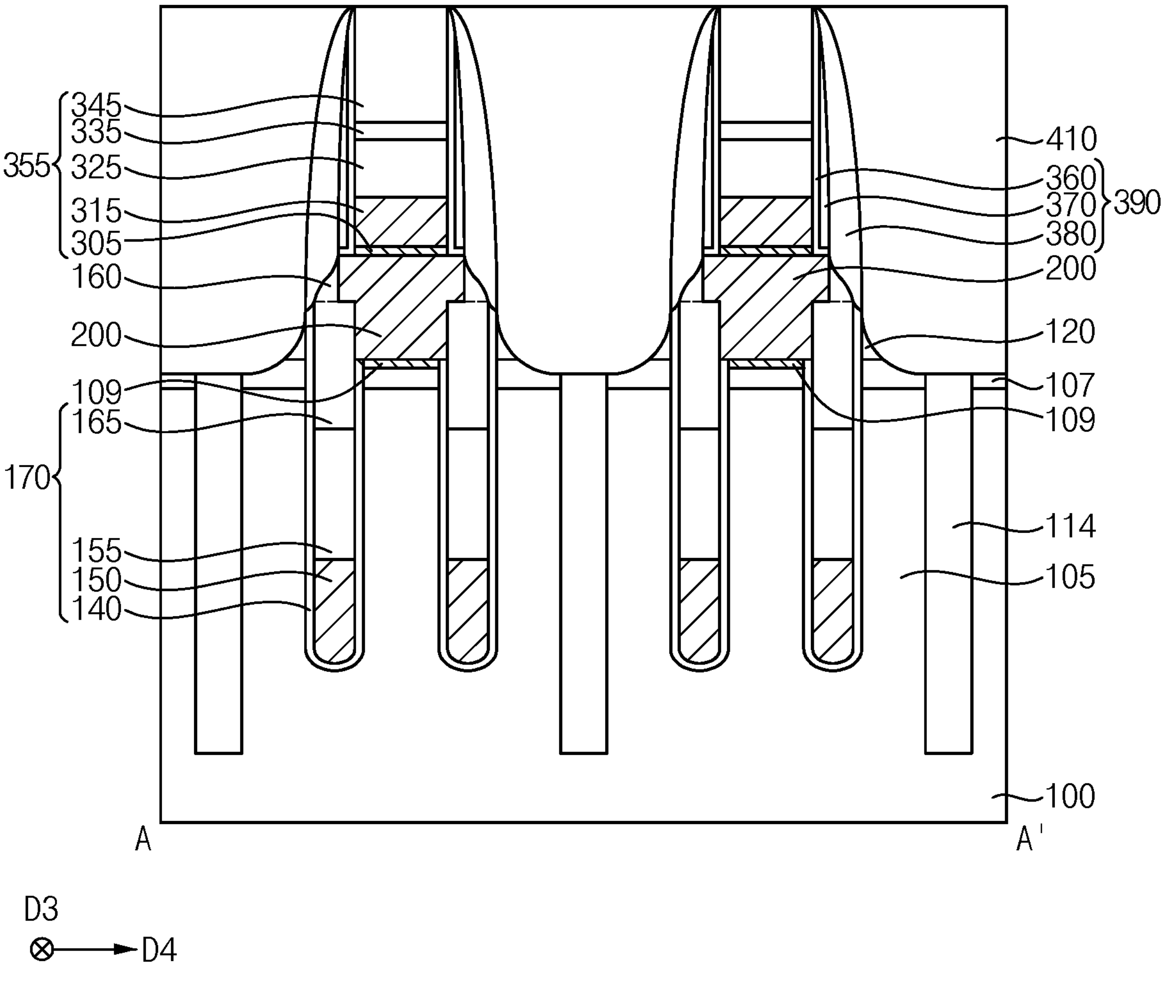

Referring to FIG. 21, a first sacrificial layer may be formed to a sufficient height on the bit line structure 355, the preliminary spacer structure 390, the active pattern 105 and the isolation structure 110, and may be planarized until an upper surface of the bit line structure 355 is exposed to form a first sacrificial pattern 410.

In example embodiments, the first sacrificial pattern 410 may extend in the second direction D2, and a plurality of first sacrificial patterns 410 may be spaced apart from each other by the bit line structures 355 in the first direction D1. The first sacrificial pattern 410 may include, for example, an oxide such as silicon oxide.

Figure 22:
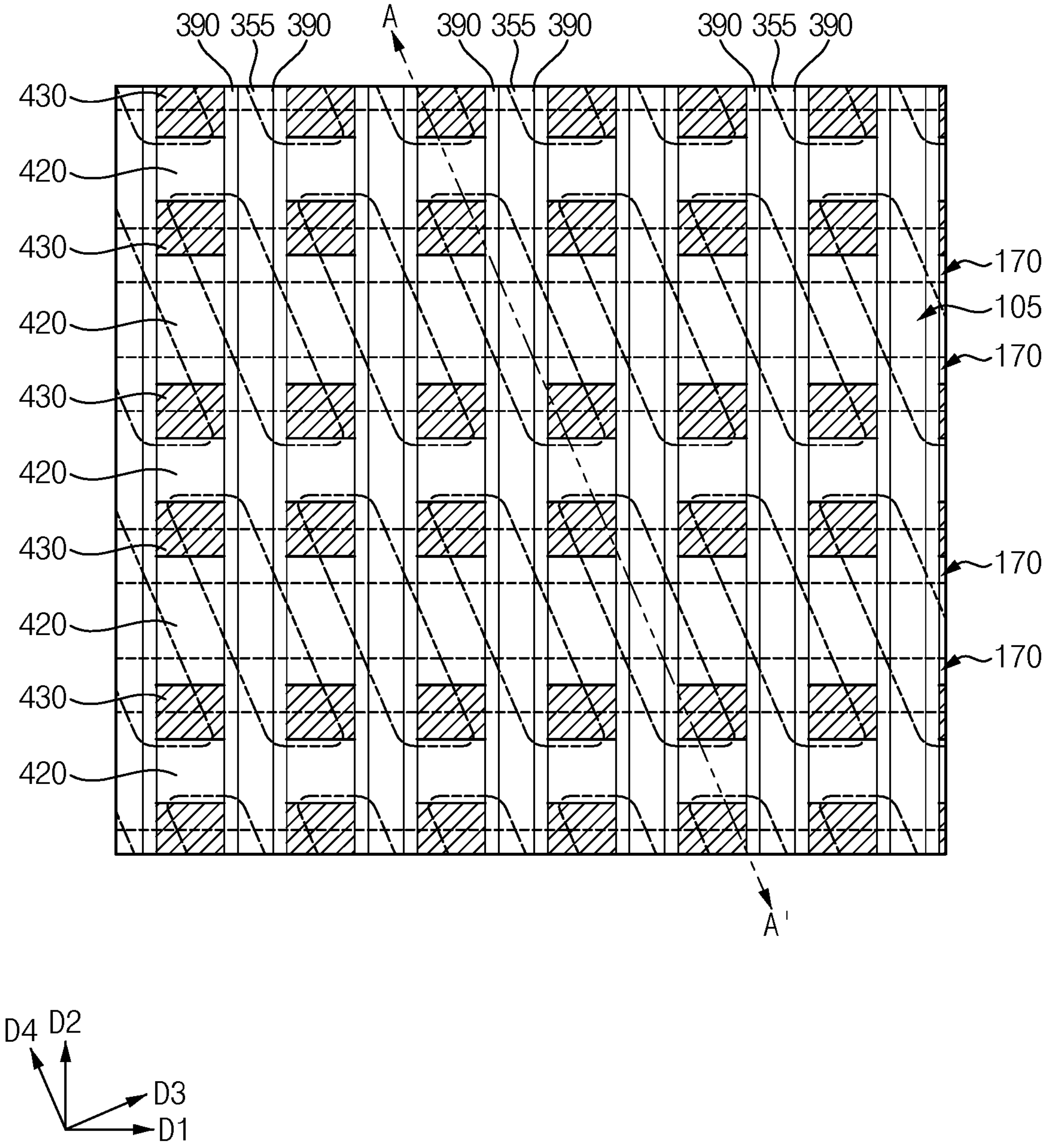
Figure 23:
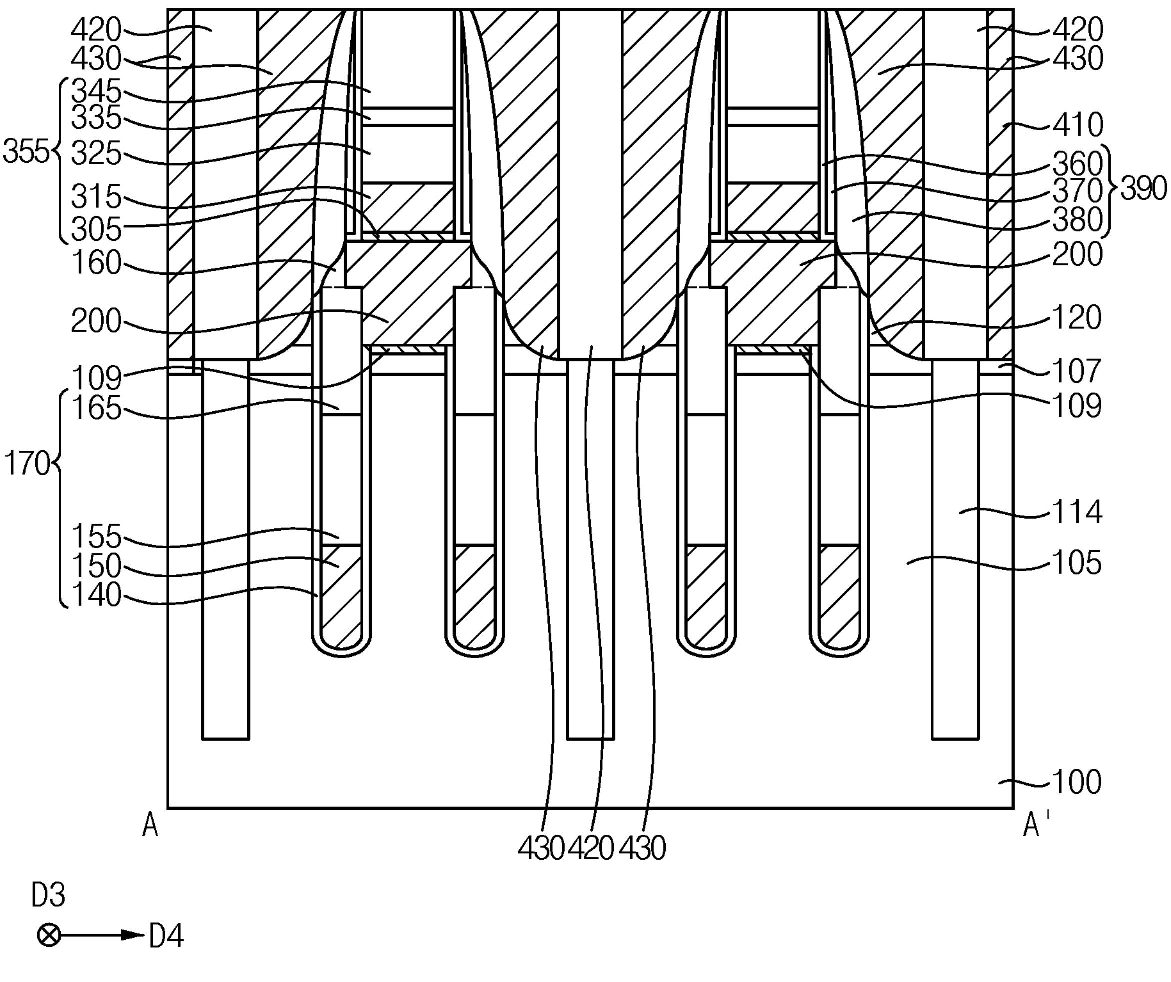

Referring to FIGS. 22 and 23, a third mask having a plurality of third openings spaced apart from each other in the second direction D2, each of which may extend in the first direction D1, may be formed on the bit line structure 355, the preliminary spacer structure 390 and the first sacrificial pattern 410, and the first sacrificial pattern 410 may be etched using the third mask as an etching mask.

In example embodiments, a first one of the third openings may overlap in the vertical direction the central portions of corresponding ones of the active patterns 105 disposed in the first direction D1 and portions of the first isolation patterns 112 adjacent thereto in the first direction D1, and a second one of the third openings may overlap in the vertical the second isolation pattern 114. By the etching process, a fourth opening exposing the upper surfaces of the active pattern 105 and the isolation structure 110 may be formed on the substrate 100 between ones of the bit line structures 355 adjacent to each other in the first direction D1.

After removing the third mask, a fence layer may be formed to fill the fourth opening, and an upper portion of the fence layer may be planarized until the upper surface of the bit line structure 355 is exposed. Accordingly, the fence layer may be divided into a plurality of fence patterns 420 spaced apart from each other in the second direction D2 between ones of the bit line structures 355 adjacent to each other in the first direction D1. The fence pattern 420 may include, for example, a nitride such as silicon nitride.

The first sacrificial pattern 410 extending in the second direction D2 between the bit line structures 355 may be separated into a plurality of parts spaced apart from each other in the second direction D2 by the fence patterns 420.

The first sacrificial pattern 410 may be removed to form a fifth opening, and a lower contact plug 430 may be formed in the fifth opening. In example embodiments, a plurality of lower contact plugs 430 may be spaced apart from each other in the second direction D2 by fence patterns 420 between the bit line structures 355, and each of the lower contact plugs 430 may contact the upper surface of the impurity region 107 at the upper portion of a corresponding one of opposite end portions in the fourth direction D4 of the active pattern 105. The lower contact plug 430 may include, for example, polysilicon doped with n-type impurities or p-type impurities.

In some embodiments, unlike the processes described with reference to FIGS. 21 to 23, the lower contact plugs 430, each of which may extend in the second direction D2 between the bit line structures 355 adjacent to each other in the first direction D1, may be formed to be spaced apart from each other in the first direction D1, each of the lower contact plugs 430 may be partially etched to form the fourth opening, and the fence pattern 420 may be formed in the fourth opening. Accordingly, the lower contact plugs 430 and the fence patterns 420 may be alternately and repeatedly formed in the second direction D2 between the bit line structures 355.

Figure 24:
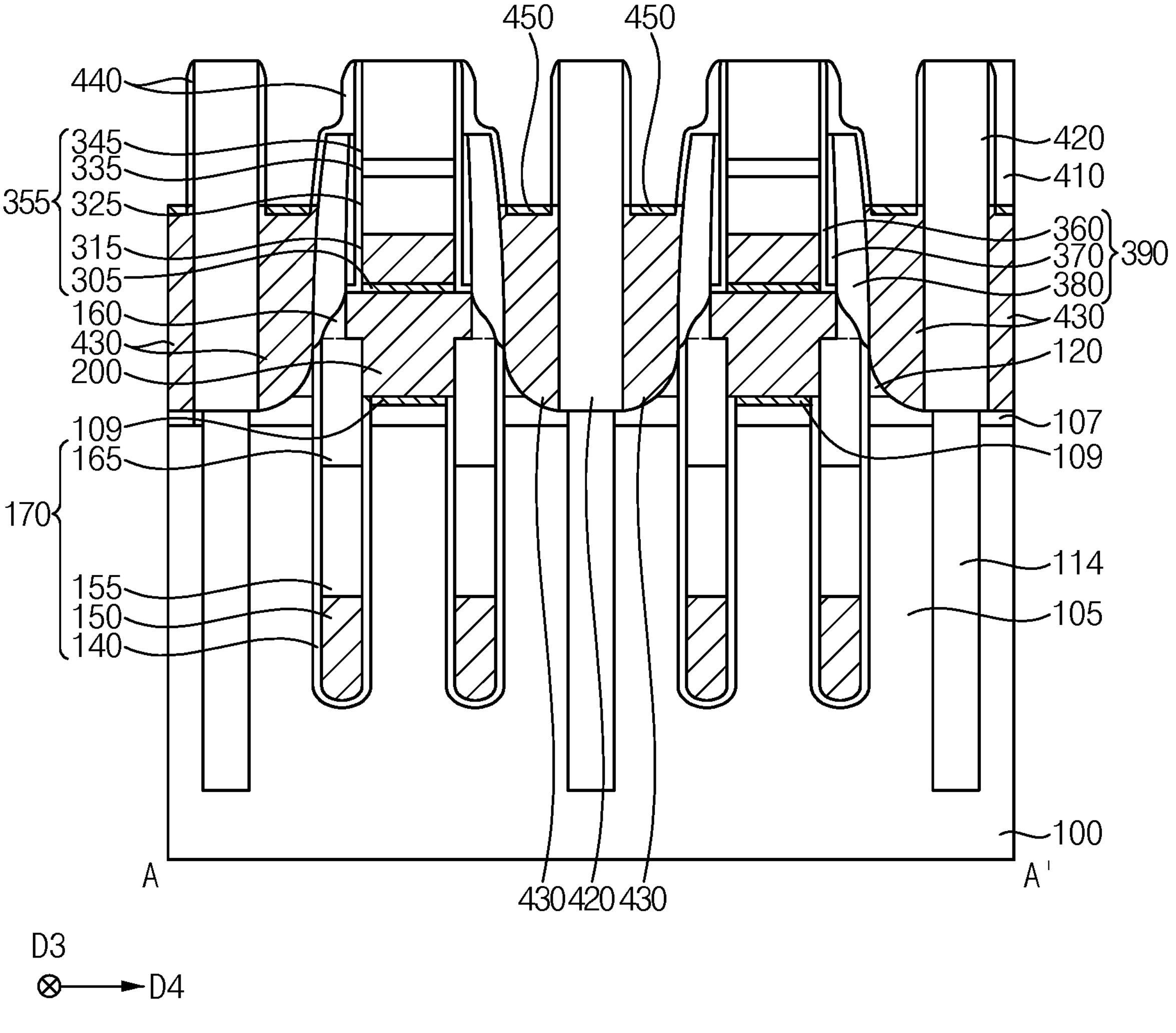

Referring to FIG. 24, an upper portion of the lower contact plug 430 may be partially removed to expose an upper portion of the preliminary spacer structure 390 on the sidewall of the bit line structure 355, and upper portions of the second and third spacers 370 and 380 of the exposed preliminary spacer structure 390 may be removed.

An upper portion of the lower contact plug 430 may be further removed. Accordingly, an upper surface of the lower contact plug 430 may be lower than top surfaces of the second and third spacers 370 and 380.

A fourth spacer layer may be formed on the bit line structure 355, the preliminary spacer structure 390, the fence pattern 420 and the lower contact plug 430, and may be anisotropically etched to form a fourth spacer 440 covering an upper portion of the preliminary spacer structure 390 on each of opposite sidewalls of the bit line structure 355 in the first direction D1. Thus, the upper surface of the lower contact plug 430 may be exposed.

A second ohmic contact pattern 450 may be formed on the exposed upper surface of the lower contact plug 430. In example embodiments, the second ohmic contact pattern 450 may be formed by forming a second metal layer on the bit line structure 355, the preliminary spacer structure 390, the fourth spacer 440, the fence pattern 420 and the lower contact plug 430, and performing heat treatment on the second metal layer so that a metal included in the second metal layer and silicon included in the lower contact plug 430 may be reacted with each other, and a portion of the second metal layer that is not be reacted with silicon may be removed.

Figure 25:
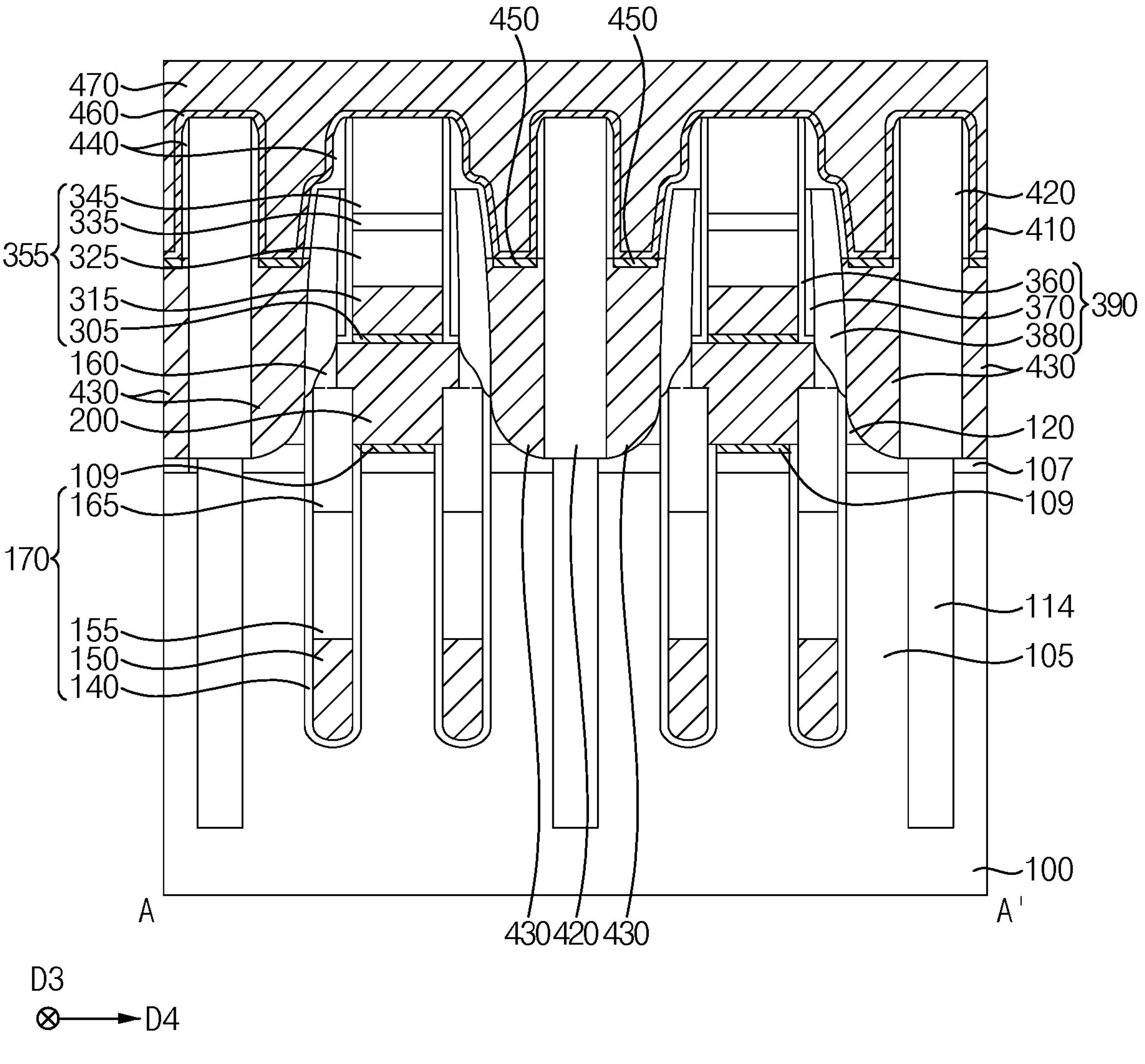

Referring to FIG. 25, a barrier layer 460 may be formed on the bit line structure 355, the preliminary spacer structure 390, the fourth spacer 440, the fence pattern 420 and the second ohmic contact pattern 450, and a third metal layer 470 may be formed on the barrier layer 460 in a space between the bit line structures 355.

A planarization process may be further performed on an upper portion of the third metal layer 470. The planarization process may include, for example, a chemical mechanical polishing (CMP) process and/or an etch back process.

Referring to FIGS. 26 and 27, the third metal layer 470 and the barrier layer 460 may be patterned to form upper contact plugs 485, and a sixth opening 490 may be formed between the upper contact plugs 485.

The sixth opening 490 may be formed by partially removing not only the third metal layer 470 and the barrier layer 460, but also the first insulation pattern structure included in the bit line structure 355, the preliminary spacer structure 390 and the fourth spacer 440.

The upper contact plug 485 may include a third metal pattern 475 and a barrier pattern 465 covering a lower surface thereof. In example embodiments, the upper contact plug 485 may have a shape such as a circle, an ellipse, a polygon, a polygon with rounded corners, etc., and may be arranged, for example, in a honeycomb pattern in the first and second directions D1 and D2, in a plan view.

The lower contact plug 430, the second ohmic contact pattern 450 and the upper contact plug 485 sequentially stacked on the substrate 100 may collectively form a contact plug structure.

Figure 28:
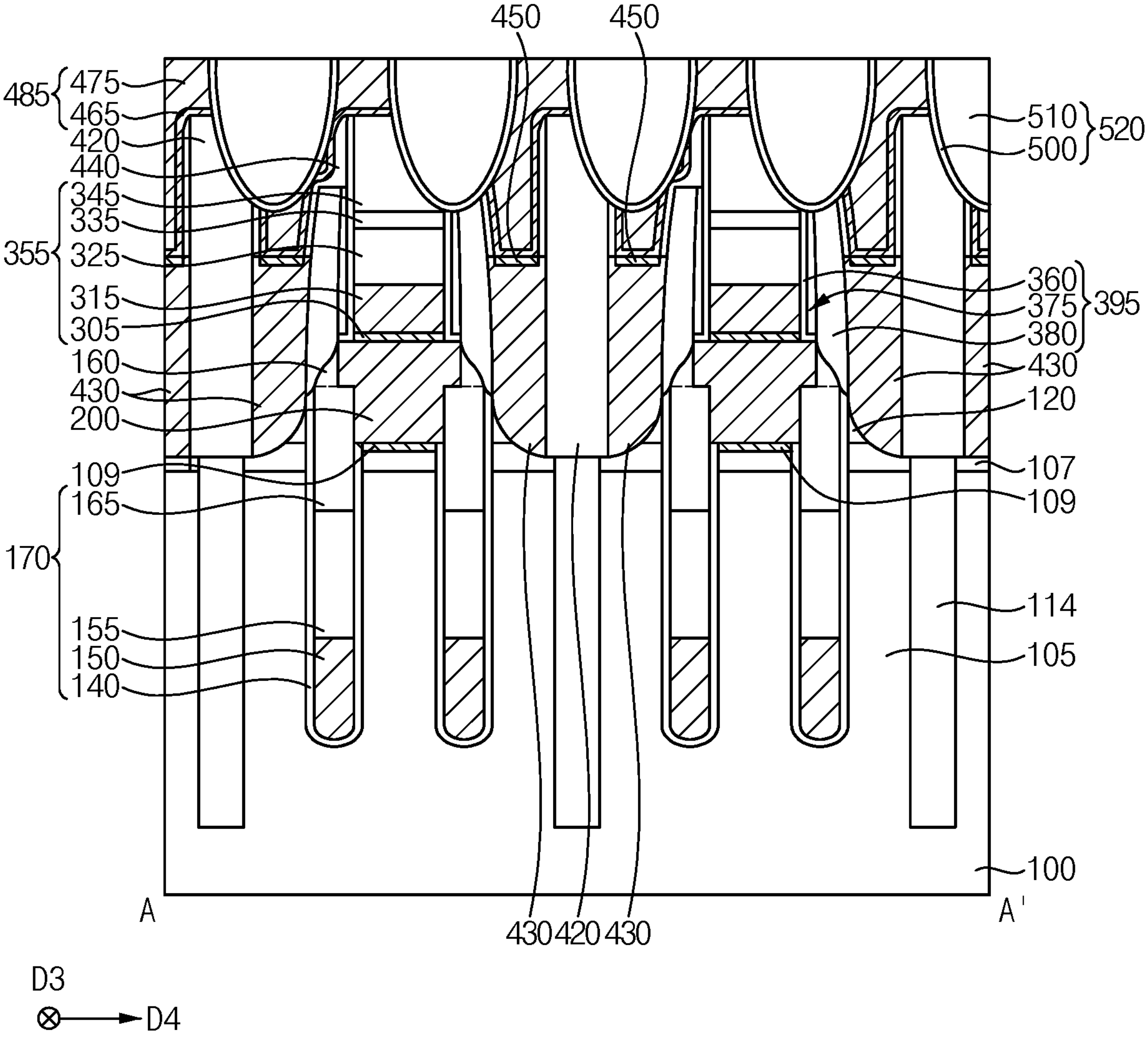

Referring to FIG. 28, the second spacer 370 included in the preliminary spacer structure 390 exposed by the sixth opening 490 may be removed to form an air gap, a first insulation pattern 500 may be formed on a bottom and a sidewall of the sixth opening 490, and a second insulation pattern 510 may be formed in a remaining portion of the sixth opening 490.

The first and second insulation patterns 500 and 510 may collectively form a second insulation pattern structure 520.

An upper end of the air gap may be covered by the first insulation pattern 500, so that an air spacer 375 may be formed. The first spacer 360, the air spacer 375 and the third spacer 380 may collectively form a spacer structure 395.

However, in some example embodiments, the second spacer 370 may not be removed, and in this case, instead of the spacer structure 395 including the air spacer 375, the preliminary spacer structure 390 including the second spacer 370 may remain.

Referring back to FIGS. 1 to 4, a second etch stop layer 530 and a mold layer may be sequentially formed on the second insulation pattern structure 520 and the upper contact plug 485, a seventh opening may be formed through the mold layer and the second etch stop layer 530 to expose an upper surface of the upper contact plug 485, and a lower electrode 540 may be formed in the seventh opening.

The mold layer may be removed, and a dielectric layer 550 and an upper electrode 560 may be sequentially formed on the lower electrode 540 and the second etch stop layer 530. Thus, a capacitor 570 including the lower electrode 540, the dielectric layer 550 and the upper electrode 560 may be formed, and a fabrication of the semiconductor device may be completed.

As illustrated above, the first pad layer may be formed on the active pattern 105, the first pad layer and the active pattern 105 may be partially removed by the etching process to form the third recesses 130, and the gate structure 170 may be formed in each of the third recesses 130. The first pad layer may be transformed into the first pad 120 by the etching process, the portion of the first pad 120 between the third recesses 130 may be removed to form the second opening 195, and the first conductive filling pattern 200 may be formed in the second opening 195. The bit line structure 355 may be formed to contact the first conductive filling pattern 200 so as to be electrically connected to the active pattern 105 through the first conductive filling pattern 200.

The second opening 195 in which the first conductive filling pattern 200 is formed may be formed by removing the portion of the first pad 120 between the third recesses 130 adjacent to each other in the second direction D2, and thus a width in the second direction D2 of the second opening 195 may be defined by the third recesses 130. Accordingly, the first conductive filling pattern 200 may be self-aligned to the gate structure 170 in each of the third recesses 130. Unlike the case where the gate structure 170 and the first conductive filling pattern 200 are separately formed, misalignment may not occur between the first conductive filling pattern 200 and the gate structure 170, and thus the first conductive filling pattern 200 may be easily formed at a desired location with respect to the gate structure 170.

Figure 29A:
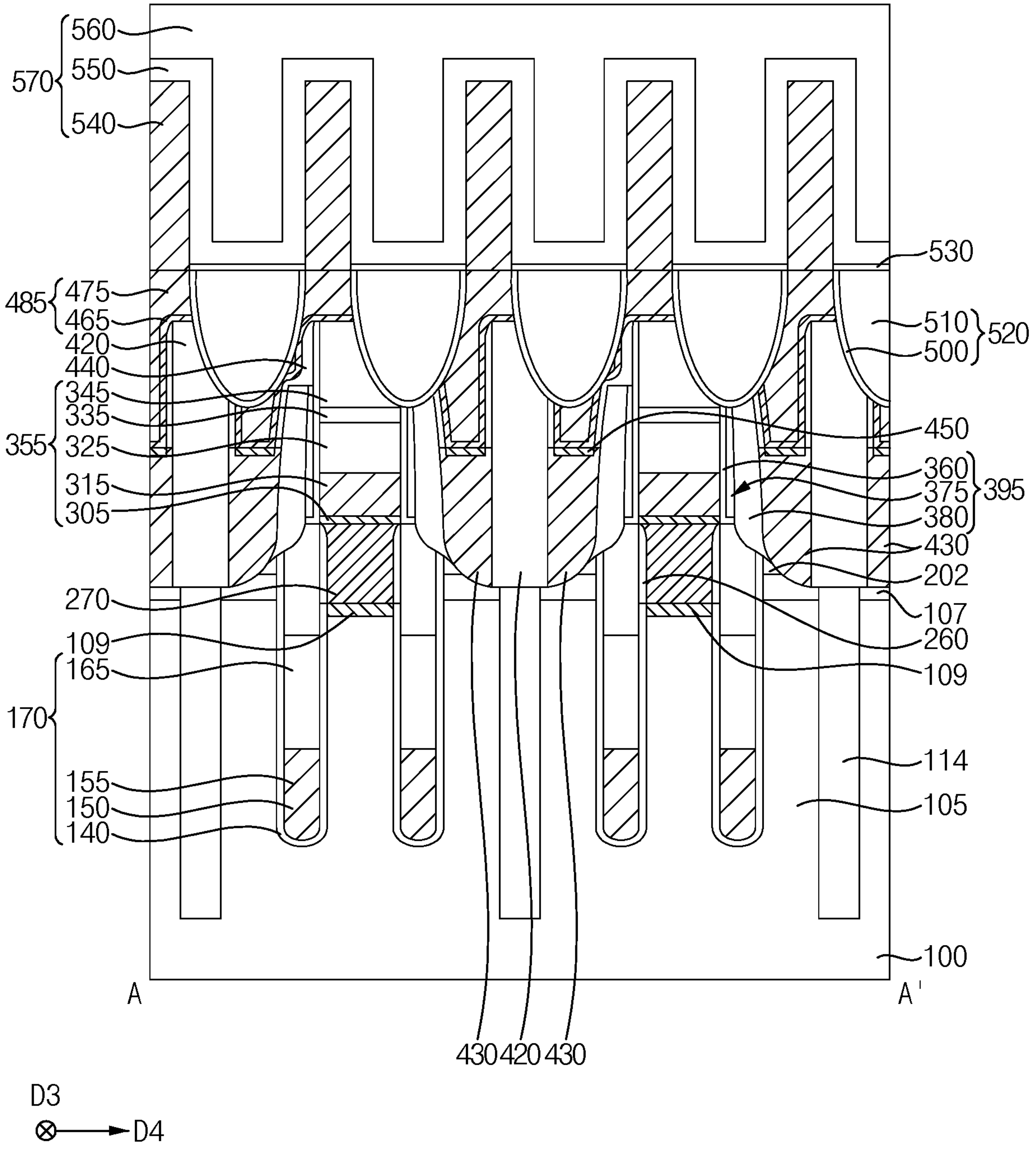
FIGS. 29A to 29B are cross-sectional views illustrating a semiconductor device in accordance with example embodiments.
Figure 29B:
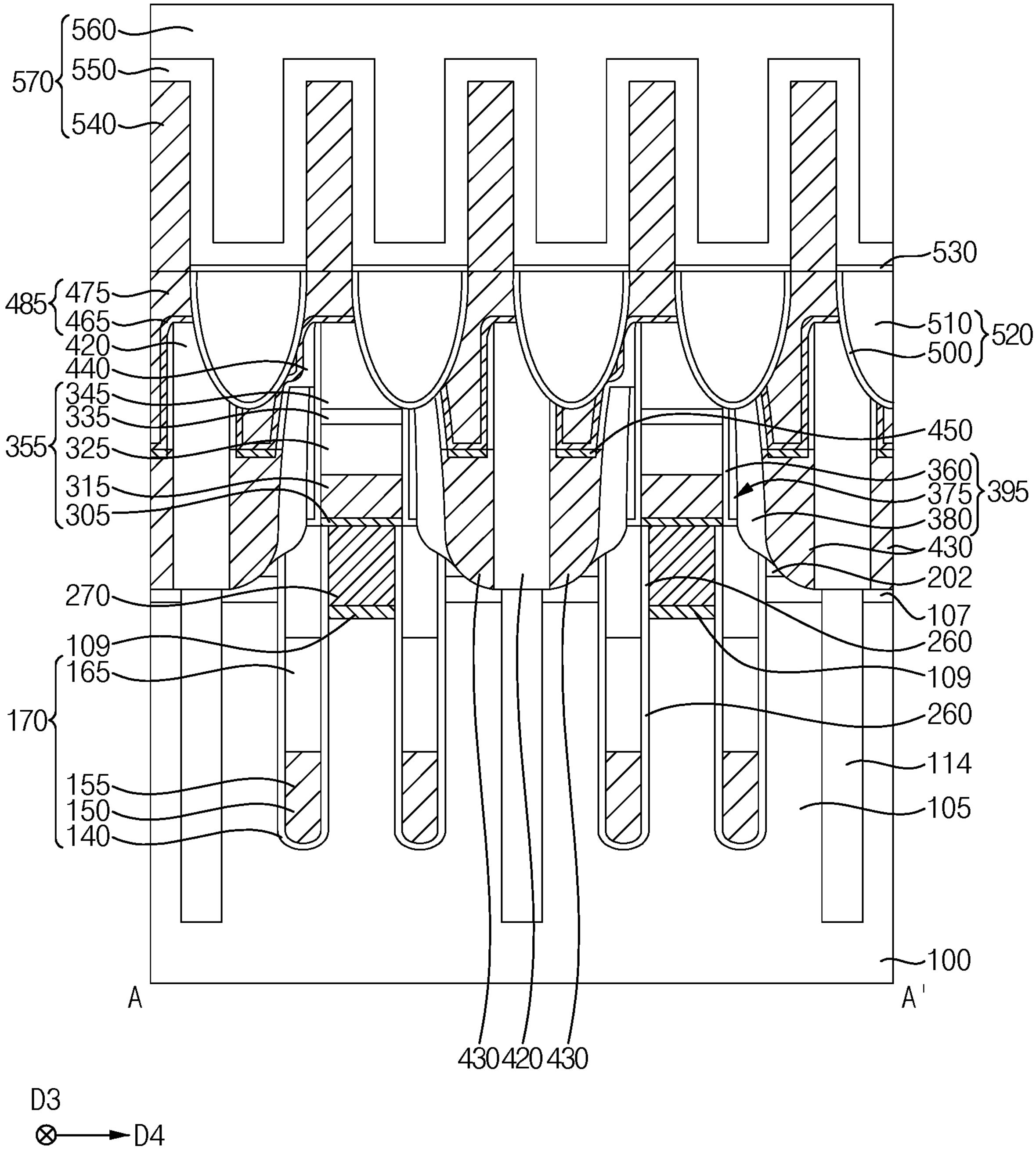

FIGS. 29A and 29B are cross-sectional views illustrating a semiconductor device in accordance with example embodiments, which corresponds to FIG. 2. Each of the semiconductor devices may be substantially the same as or similar to that of FIGS. 1 to 4, except for some components, and thus repeated explanations are omitted herein.

Referring to FIG. 29A, third and fourth pads 202 and 210 (refer to FIGS. 34 to 43) may be stacked on the active pattern 105 and the isolation structure 110, instead of the first and second pads 120 and 160.

The third pad 202 may include an oxide, e.g., silicon oxide, and the fourth pad 210 may include an insulating nitride, e.g., silicon nitride.

In example embodiments, the gate structure 170 may extend through the upper portion of the active pattern 105 and the third and fourth pads 202 and 210. In addition, instead of the first conductive filling pattern 200, a second conductive filling pattern 270 may be formed between the ones of the gate structures 170 adjacent to each other in the second direction D2 that may extend through one active pattern 105.

The second conductive filling pattern 270 may extend through the upper portion of the active pattern 105 and the third and the fourth pads 202 and 210, and widths of a lower portion and an upper portion, respectively, in the second direction D2 of the second conductive filling pattern 270 may be substantially the same as each other. In example embodiments, a top surface of the gate insulation pattern 140 included in the gate structure 170 may be substantially coplanar with a bottom surface of the bit line structure 355. The second conductive filling pattern 270 may include, e.g., a metal or a metal nitride, etc.

In an example embodiment, a lower spacer 260 may be further formed on a sidewall in the second direction D2 of the second conductive filling pattern 270, and an outer sidewall of the lower spacer 260 may contact an outer sidewall of the gate insulation pattern 140. The lower spacer 260 may include an insulating nitride, e.g., silicon nitride.

A lower surface of the first ohmic contact pattern 109 between the active pattern 105 and the second conductive filling pattern 270 may be lower than a lower surface of the impurity region 107. In certain embodiments, the lower surface of the first ohmic contact pattern 109 may contact the active pattern 105.

Referring to FIG. 29B, the gate insulation pattern 140 included in the gate structure 170 may cover an entire sidewall of the first capping pattern 165, and thus the second conductive filling pattern 270 may contact the outer sidewall of the gate insulation pattern 140 instead of a sidewall of the first capping pattern 165. In an example embodiment, the second conductive filling pattern 270 may include, e.g., a polysilicon doped with n-type impurities or p-type impurities, and in this case, the first ohmic contact pattern 109 may not be formed.

FIGS. 30 to 43 are plan views and cross-sectional views illustrating a method of manufacturing a semiconductor device in accordance with example embodiments. Particularly, FIGS. 30, 32, 34, 36, 38, 40 and 42 are the plan views, and FIGS. 31, 33, 35, 37, 39, 41 and 43 are cross-sectional views taken along lines A-A' of corresponding plan views, respectively.

This method may include processes substantially the same as or similar to those illustrated with reference to FIGS. 5 to 28 and FIGS. 1 to 4, and repeated explanations thereof are omitted herein.

Figure 30:
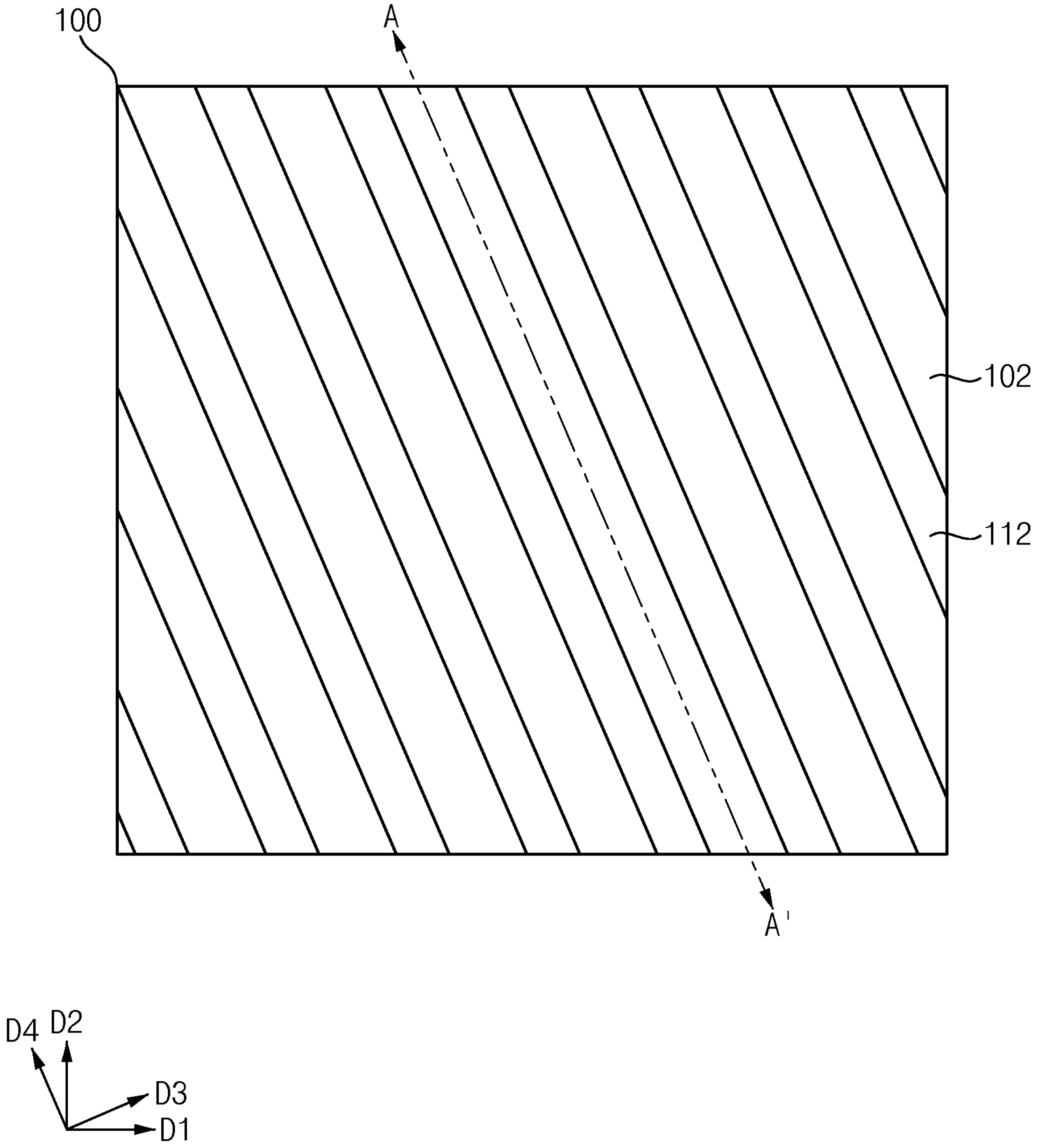
FIGS. 30 to 43 are plan views and cross-sectional views illustrating a method of manufacturing a semiconductor device in accordance with example embodiments.

Referring to FIG. 30, the upper portion of the substrate 100 may be removed to form the first recess, and the first isolation pattern 112 may be formed to fill the first recess.

As the first isolation pattern 112 is formed on the substrate 100, a preliminary active pattern 102 whose sidewall is covered by the first isolation pattern 112 may be defined on the substrate 100.

In example embodiments, the preliminary active pattern 102 may extend in the fourth direction D4, and a plurality of preliminary active patterns 102 may be spaced apart from each other in the third direction D3 or the first direction D1.

Figure 31:
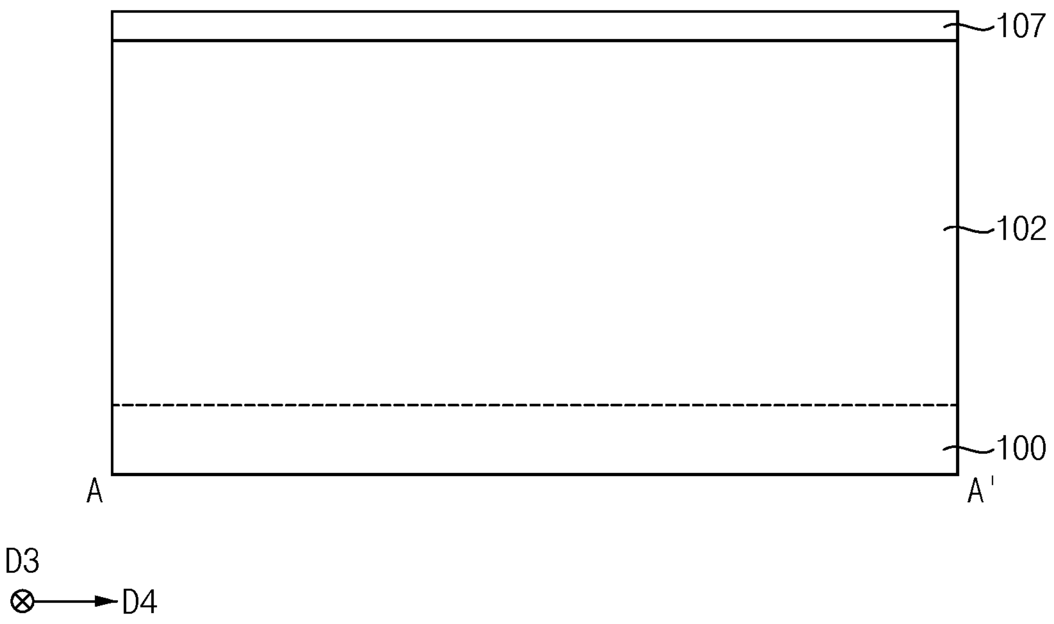

Referring to FIG. 31, e.g., n-type impurities or p-type impurities may be doped into an upper portion of the preliminary active pattern 102 to form the impurity region 107.

In example embodiment, the impurity region 107 may be formed through a gas phase doping (GPD) process.

Figure 32:
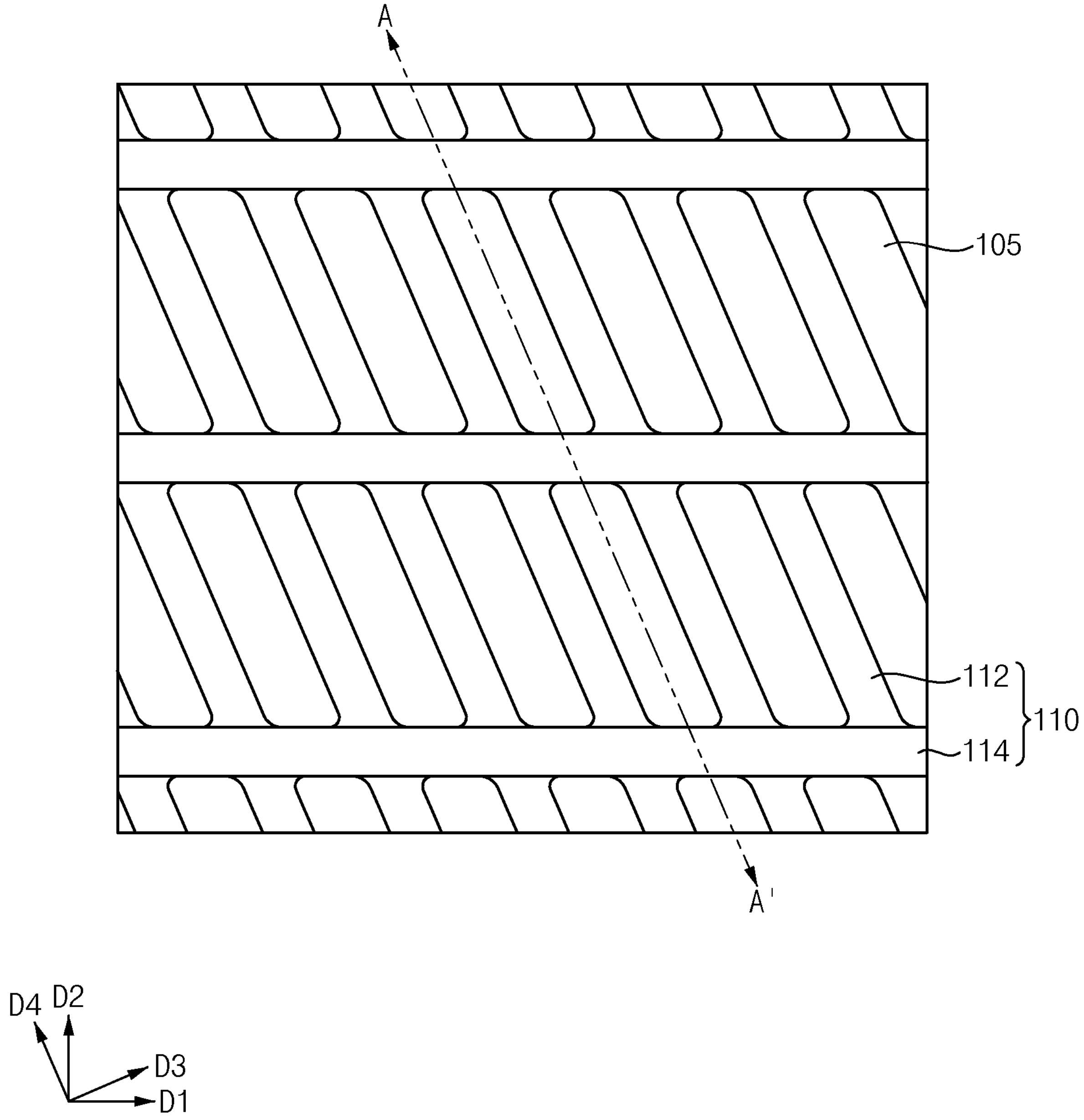
Figure 33:
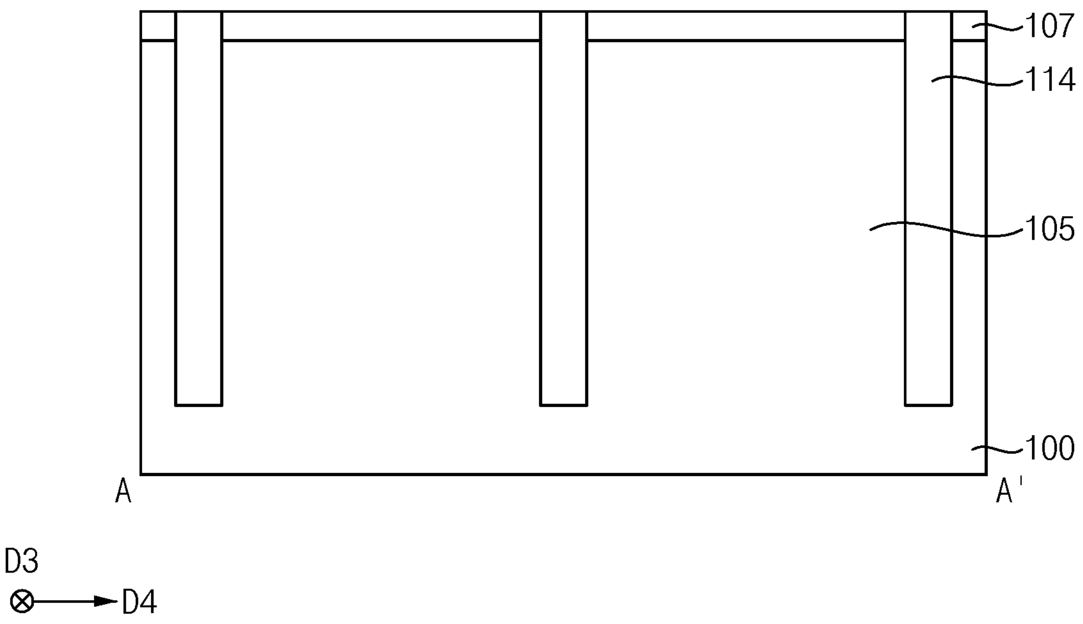

Referring to FIGS. 32 and 33, the preliminary active pattern 102 having the impurity region 107 at the upper portion thereof and the isolation structure 110 may be partially removed to form the second recess extending in the first direction D1, and the second isolation pattern 114 may be formed in the second recess.

Thus, the isolation structure 110 including the first and the second isolation patterns 112 and 114 may be formed on the substrate 100, and the preliminary active pattern 102 extending in the fourth direction D4 may be divided into the active patterns 105, whose sidewalls are covered by the isolation structure 110, spaced apart from each other in the fourth direction D4.

Figure 34:
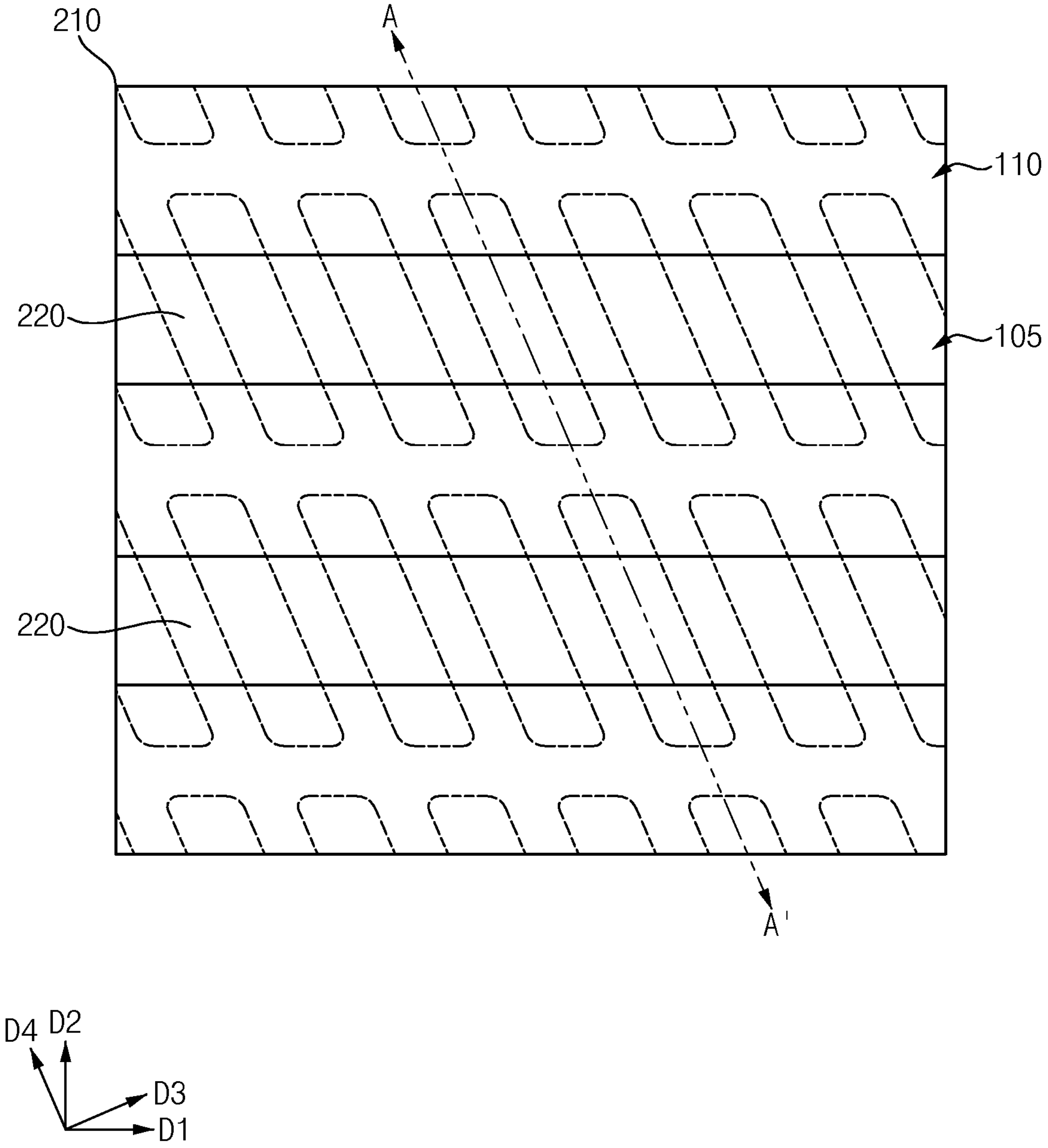
Figure 35:
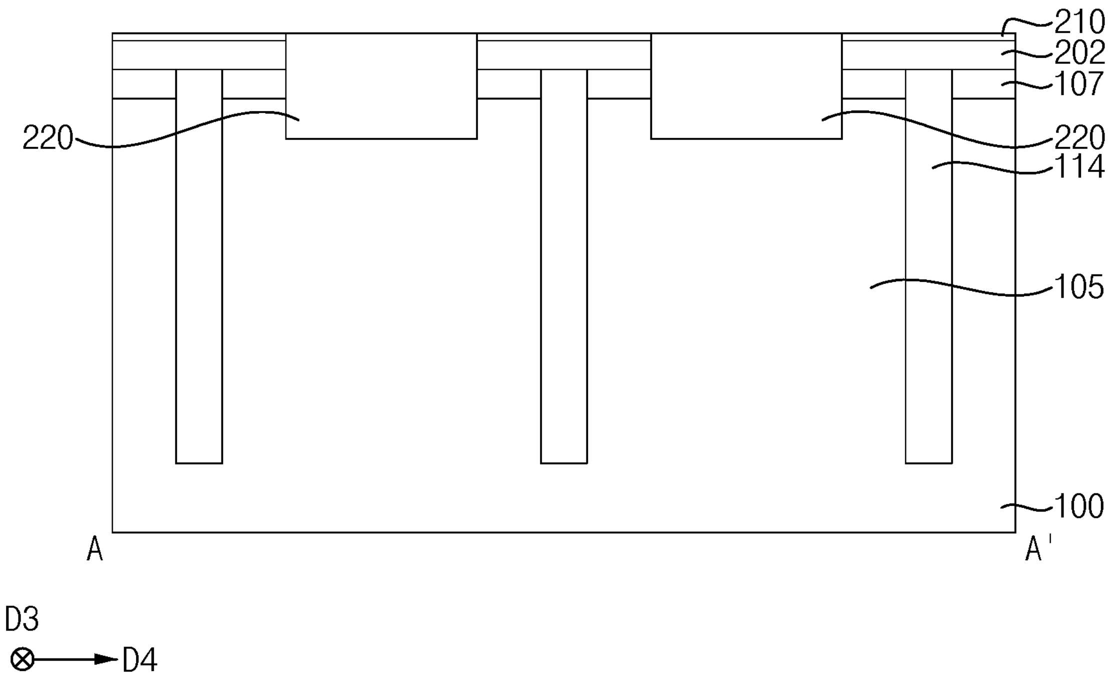

Referring to FIGS. 34 and 35, the third and fourth pads may be sequentially formed on the active pattern 105 and the isolation structure 110, and the third and fourth pads 202 and 210, the impurity region 107, a portion of the active pattern 105 under the impurity region 107 may be partially removed by an etching process to form a fourth recess, and a second sacrificial pattern 220 may be formed to fill the fourth recess.

The second sacrificial pattern 220 may expend in the first direction D1, and a plurality of second sacrificial patterns 220 may be spaced apart from each other in the second direction D2. In example embodiments, the second sacrificial pattern 220 may extend through the upper portions in the fourth direction D4 of the central portions of corresponding ones of the active patterns 105 disposed in the first direction D1.

The second sacrificial pattern 220 may include an oxide, e.g., silicon oxide.

Figure 36:
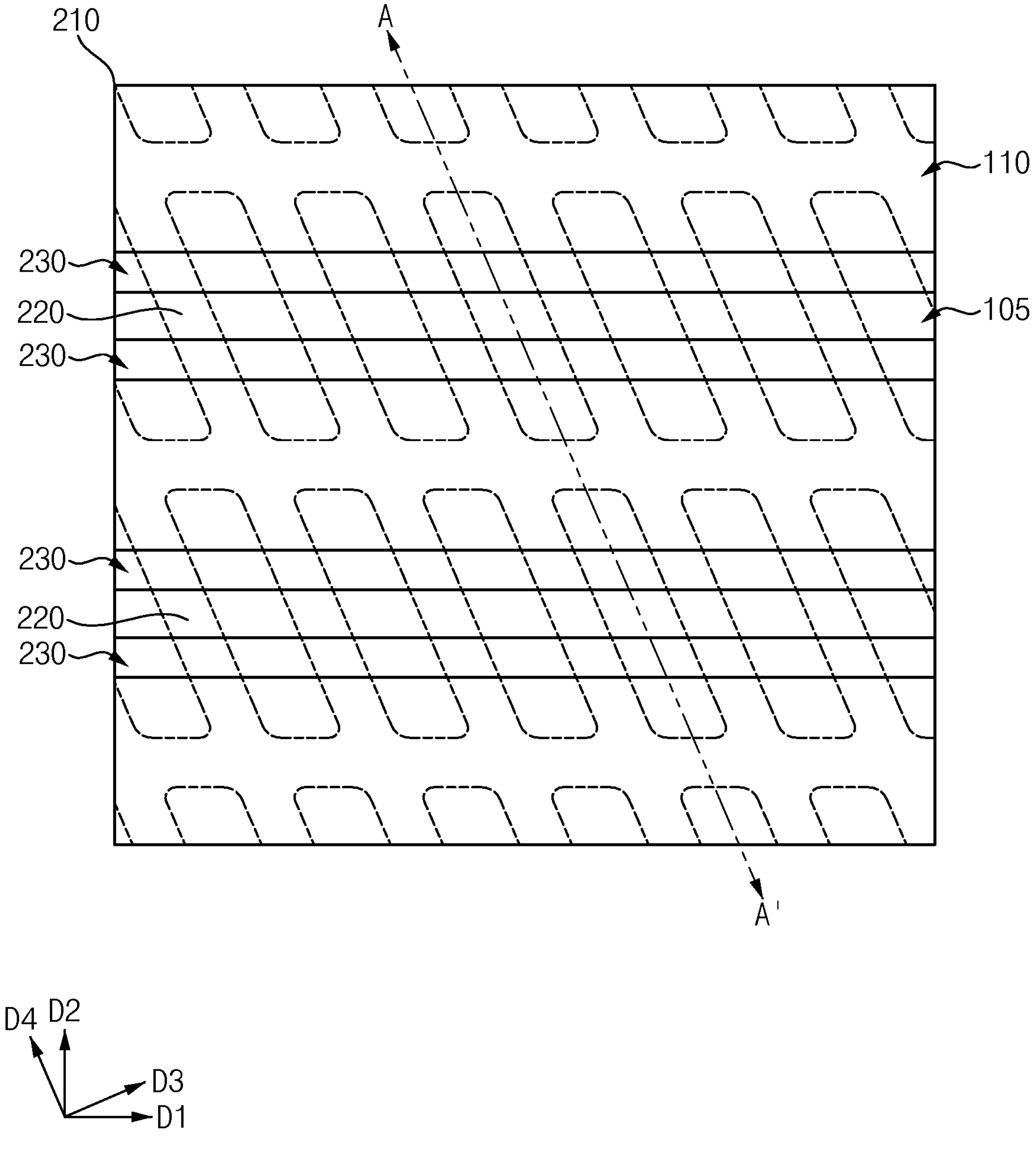
Figure 37:
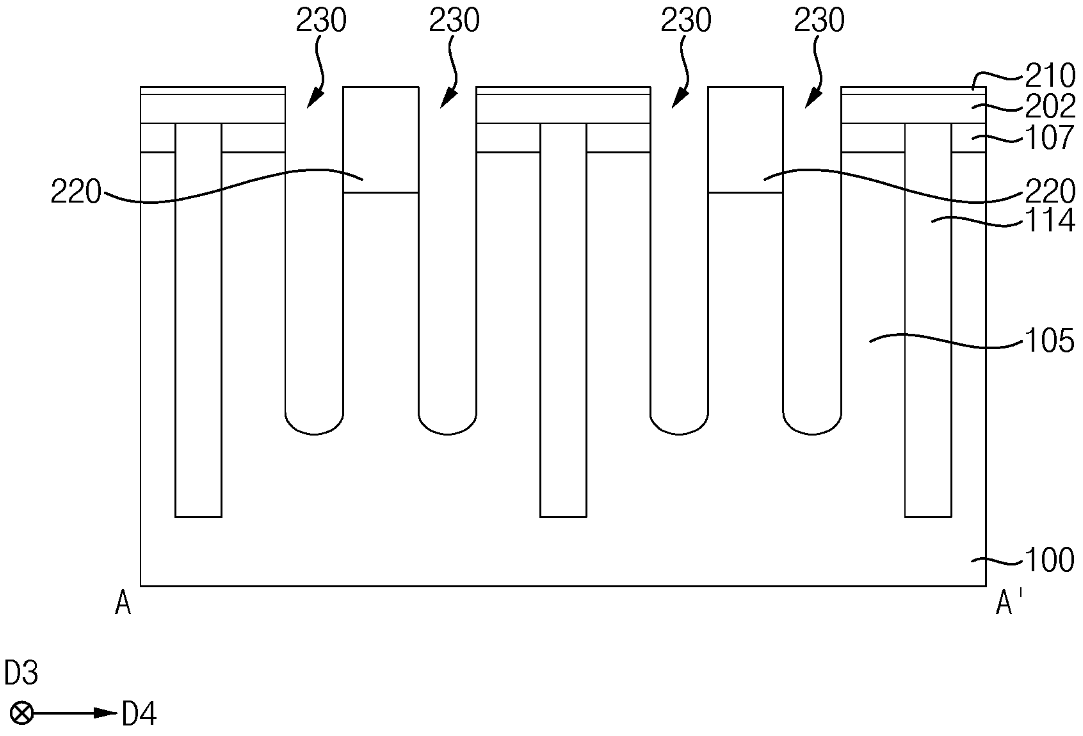

Referring to FIGS. 36 and 37, the third and fourth pads 202 and 210, the impurity region 107 and the active pattern 105 may partially be removed by an etching process to form a fifth recess 230.

In example embodiments, the fifth recess 230 may extend in the first direction D1, and a plurality of fifth recesses 230 may be spaced apart from each other in the second direction D2. A bottom of each of the fifth recesses 230 may be higher than a bottom surface of the isolation structure 110.

In example embodiments, two fifth recesses 230 spaced apart from each other in the second direction D2 may be formed in each of the active patterns 105. Each of the fifth recesses 230 may extend through a lateral portion of the second sacrificial pattern 220. That is, opposite lateral portions in the second direction D2 of the second sacrificial pattern 220, which may extend in the first direction D1, may be removed by the fifth recesses 230, respectively, and thus opposite sidewalls of the second sacrificial pattern 220 in the second direction D2 may be defined by corresponding fifth recesses 230, respectively.

Hereinafter, a portion of the active pattern 105 extending in the fourth direction D4, which may be disposed between the fifth recesses 230, may be referred to as a central portion of the active pattern 105, and a portion of the active pattern 105, which may be disposed between each of the fifth recesses 230 and the second isolation pattern 114 may be referred to as an end portion of the active pattern 105.

Figure 38:
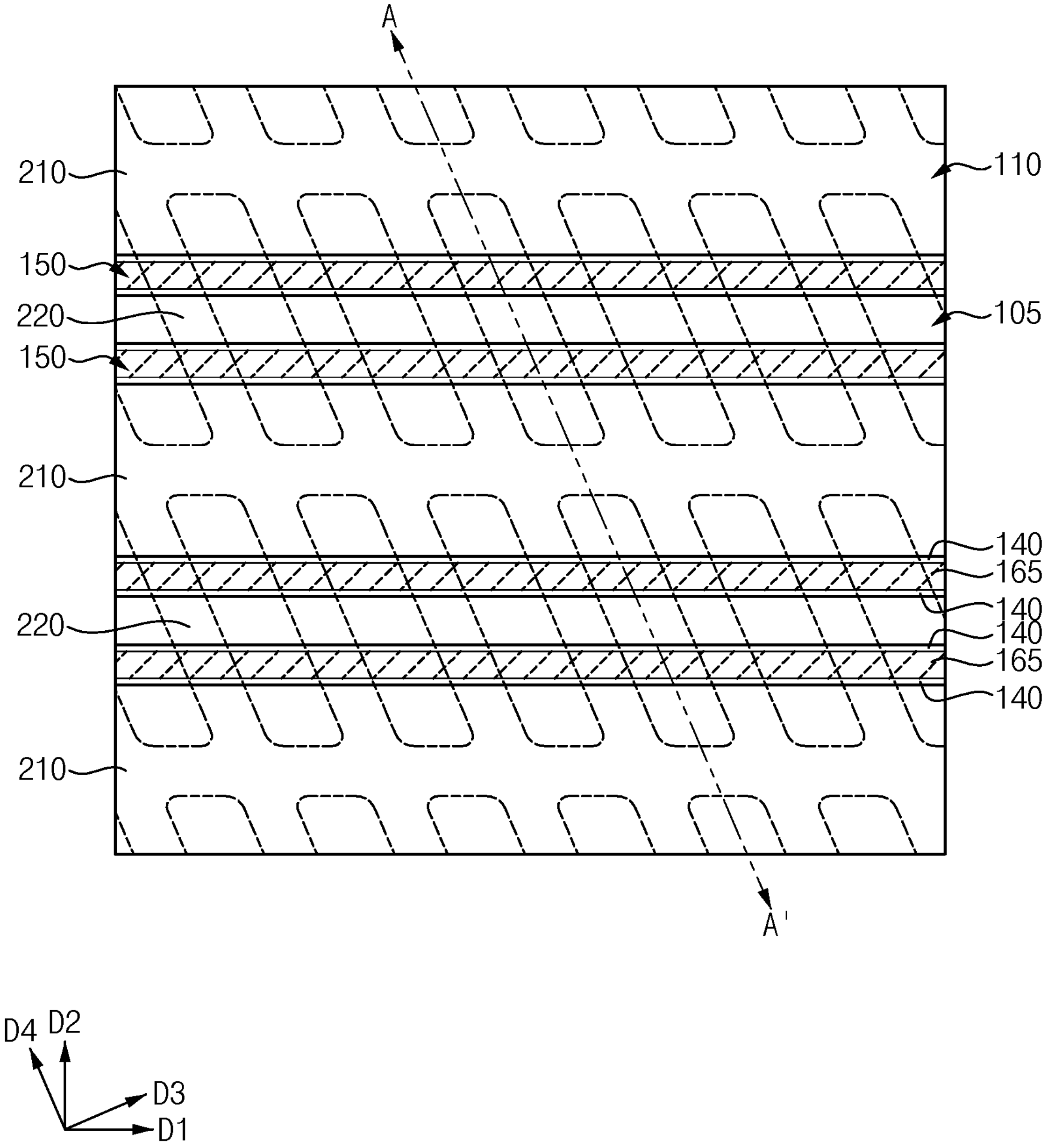
Figure 39:
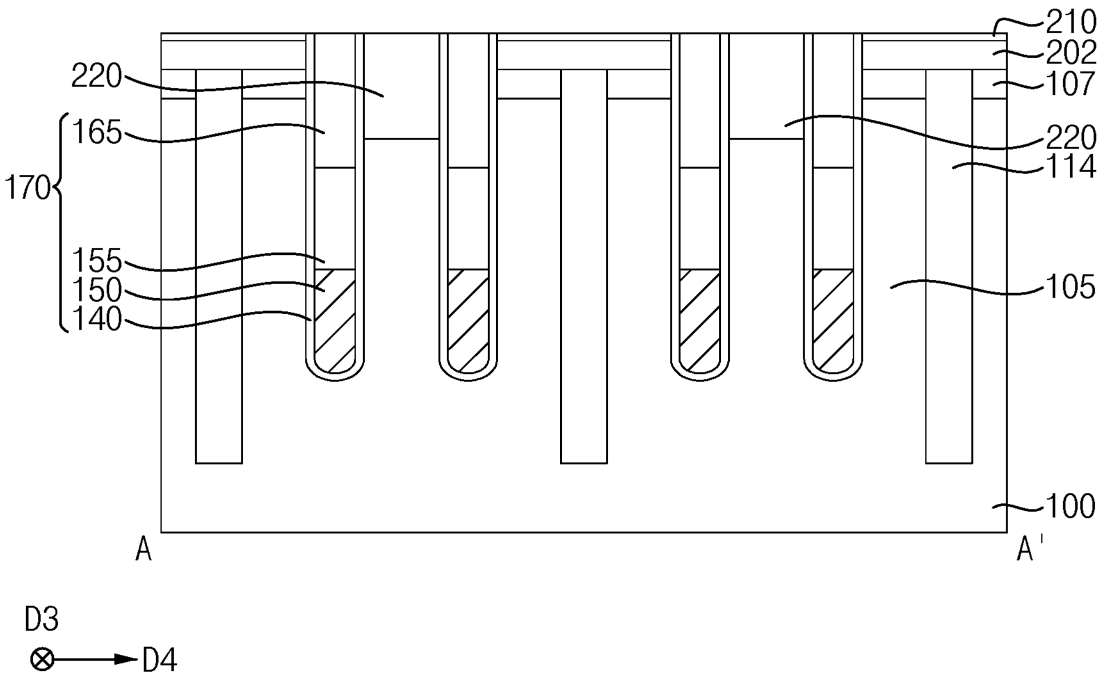

Referring to FIGS. 38 and 39, processes substantially the same as or similar to those illustrated with reference to FIGS. 9 and 10 may be performed to form the gate insulation pattern 140, the first conductive pattern 150 and the second conductive pattern 155 in the fifth recess 230.

Processes substantially the same as or similar to those illustrated with reference to FIG. 1 may be performed to form the first capping layer 160 on the second conductive pattern 155, the gate insulation pattern 140 and the fourth pad 210 to fill an upper portion of the fifth recess 230.

The planarization process may be performed on the first capping layer 160 until an upper surface of the fourth pad 210 is exposed to form the first capping pattern 165 in the upper portion of the fifth recess 230, and thus the gate structure 170 may be formed in the fifth recess 230.

Figure 40:
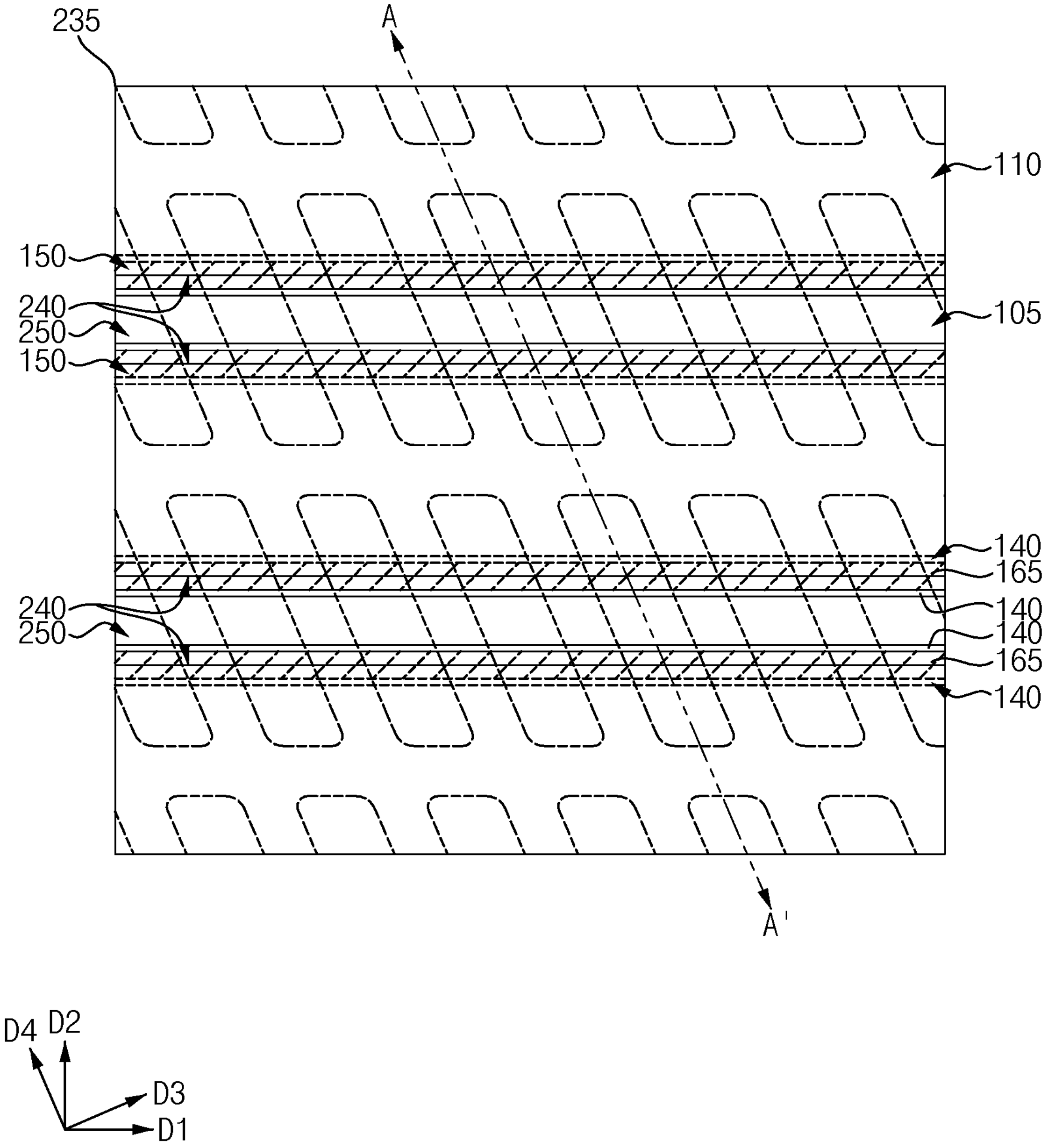
Figure 41:
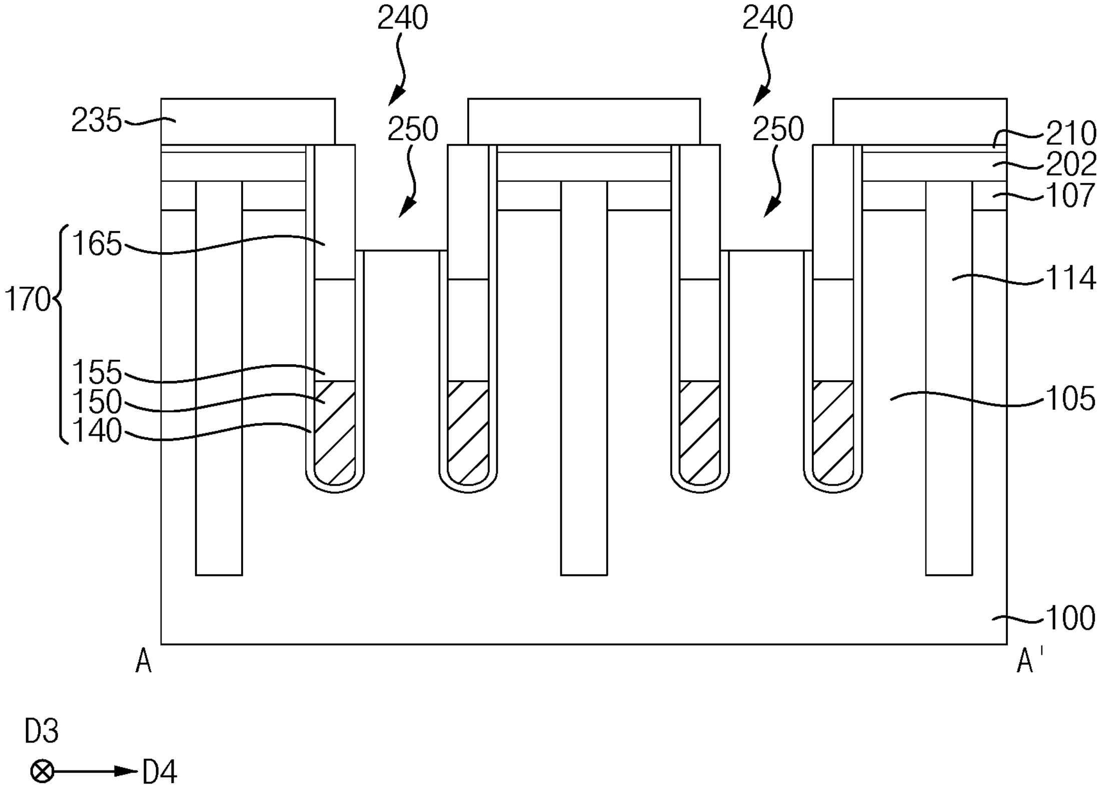

Referring to FIGS. 40 and 41, a fourth mask 235 including an eighth opening 240 may be formed on the fourth pad 210, the gate structure 170 and the second sacrificial pattern 220, and the second sacrificial pattern 220 may be etched by performing an etching process using the fourth mask 235 as an etching mask to form a ninth opening 250 exposing an upper surface of the active pattern 105.

The fourth mask 235 may include, e.g., a spin-on-hardmask (SOH) or an amorphous carbon layer (ACL).

In example embodiments, the eighth opening 240 may extend in the first direction D1, and a plurality of the eighth openings 240 may be spaced apart from each other in the second direction D2. Each of the eighth openings 240 may overlap the central portions of corresponding ones of the active patterns 105 disposed in the first direction D1 in the vertical direction, and may have a width in the second direction D2 greater than a width in the second direction D2 of the central portion of each of the corresponding ones of the active pattern 105.

Each of the eighth openings 240 may expose an upper surface of a portion of the second sacrificial pattern 220 on the central portion of each of the corresponding ones of the active patterns 105 and an upper surface of a portion of the gate insulation pattern 140 adjacent thereto in a second direction D2, and may partially expose a portion of the first capping pattern 165.

By the etching process, the second sacrificial pattern 220 which may include an oxide, e.g., silicon oxide and an upper portion of the gate insulation pattern 140 adjacent thereto in the second direction D2 may be removed, and the first capping pattern 165 which may include a nitride, e.g., silicon nitride may not be removed. Accordingly, a width of the ninth opening 250 in the second direction D2 or the fourth direction D4 may be smaller than a width of the eighth opening 240 in the second direction D2 or fourth direction D4.

Figure 42:
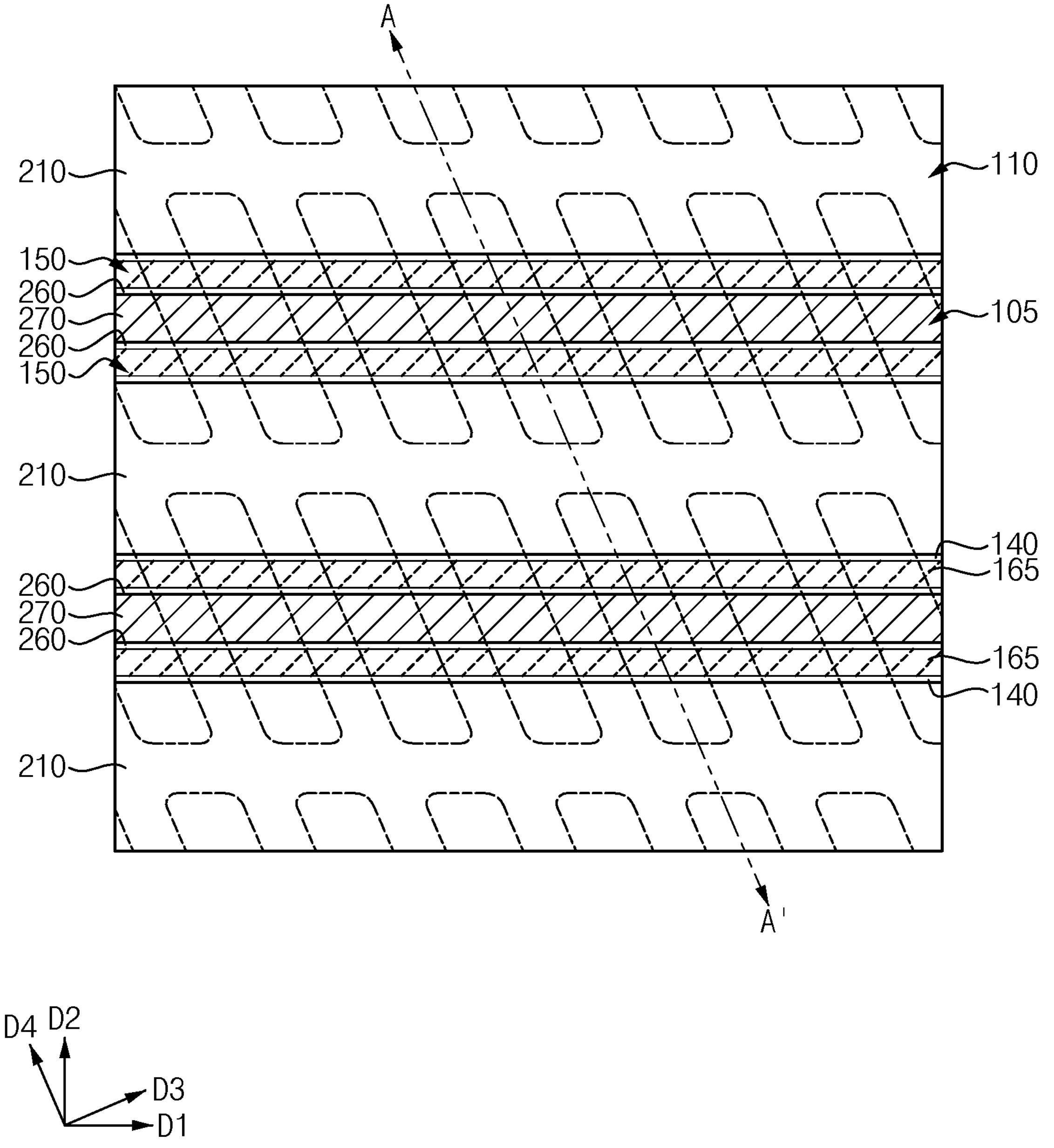
Figure 43:
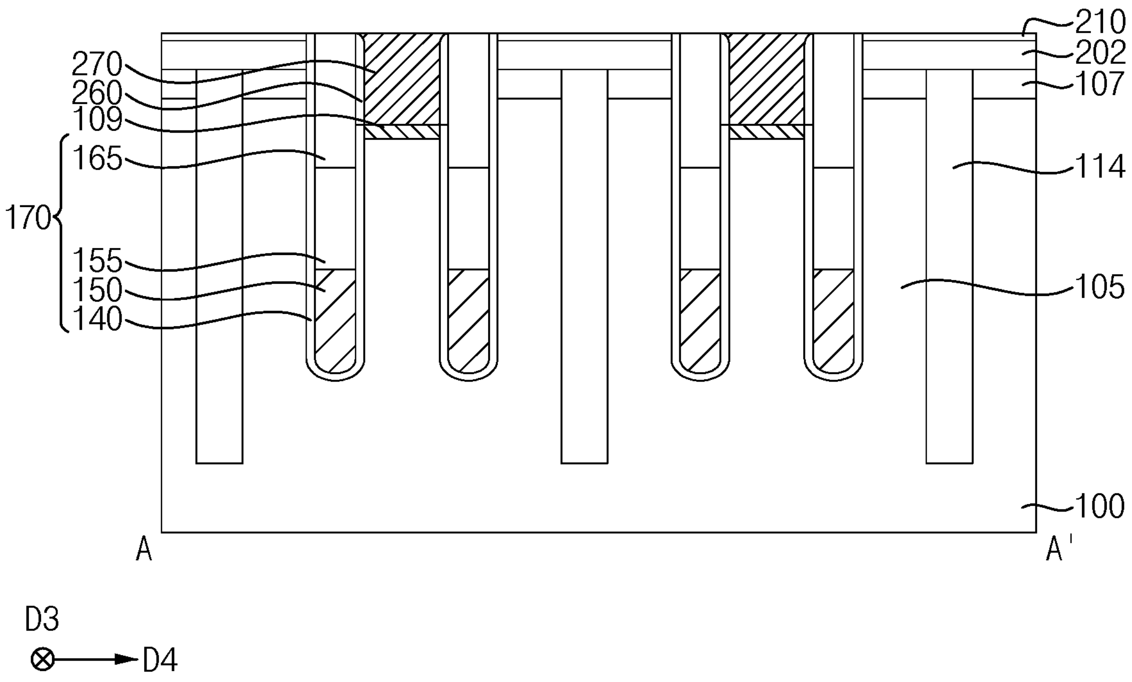

Referring to FIGS. 42 and 43, the fourth mask 235 may be removed by, for example, an ashing and/or a stripping process, and the first ohmic contact pattern 109 may be formed on the upper surface of the active pattern 105 exposed by the ninth opening 250.

The lower spacer 260 may be formed on a sidewall of the ninth opening 250, and the second conductive filling pattern 270 may be formed on the first ohmic contact pattern 109 to fill a remaining portion of the ninth opening 250.

The lower spacer 260 may include an insulating nitride, e.g., silicon nitride. In some embodiments, the lower spacer 260 may not be formed. In such embodiments, when the lower spacer 260 is not formed, the second conductive filling pattern 270 may contact the first capping pattern 165.

Each of the lower spacer 260 and the second conductive filling pattern 270 may extend in the first direction D1. In example embodiments, and a plurality of lower spacers 260 may be spaced apart from each other in the second direction D2, and a plurality of second conductive filling patterns 270 may be spaced apart from each other in the second direction D2. Each of opposite sidewalls of each of the second conductive filling patterns 270 in the second direction D2 may be covered by the lower spacer 260, and the width of each of the second conductive filling patterns 270 in the second direction D2 may be adjusted according to a thickness of the lower spacer 260.

Referring back to FIG. 29A, processes substantially the same as or similar to those illustrated with reference to FIGS. 17 to 28 and FIGS. 1 to 4 may be performed to complete the fabrication of the semiconductor device.

As illustrated above, the third and fourth pads 202 and 210 may be formed on the active pattern 105, and the second sacrificial pattern 220 may be formed to extend through the upper portion of the active pattern 105 and third and fourth pads 202 and 210. The fifth recesses 230 may be formed at opposite lateral portions of the second sacrificial pattern 220 in the second direction D2, respectively, and the gate structures 170 may be formed in the fifth recesses 230, respectively. The second sacrificial pattern 220 may be removed to form the ninth opening 250, the second conductive filling pattern 270 may be formed in the ninth opening 250, and the bit line structure 355 may be formed to contact the second conductive filling pattern 270 to be electrically connected to the active pattern 105 through the second conductive filling pattern 270.

The fifth recesses 230, in which the gate structures 170 may be respectively formed, may extend through the opposite lateral portions, respectively, in the second direction D2 of the second sacrificial pattern 220, which may be replaced by the second conductive filling pattern 270, and thus the width of the second conductive filling pattern 270 in the second direction D2 may be defined by the fifth recesses 230. Accordingly, the second conductive filling pattern 270 may be self-aligned to the gate structures 170 in the fifth recesses 230, respectively, so that misalignment between the gate structure 170 and the second conductive filling pattern 270 may not occur. As a result, the second conductive filling pattern 270 may be easily formed at a desired location with respect to the gate structure 170.

In addition, the lower spacer 260 may be formed on the sidewall of the ninth opening 250, which may be formed by removing the second sacrificial pattern 220, and a distance between the second conductive filling pattern 270 and the gate structure 170 may be adjusted according to the thickness of the lower spacer 260.

In the method of manufacturing the semiconductor device illustrated with reference to FIGS. 5 to 28 and FIGS. 1 to 4, the second sacrificial pattern 220 may be formed, the gate structures 170 may be formed to extend through opposite lateral portions thereof, the second sacrificial pattern 220 may be removed to form the ninth opening 250, and the second conductive filling pattern 270 may be formed in the ninth opening 250, however, aspects of the inventive concept may not be limited thereto.

For example, contrary to FIG. 35 and the related description thereof, the second conductive filling pattern 270, instead of the second sacrificial pattern 220, may be formed, and the gate structures 170 may be formed to extend through opposite lateral portions, respectively, of the second conductive filling pattern 270. In this case, as shown in FIG. 29B, since an etching processing to remove the second sacrificial pattern 220 as illustrated in FIG. 41, each of the opposite sidewalls of the second conductive filling pattern 270 in the second direction D2 may contact the outer wall of the gate insulation pattern 140 instead of the sidewall of the first capping pattern 165 in the gate structure 170.

FIGS. 44 to 55 are plan views and cross-sectional views illustrating a method of manufacturing a semiconductor device in accordance with example embodiments. Specifically, FIGS. 44, 46, 49, 50 and 54 are the plan views, and FIGS. 45, 47, 48, 50, 51, 53 and 55 are cross-sectional views taken along lines A-A' of corresponding plan views, respectively.

This method may include processes substantially the same as or similar to those illustrated with reference to FIGS. 5 to 28 and FIGS. 1 to 4, and repeated explanations thereof are omitted herein.

Figure 44:
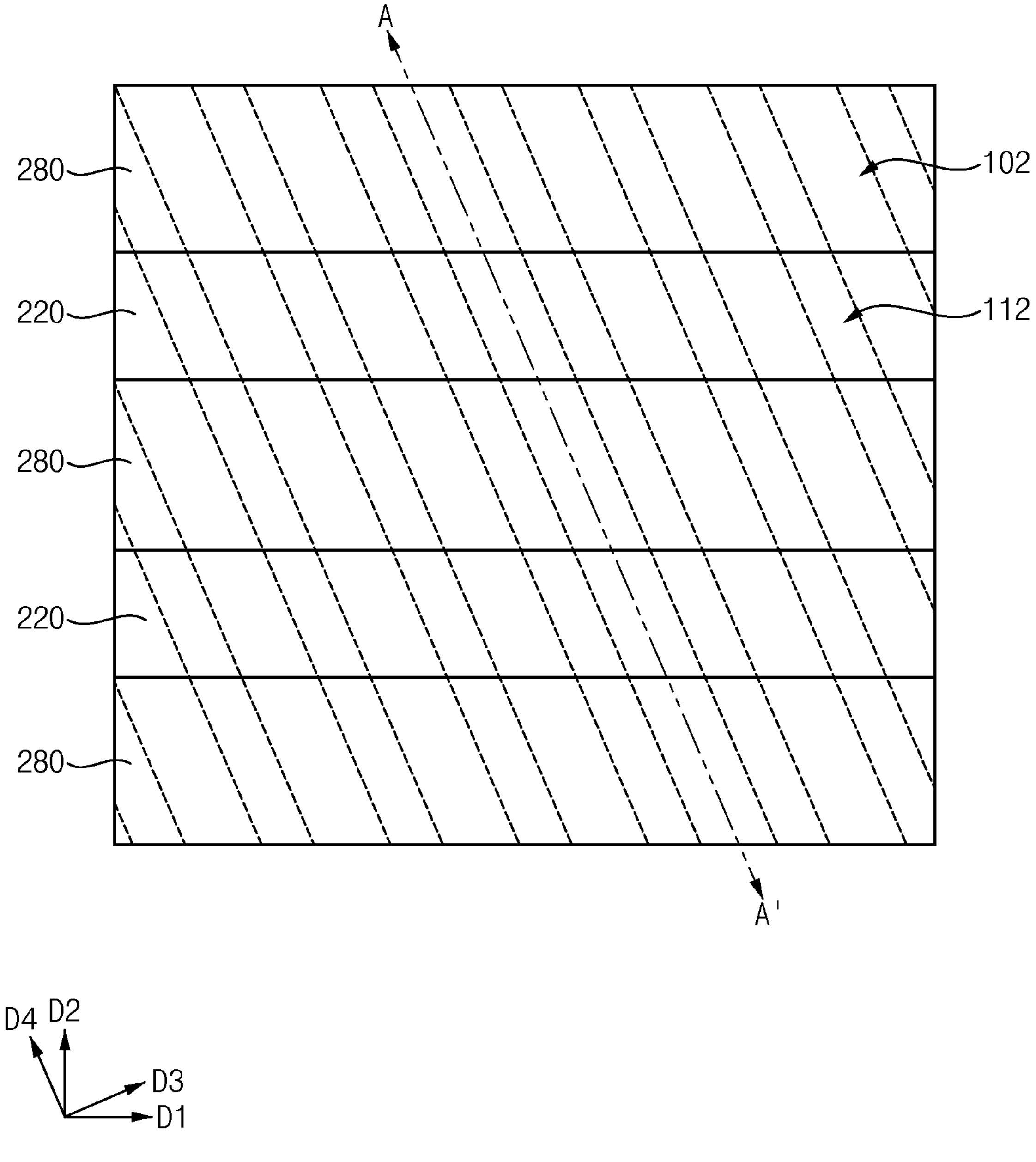
FIGS. 44 to 55 are plan views and cross-sectional views illustrating a method of manufacturing a semiconductor device in accordance with example embodiments.
Figure 45:
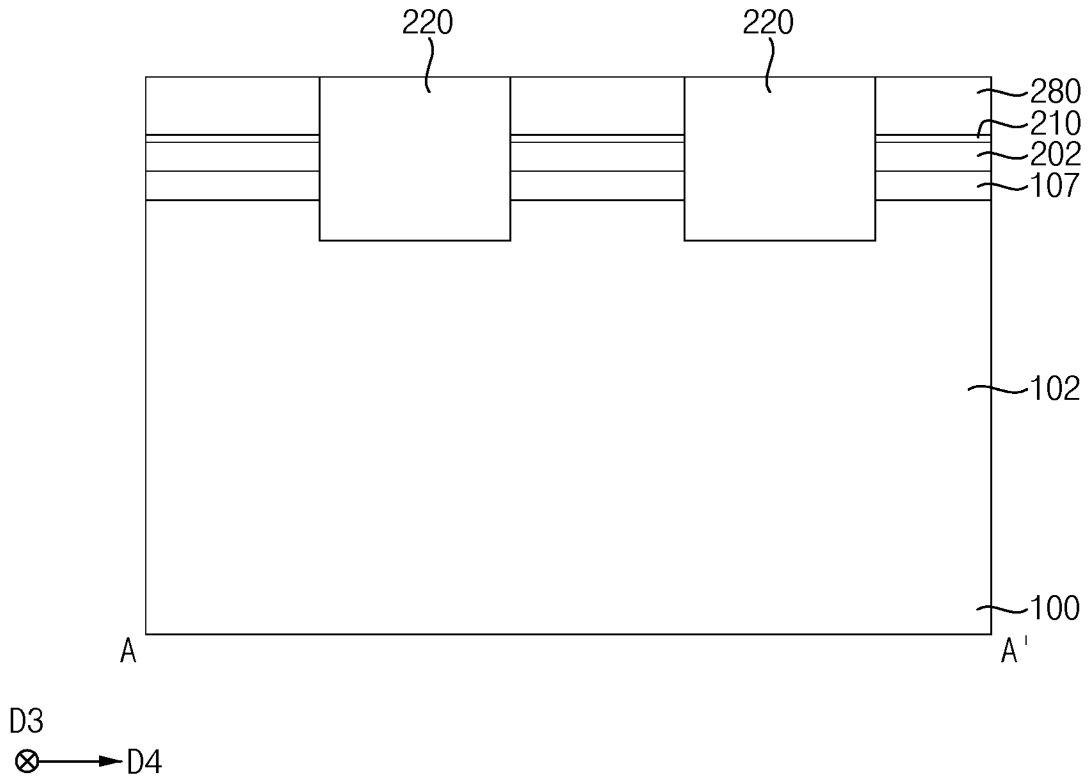

Referring to FIGS. 44 and 45, the first isolation pattern 112 and the preliminary active pattern 102 may be formed, and the impurity region 107 may be formed at the upper portion of the preliminary active pattern 102.

The third and fourth pads 202 and 210 may sequentially be formed on the preliminary active pattern 102 and the first isolation pattern 112, and a third sacrificial layer 280 may be formed on the fourth pad 210.

The third sacrificial layer 280 may include an oxide, e.g., silicon oxide.

The third sacrificial layer 280, the third and fourth pads 202 and 210, the impurity region 107, and a portion of the preliminary active pattern 102 under the impurity region 107 may be partially removed by an etching process to form a sixth recess, and the second sacrificial pattern 220 may be formed to fill the sixth recess.

Figure 46:
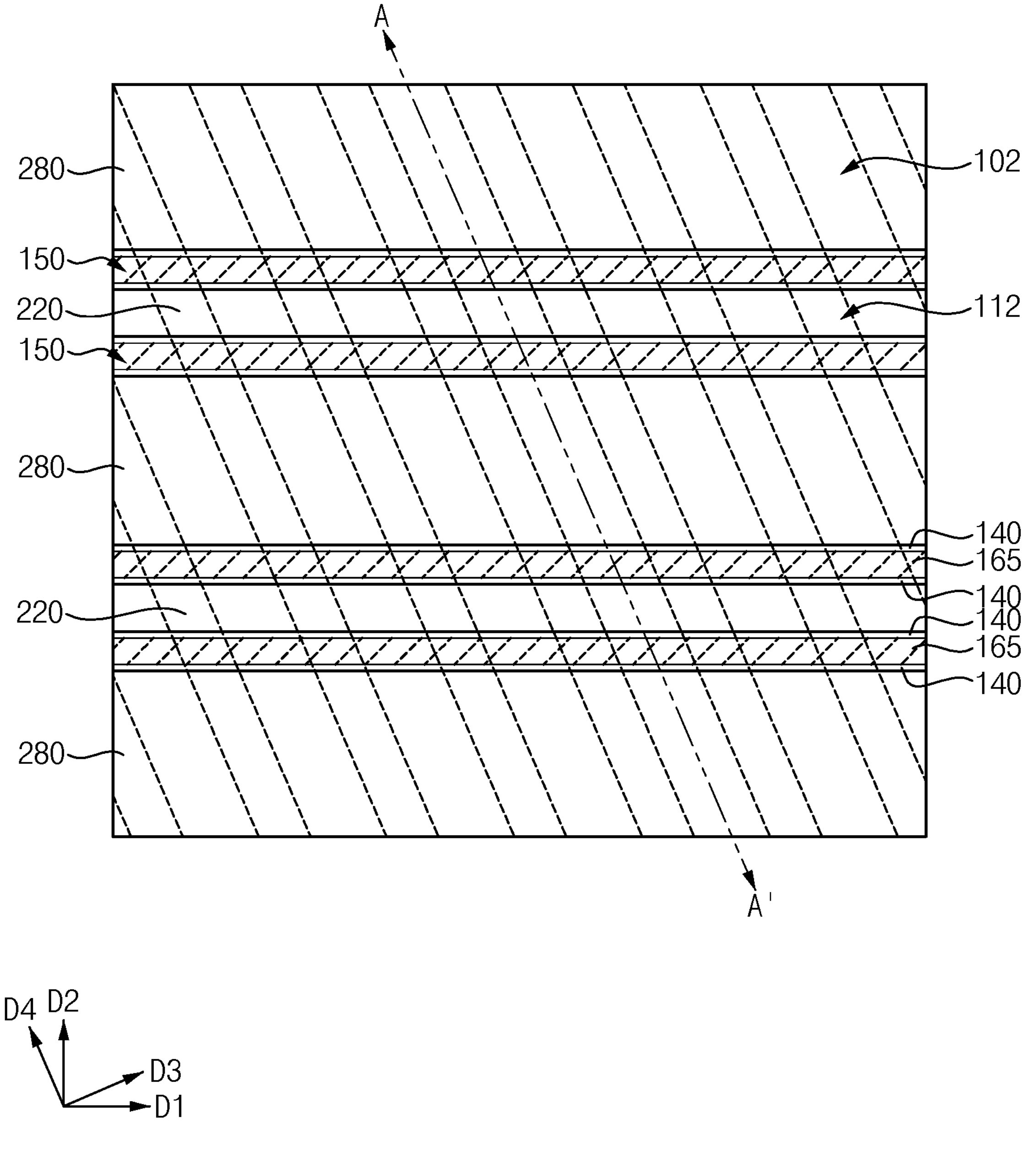
Figure 47:
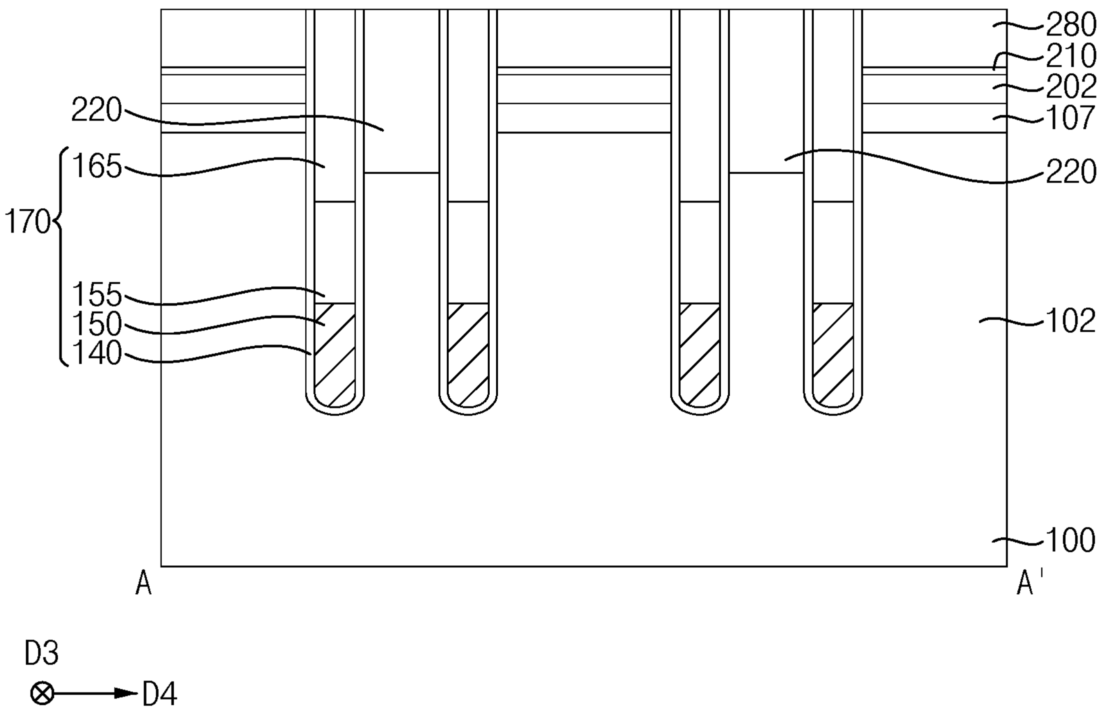

Referring to FIGS. 46 and 47, processes substantially the same as or similar to those illustrated with reference to FIGS. 36 to 39 may be performed.

Thus, the third sacrificial layer 280, the third and fourth pads 202 and 210, the impurity region 107 and the preliminary active pattern 102 may be partially removed by an etching process to form the fifth recess 230, and the gate structure 170 may be formed in the fifth recess 230. Each of the fifth recesses 230 may extend through a lateral portion of the second sacrificial pattern 220. That is, opposite lateral portions in the second direction D2 of the second sacrificial pattern 220, which may extend in the first direction D1, may be removed by the fifth recesses 230, respectively, and thus opposite sidewalls of the second sacrificial pattern 220 in the second direction D2 may be defined by corresponding fifth recesses 230, respectively.

Figure 48:
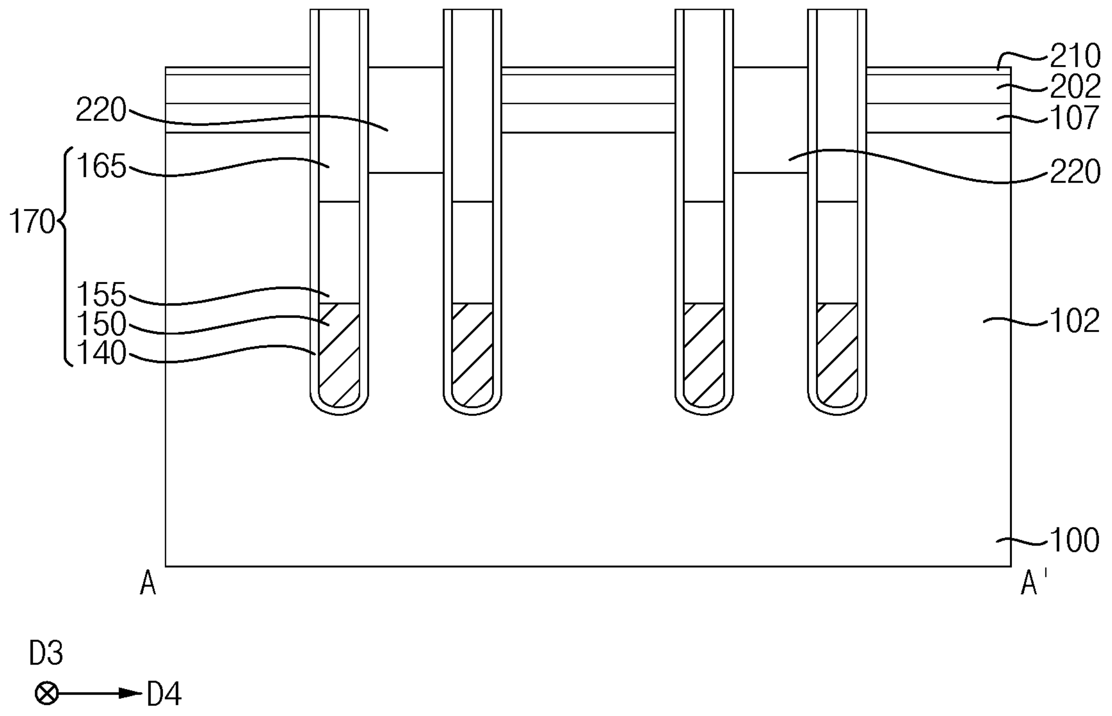

Referring to FIG. 48, the third sacrificial layer 280 may be removed through, for example, a wet etching process, and a portion of the gate insulation pattern 140 contacting the third sacrificial layer 280 may also be removed.

An upper portion of the first capping pattern 165 may be exposed in the vertical direction from an upper surface of the fourth pad 210.

Figure 49:
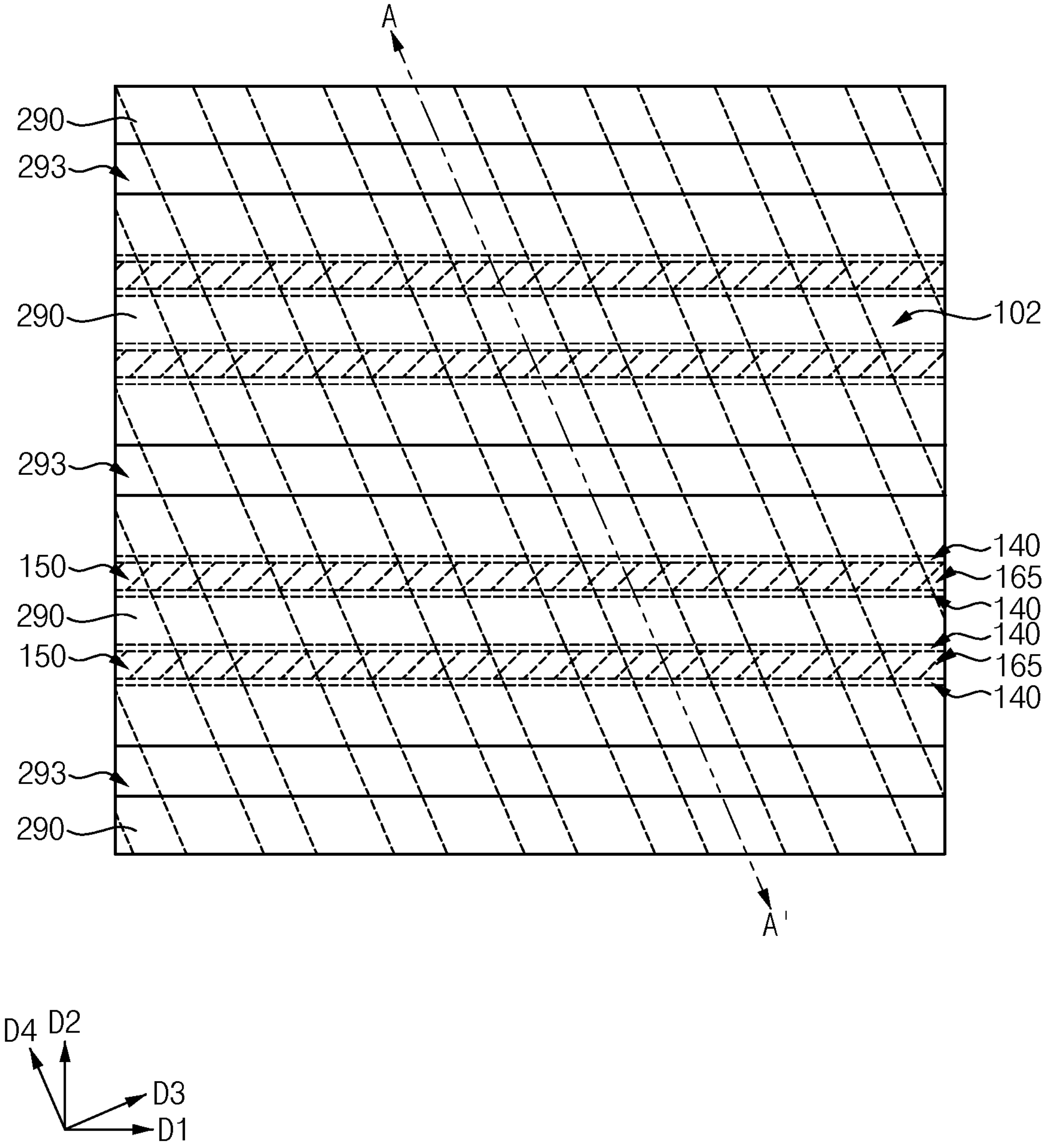
Figure 50:
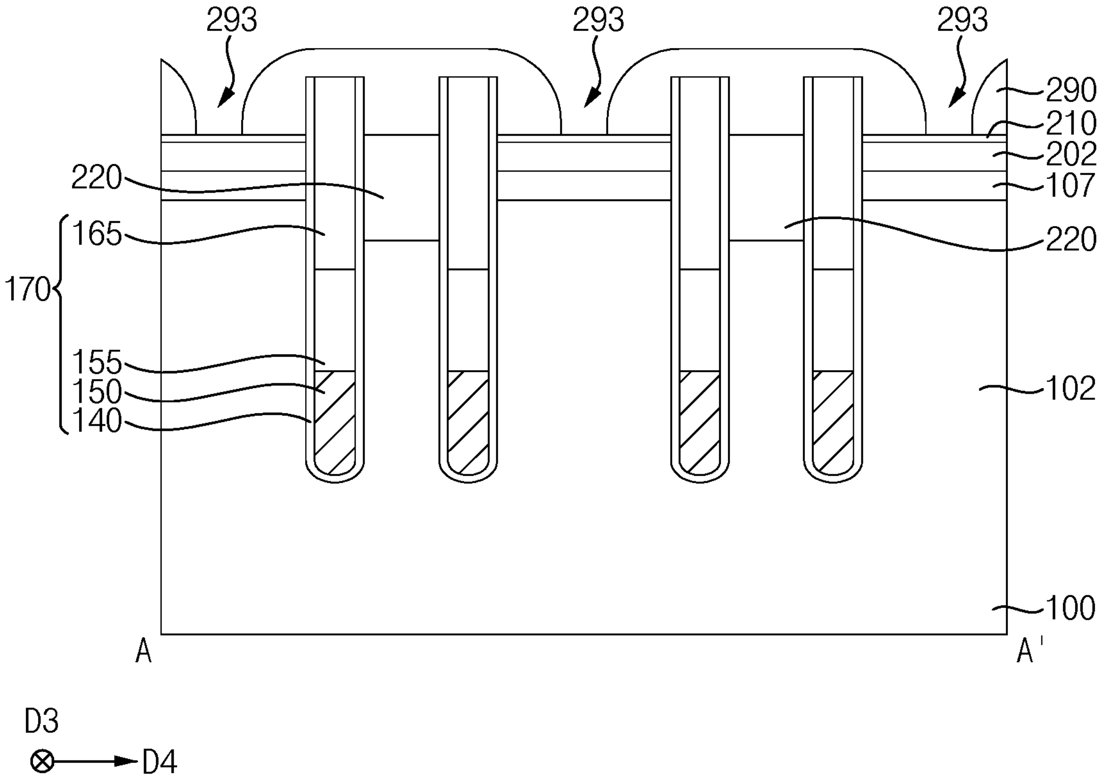

Referring to FIGS. 49 and 50, a sacrificial spacer 290 may be formed to cover upper surfaces of the upper portions of ones of the first capping patterns 165 neighboring in the fourth direction D4, upper surfaces of the gate insulation patterns 140, which may be formed on opposite sidewalls of corresponding ones of the first capping patterns 165, respectively, and an upper surface of the sacrificial pattern 220, which may be formed between the ones of the first capping patterns 165.

In example embodiments, the sacrificial spacer 290 may be formed by forming a sacrificial spacer layer on the fourth pad 210, the second sacrificial pattern 220, the exposed upper portion of the first capping pattern 165 and the gate insulation pattern 140, and anisotropically etching the sacrificial spacer layer.

In example embodiments, the sacrificial spacer 290 may extend in the first direction D1, and a plurality of sacrificial spacers 290 may be spaced apart from each other in the second direction D2. A tenth opening 293 exposing an upper surface of the fourth pad 210 may be formed between the sacrificial spacers 290. The sacrificial spacer 290 may include an oxide, e.g., silicon oxide.

Figure 51:
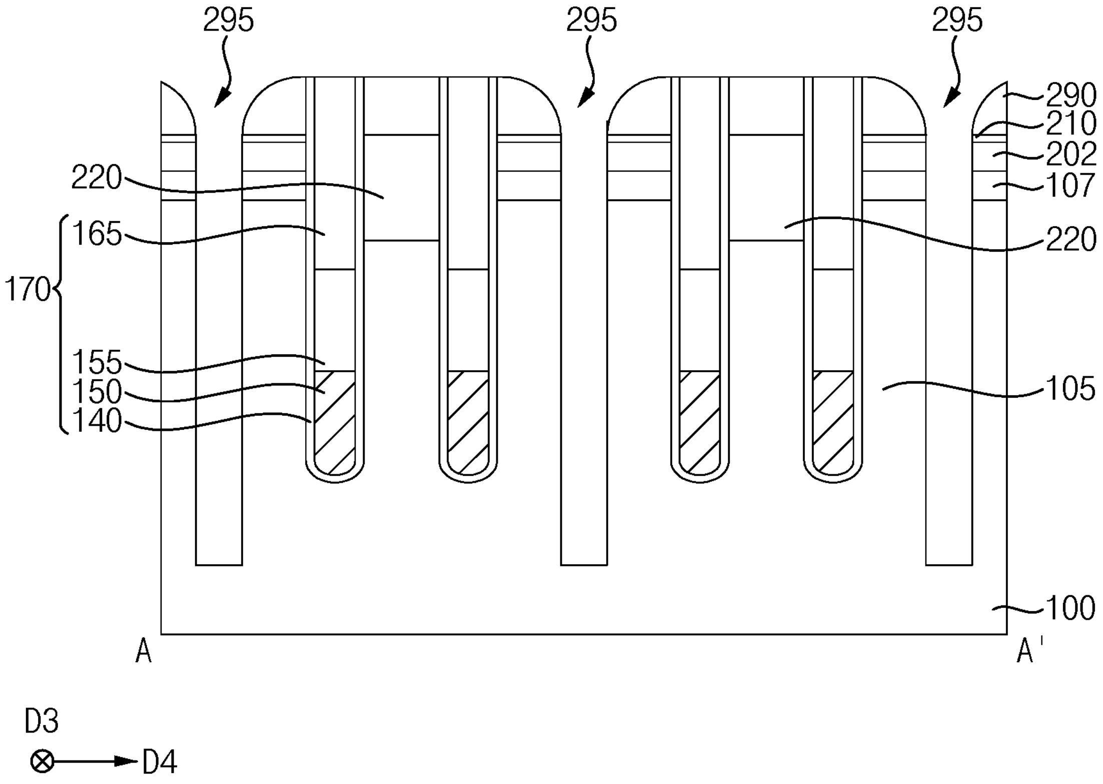

Referring to FIG. 51, the third and fourth pads 202 and 210, the impurity region 107 and the preliminary active pattern 102 may be partially etched by an etching process using the sacrificial spacer 290 as an etching mask to form a seventh recess 295.

In example embodiments, the seventh recess 295 may extend in the first direction D1, and a plurality of seventh recesses 295 may be spaced apart from each other in the second direction D2. As the seventh recess 295 is formed, the preliminary active pattern 102 extending in the fourth direction D4 may be divided into a plurality of active patterns 105 spaced apart from each other in the fourth direction D4.

By the etching process, an upper portion of the sacrificial spacer 290 may also be partially removed to expose an upper surface of the first capping pattern 165.

Figure 52:
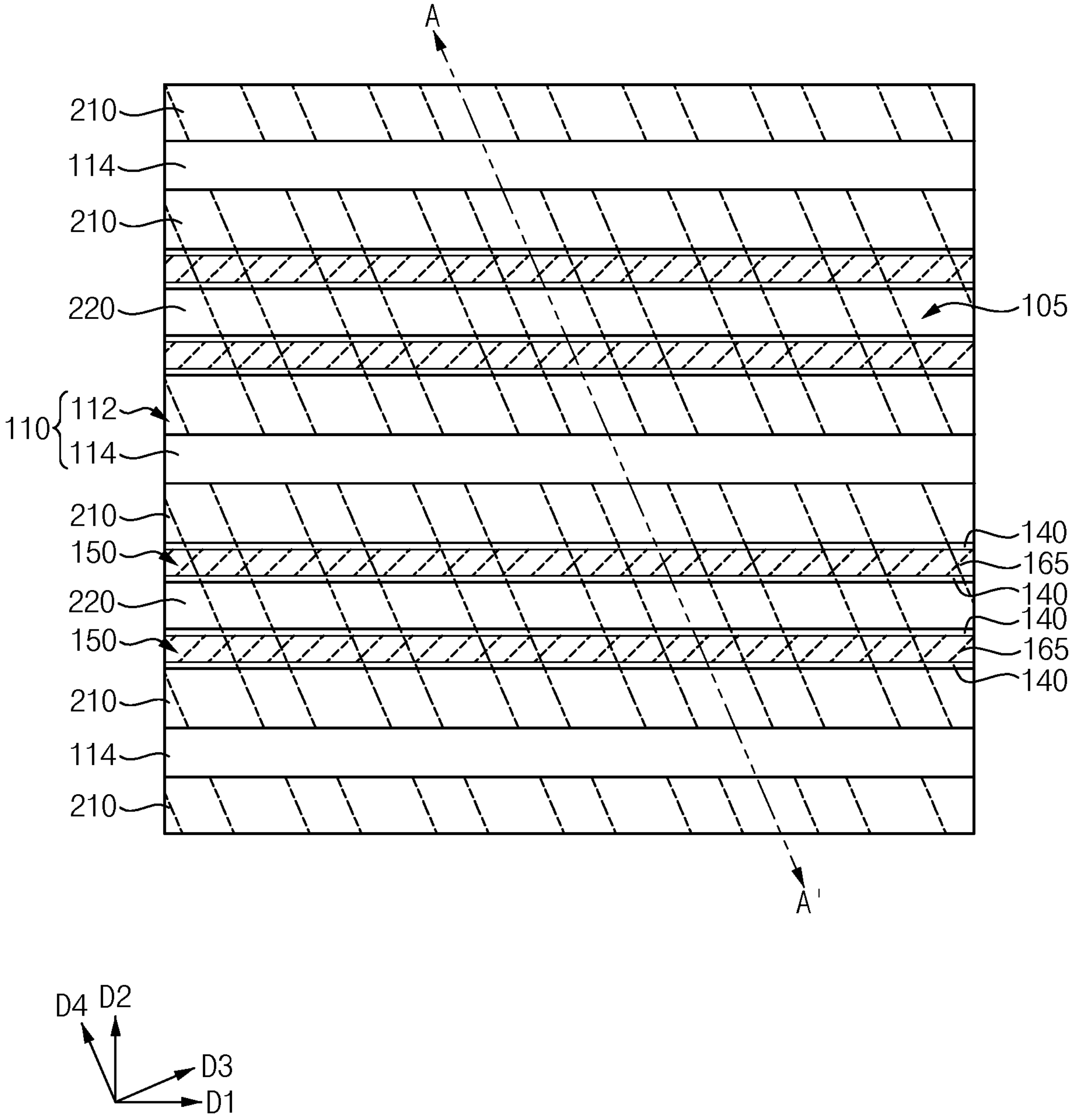
Figure 53:
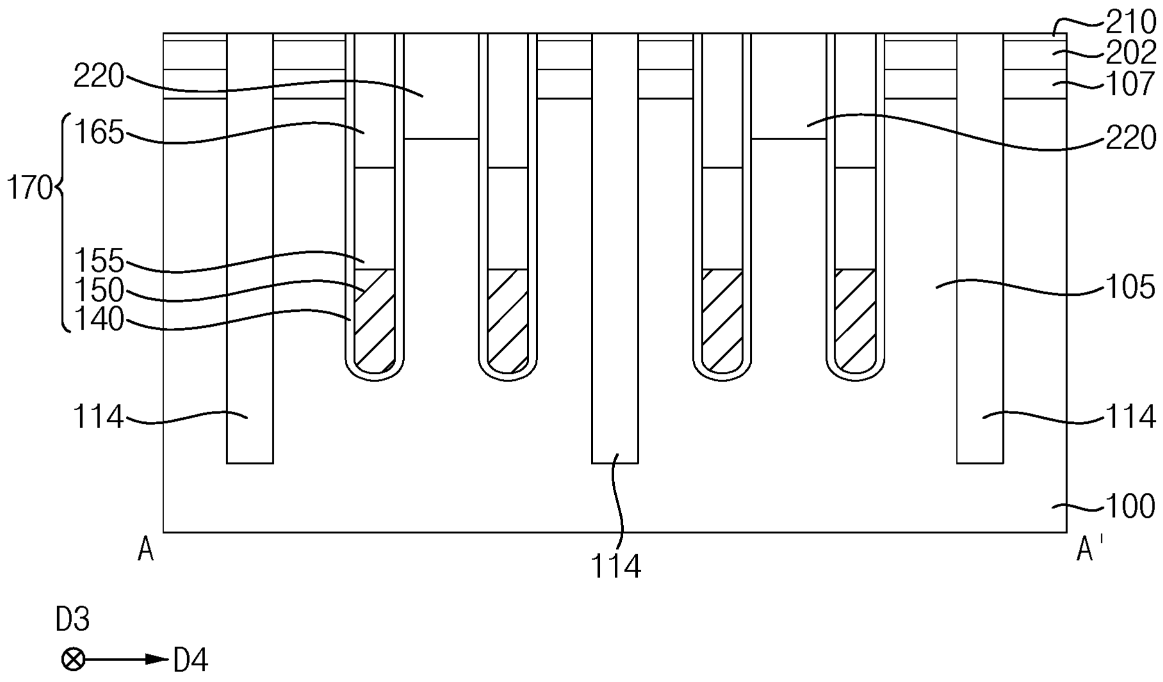

Referring to FIGS. 52 and 53, the second isolation pattern 114 may be formed in the seventh recess 295, and thus the isolation structure 110, which may include the first and second isolation patterns 112 and 114, may be formed.

A planarization process may be performed to remove the sacrificial spacer 290 and an upper portion of the first capping pattern 165 until the upper surface of the fourth pad 210 and the upper surface of the second sacrificial pattern 220 are exposed.

Figure 54:
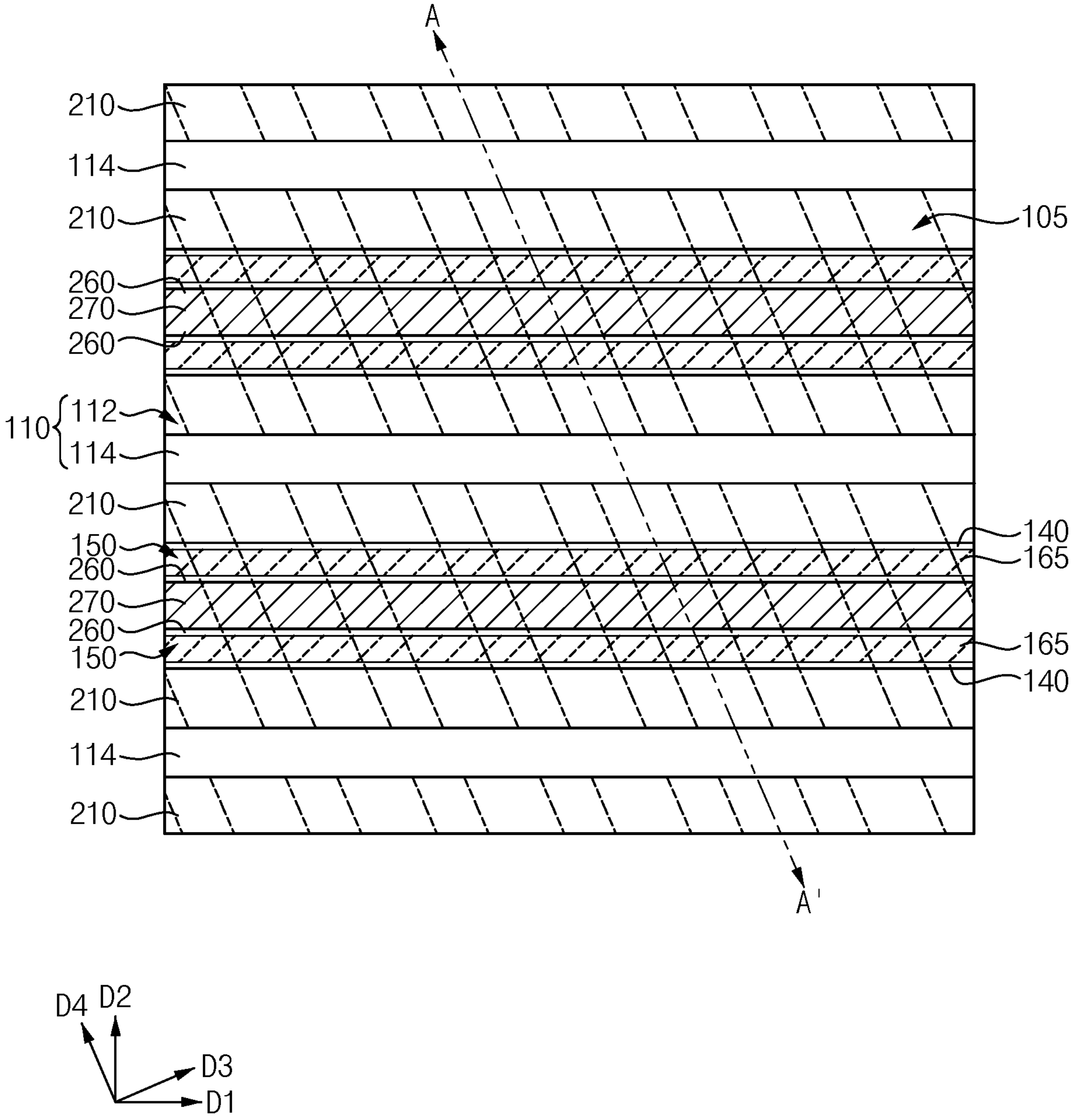
Figure 55:
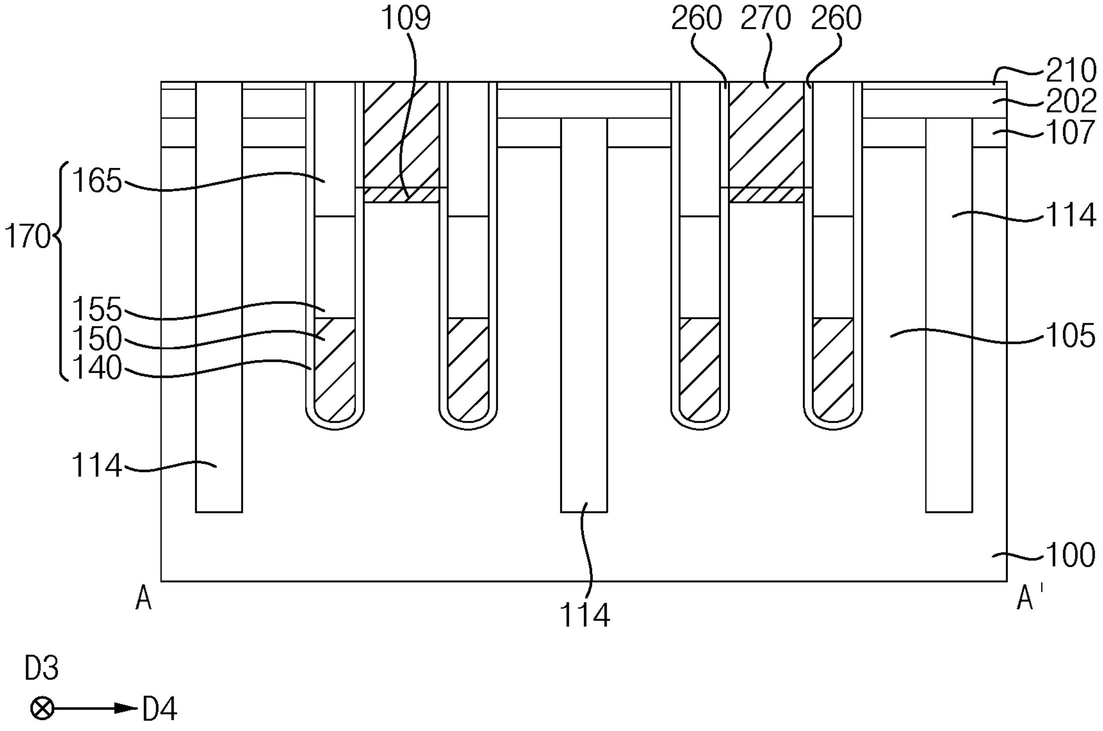

Referring to FIGS. 54 and 55, processes substantially the same as or similar to those illustrated with reference to FIGS. 40 and 41 may be performed to form the ninth opening 250 by etching the second sacrificial pattern 220, and the first ohmic contact pattern 109, the lower spacer 260 and a second conductive filling pattern 270 may be formed in the ninth opening 250.

Processes substantially the same as or similar to those illustrated with reference to FIGS. 17 to 28 and FIGS. 1 to 4 may be performed to complete the fabrication of the semiconductor device.

As illustrated above, the preliminary active pattern 102 extending in the fourth direction D4 may be formed, the third and fourth pads 202 and 210 and the third sacrificial layer 280 may be formed on the preliminary active pattern 102. The second sacrificial pattern 220 extending through the third sacrificial layer 280, the third and fourth pads 202 and 210 and the upper portion of the preliminary active pattern 102, and the gate structure 170 extending through opposite lateral portions of the second sacrificial pattern 220 in the second direction D2 may be formed.

The third sacrificial layer 280 may be removed to expose upper portions of the gate structures 170, and the sacrificial spacers 290 may be formed to cover the exposed upper portions of the gate structures 170 and the second sacrificial pattern 220 therebetween. The etching process may be performed using the sacrificial spacers 290 as an etching mask to form the seventh recess 295, and the preliminary active pattern 102 extending in the fourth direction D4 may be transformed into a plurality of active patterns 105 spaced apart from each other in the fourth direction D4.

The sacrificial spacer 290 may be formed by forming the sacrificial spacer layer to cover the fourth pad 210, the second sacrificial pattern 220 and the exposed upper portion of the gate structure 170, and performing the anisotropic etching process on the sacrificial spacer layer, so that the sacrificial spacer 290 may have a constant width in the second direction D2 from the exposed upper portion of the gate structure 170. Accordingly, the seventh recess 295, which may be formed by the etching process using the sacrificial spacer 290 as the etching mask, may be formed at a given distance from the gate structure 170, and a length of the active pattern 105 in the second direction D2 or fourth direction D4, which may be defined by the seventh recesses 295, may have a constant value from a sidewall of the gate structure 170 in the second direction D2. That is, the active pattern 105 may be self-aligned to the gate structure 170.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of aspects of the present inventive concept. Accordingly, all such modifications are intended to be included within the scope of aspects of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:

an active pattern on a substrate;

a gate structure extending through an upper portion of the active pattern, the gate structure having an upper surface higher than an upper surface of the active pattern;

a conductive filling pattern including:

a lower portion on the active pattern, the lower portion including a side surface contacting an upper sidewall of the gate structure; and an upper portion on the lower portion, the upper portion having a width greater than a width of the lower portion; and a bit line structure on the conductive filling pattern, wherein the side surface of the lower portion of the conductive filling pattern is coplanar with the upper sidewall of the gate structure.

2. The semiconductor device according to claim 1, wherein the gate structure extends in a first direction substantially parallel to an upper surface of the substrate, and the bit line structure extends in a second direction substantially parallel to the upper surface of the substrate and substantially perpendicular to the first direction, and wherein a width in the second direction of the upper portion of the conductive filling pattern is greater than a width in the second direction of the lower portion of the conductive filling pattern.

3. The semiconductor device according to claim 2, wherein:

the active pattern extends in a fourth direction substantially parallel to the upper surface of the substrate and having an acute angle with respect to each of the first and second directions, the gate structure is one of two gate structures, the two gate structures extending through two parts, respectively, of the active pattern spaced apart from each other in the fourth direction, and the lower portion of the conductive filling pattern commonly contacts upper sidewalls of the two gate structures, the upper sidewalls facing each other.

4. The semiconductor device according to claim 3, wherein the active pattern is one of a plurality of active patterns spaced apart from each other in the first direction, and end portions of the plurality of active patterns in the fourth direction are aligned with each other in the first direction.

5. The semiconductor device according to claim 1, wherein the gate structure includes a gate electrode, a capping pattern and a gate insulation pattern, the gate electrode and the capping pattern being sequentially stacked in a vertical direction substantially perpendicular to an upper surface of the substrate, and the gate insulation pattern being disposed on sidewalls of the gate electrode and the capping pattern, wherein the lower portion of the conductive filling pattern contacts a sidewall of the capping pattern, and wherein the side surface of the lower portion of the conductive filling pattern is coplanar with the sidewall of the capping pattern.

6. The semiconductor device according to claim 1, further comprising:

a first pad on the active pattern; and a second pad on the first pad, wherein the lower portion of the conductive filling pattern extends through the first pad, and the upper portion of the conductive filling pattern extends through the second pad.

7. The semiconductor device according to claim 6, wherein the first pad includes an oxide, and the second pad includes a nitride.

8. The semiconductor device according to claim 1, further comprising an ohmic contact pattern between the conductive filling pattern and the active pattern, the ohmic contact pattern including a metal silicide.

9. The semiconductor device according to claim 1, wherein the upper portion of the conductive filling pattern extends on, and is in contact with, the upper surface of the gate structure.

10. A semiconductor device comprising:

an active pattern on a substrate;

first and second pads stacked on the active pattern in a vertical direction substantially perpendicular to an upper surface of the substrate;

a gate structure extending through an upper portion of the active pattern and the first and second pads;

a conductive filling pattern extending through portions of the upper portion of the active pattern and the first and second pads that are adjacent to the gate structure; and a bit line structure on the conductive filling pattern;

wherein the gate structure includes a gate electrode, a capping pattern and a gate insulation pattern, the gate electrode and the capping pattern being stacked in the vertical direction, and the gate insulation pattern being disposed on sidewalls of the gate electrode and the capping pattern; and wherein a top surface of the gate insulation pattern is coplanar with a top planar surface of the conductive filling pattern.

11. The semiconductor device of claim 10, wherein the top surface of the gate insulation pattern is substantially coplanar with an upper surface of the second pad.

12. The semiconductor device of claim 10, wherein an impurity region doped with impurities is formed at an upper portion of the active pattern, and wherein a lower surface of the conductive filling pattern is lower than an upper surface of the impurity region.

13. The semiconductor device according to claim 10, wherein the conductive filling pattern contacts a sidewall of the gate insulation pattern.

14. The semiconductor device according to claim 10, further comprising a spacer between and contacting a sidewall of the conductive filling pattern and a sidewall of the capping pattern.

15. The semiconductor device according to claim 10, wherein:

the gate structure extends in a first direction substantially parallel to the upper surface of the substrate, and the bit line structure extends in a second direction substantially parallel to the upper surface of the substrate and substantially perpendicular to the first direction, the active pattern extends in a fourth direction substantially parallel to the upper surface of the substrate and having an acute angle with respect to each of the first and second directions, the gate structure is one of two gate structures, the two gate structures extending through two parts, respectively, of the active pattern spaced apart from each other in the fourth direction, and the conductive filling pattern is disposed between upper sidewalls of the two gate structures, the upper sidewalls facing each other.

16. The semiconductor device according to claim 10, wherein the top surface of the gate insulation pattern is coplanar with a bottom surface of the bit line structure.

17. A semiconductor device comprising:

active patterns on a substrate;

an isolation structure on the substrate, the isolation structure covering sidewalls of the active patterns;

first and second pads stacked on the active patterns and the isolation structure in a vertical direction substantially perpendicular to an upper surface of the substrate;

gate structures each extending through upper portions of the active patterns and the isolation structure, and the first and second pads in a first direction substantially parallel to the upper surface of the substrate;

conductive filling patterns, each of the conductive filling patterns being disposed on a central portion of a corresponding one of the active patterns and the isolation structure and extending through the first and second pads;

bit line structures on the conductive filling patterns and the second pad, each of the bit line structures extending in a second direction substantially parallel to the upper surface of the substrate and substantially perpendicular to the first direction;

contact plug structures on opposite end portions, respectively, of the active patterns; and capacitors on the contact plug structures, respectively, wherein each of the conductive filling patterns includes:

a lower portion extending through the first pad, the lower portion including side surfaces contacting upper sidewalls of the gate structures, and the lower portion having a first width in the second direction; and an upper portion on the lower portion, the upper portion having a second width in the second direction greater than the first width in the second direction, and wherein the side surfaces of the lower portion of each of the conductive filling patterns are respectively coplanar with the upper sidewalls of the gate structures.

18. The semiconductor device according to claim 17, wherein each of the active patterns extends in a fourth direction substantially parallel to the upper surface of the substrate and having an acute angle with respect to each of the first and second directions, and wherein the active patterns are spaced apart from each other in the first direction, and end portions of the active patterns in the fourth direction are aligned with each other in the first direction.

19. The semiconductor device according to claim 18, wherein two gate structures among the gate structures that are spaced apart from each other in the second direction extend through an upper portion of each of the active patterns; and wherein the lower portion of each of the conductive filling patterns commonly contacts upper sidewalls of the two gate structures, the upper sidewalls facing each other.

20. The semiconductor device according to claim 17, wherein each of the gate structures includes a gate electrode and a capping pattern stacked in the vertical direction, and a gate insulation pattern disposed on sidewalls of the gate electrode and the capping pattern, and wherein the lower portion of each of the conductive filling patterns contacts a sidewall of the capping pattern.

* * * * *